(12) United States Patent
Ugajin

(10) Patent No.: US 7,101,434 B2
(45) Date of Patent: *Sep. 5, 2006

(54) FRACTAL STRUCTURE AND ITS FORMING METHOD

(75) Inventor: Ryuichi Ugajin, Tokyo (JP)

(73) Assignee: Sony Corporation, Tokyo (JP)

( * ) Notice: Subject to any disclaimer, the term of this patent is extended or adjusted under 35 U.S.C. 154(b) by 601 days.

This patent is subject to a terminal disclaimer.

(21) Appl. No.: 10/030,857

(22) PCT Filed: May 22, 2001

(86) PCT No.: PCT/JP01/40252

§ 371 (c)(1),
(2), (4) Date: Apr. 29, 2002

(87) PCT Pub. No.: WO01/91201

PCT Pub. Date: Nov. 29, 2001

(65) Prior Publication Data

US 2002/0180657 A1    Dec. 5, 2002

(30) Foreign Application Priority Data

May 23, 2000 (JP) ............................. 2000-151670
Jun. 28, 2000 (JP) ............................. 2000-194495
Oct. 31, 2000 (JP) ............................. 2000-333394

(51) Int. Cl.
*C30B 25/04*    (2006.01)

(52) U.S. Cl. ..................... 117/84; 117/85; 117/86; 117/92; 117/93

(58) Field of Classification Search ............. 117/84, 117/85, 86, 92, 93
See application file for complete search history.

(56) References Cited

FOREIGN PATENT DOCUMENTS

| JP | 06-5912 | 1/1994 |
|---|---|---|
| JP | 06-5921 | 1/1994 |
| JP | 11-195801 | 7/1999 |
| JP | 11195801 | 7/1999 |

*Primary Examiner*—Robert Kunemund
(74) *Attorney, Agent, or Firm*—Sonnenschein Nath & Rosenthal LLP

(57) ABSTRACT

A fractal structure is formed to have a plurality of regions different in fractal dimension characterizing the self-similarity. Especially in a stellar fractal structure, a region with a low fractal dimension is formed around a core with a high fractal dimension. By adjusting the ratios in volume of these regions relative to the entire fractal structure, the nature of phase transition occurring in the fractal structure, such as a magnetization curve of Mott transition or ferromagnetic phase transition, quantum chaos in the electron state, or the like. For enhancing the controllability, the fractal dimension of the core is preferably larger than 2.7 and the fractal dimension of the region around the core is preferably smaller than 2.3.

18 Claims, 49 Drawing Sheets

FRACTAL STRUCTURE AND ITS FORMING METHOD

BACKGROUND OF THE INVENTION

This invention relates a fractal structure and its forming method, especially based on a novel principle.

BACKGROUND ART

For application of a solid material to electronic or optical devices, physical properties of the material may restrict its applications. For example, in case of using a semiconductor material in a light emitting device, it will be usable in a device of an emission wavelength corresponding to the band gap of the material, but some consideration will be necessary for changing the emission wavelength. Regarding physical properties related to semiconductor bands, controls by superlattices have been realized. More specifically, by changing the period of a superlattice, the bandwidth of its subband can be controlled to design an emission wavelength.

Targeting on controlling many-electron-state structures by material designs, the Inventor proposed many-body effect engineering by quantum dot-based structures and has continued theoretical analyses ((1) U.S. Pat. No. 5,430,309; (2) U.S. Pat. No. 5,663,571; (3) U.S. Pat. No. 5,719,407; (4) U.S. Pat. No. 5,828,090; (5) U.S. Pat. No. 5,831,294; (6) U.S. Pat. No. 6,020,605; (7) J. Appl. Phys. 76, 2833 (1994); (8) Phys. Rev. B51, 10714 (1995); (9) Phys. Rev. B51, 11136 (1995); (10) J. Appl. Phys. 77, 5509 (1995); (11) Phys. Rev. B53, 6963 (1996); (12) Phys. Rev. B53, 10141 (1996); (13) Appl. Phys. Lett. 68, 2657 (1996); (14) J. Appl. Phys. 80, 3893 (1996); (15) J. Phys. Soc. Jpn. 65, 3952 (1996); O (16) Jpn. J. Appl. Phys. 36, 638 (1997); (17) J. Phys. Soc. Jpn. 66, 425 (1997); (18) J. Appl. Phys. 81, 2693 (1997); (19) Physica (Amsterdam) 229B, 146 (1997); (20) Physica (Amsterdam) 237A, 220 (1997); (21) Surf. Sci. 375, 403 (1997); (22) Physica (Amsterdam) 240B, 116 (1997); (23) Physica (Amsterdam) 240B, 128 (1997); (24) Physica (Amsterdam) IE, 226 (1997); (25) Phys. Rev. Lett. 80, 572 (1998); (26) Jpn. J. Appl. Phys. 37, 863 (1998); (27) Physica (Amsterdam) 245B, 311 (1998); (28) Physica (Amsterdam) 235B, 96 (1998); (29) Phys. Rev. B59, 4952 (1999); (30) Surf. Sci. 432, 1 (1999); (31) International Journal of Modern Physics B. Vol. 13, No. 21, 22, pp. 2689–2703, 1999). For example, realization of various correlated electronic systems is expected by adjusting a tunneling phenomenon between quantum dots and interaction between electrons in quantum dots. Let the tunneling transfer between adjacent quantum dots be written as t. Then, if quantum dots are aligned in form of a tetragonal lattice, the bandwidth of one electron state is $T_{eff}=4t$. If quantum dots form a one-dimensional chain, the bandwidth of one electron state is $T_{eff}=2t$. In case of a three-dimensional quantum dot array, $T_{eff}=6t$. That is, if D is the dimension of a quantum dot array, the bandwidth of one electron state has been $T_{eff}=2Dt$. Here is made a review about half-filled (one electron per each quantum dot) Mott transition (also called Mott-Hubbard transition or Mott metal-insulator transition). Let the effective interaction of electrons within a quantum dot be written as $U_{eff}$, then the Hubbard gap on the part of the Mott insulator is substantially described as $\Delta=U_{eff}-T_{eff}$, and the Mott transition can be controlled by changing $U_{eff}$ or t. As already proposed, the Mott-Hubbard transition can be controlled by adjusting $U_{eff}$ or t, using a field effect, and it is applicable to field effect devices (Literatures (5), (6), (11) and (14) introduced above).

On the other hand, reviewing the equation of $\Delta=U_{eff}-T_{eff}=U_{eff}-2Dt$, it will be possible to control Mott-Hubbard transition by controlling the dimensionality D of the system. For this purpose, the Applicant already proposed a fractal-based structure that can continuously change the dimensionality, and have exhibited that Mott-Hubbard transition is controllable by changing the fractal dimensions.

To enable designing of wider materials, it is desired to modify and control the dimension of materials by designing methods beyond the simple fractal nature.

As physical systems in charge of information processing, intrinsic non-linearity is indispensable. As devices having been used for years, there are electronic devices using materials exhibiting non-linear responses to certain extents. For example, two-terminal devices exhibiting differential negative resistances are one example of devices that are non-linear in current-voltage characteristics. Of course, MOS-FET, which is a three-terminal device, supports the modern technologies. By coupling these electronic devices having non-linear properties with a linear electronic circuit and constructing an information processing device having a non-linear property, any desired calculation can be executed.

However, difficulties by high integration have become issues with such electronic circuits. Generation of heat is one of the problems, for example. The heat generation caused by intrinsic electric resistance is mandatory for producing non-linearity of an electronic device, and indispensable and essential for executing information processing.

To avoid this difficulty, trials have been made to decrease the number of devices by enhancing non-linearity of component devices. Progress of this scheme necessarily results in the need for component devices having non-linearity as strong as chaotic. When a chaotic classical system is quantized, what characterizes the behaviors of the quantum system is quantum chaos.

On the other hand, as miniaturization of component devices progresses, electrons confined in a device result in behaving as quantum mechanical particles. Therefore, from this point of view, hopes are placed on components devices exhibiting quantum chaos. The Applicant has continued to theoretically demonstrate that, in a quantum system in a structure having a fractal configuration, the quantum chaos can be controlled by changing the fractal dimension characterizing the system.

An object the invention intends to accomplish is to provide a fractal structure and its forming method capable of modulating and controlling the dimensionality of a material by a design method beyond the simple fractal nature.

Another object the invention intends to accomplish is to provide a fractal structure and its forming method capable of controlling phase transition and chaos, in particular, quantum chaos, by a design method beyond the simple fractal nature.

SUMMARY OF THE INVENTION

The Inventor found, through concentrated researches toward solution of those issues, that a more complex fractal structure having a portion characterized by a plurality of fractal dimensions can be formed by changing the growth conditions with time during growth of the fractal structure. Especially in the process of growing a random fractal, it has been found that a fractal structure in form of nerve cells can be formed by forming a region with a low fractal dimension around a core with a high fractal dimension. Then, it has been found that, in fractal structures of this type, occurrence of phase transition, such as magnetic phase transition, and chaos, such as quantum chaos in an electron state, can be controlled. As a result of later detailed analysis, it has been found that there are fractal dimensions suitable for controlling these phenomena.

The present invention has been made on the basis of those researches by the Inventor.

That is, to overcome the above-indicated problems, according to the first aspect of the invention, there is provided a fractal structure comprising a plurality of regions different in fractal dimension characterizing the self-similarity.

In the first aspect of the invention, nature of phase transition occurring in a fractal structure is controlled by adjusting the ratios in volume of a plurality of regions relative to the entire fractal structure. Alternatively, correlation between interactive electrons in an electron system is controlled. Additionally, the magnetization curve of ferromagnetic phase transition is controlled. Further, nature of the chaos appearing in the fractal structure is controlled, more specifically, the quantum chaos in electrons states, for example, is controlled. Control of the quantum chaos in electron states can be controlled with a high controllability by using introduction of a random magnetic field by addition of a magnetic impurity in addition to adjustment of the ratios in volume of a plurality of regions relative to the entire fractal structure. Of course, control of the quantum chaos in electron states is possible merely by introducing a random magnetic field by addition of a magnetic impurity without adjustment of the ratios in volume of a plurality of regions relative to the entire fractal structure. The ratios in volume of these regions correspond to the ratios of numbers of atoms forming these regions, and in embodiments of the invention explained later, they correspond to the ratios of durations of time for growth (step) required for forming these regions.

In the first aspect of the invention, the fractal structure typically includes a first region forming the core having a first fractal dimension, and one or more second regions surrounding the first region and having a second fractal dimension that is lower than the first fractal dimension. In the case where the entirety of the first region and the second region appears like a star, it is a stellar fractal structure. In the fractal structure having these first and second regions, from the viewpoint of ensuring sufficient controllability of the nature of phase transition or correlation between interactive electrons in an electron system, that is, from the viewpoint of forming a satisfactory junction between a Mott insulator and a metal by satisfactorily controlling the magnetization curve of ferromagnetic phase transition, quantum chaos, and so on, or by satisfactorily forming $D_{f1}$ and the second fractal dimension $D_{f2}$ are determined to be preferably $D_{f1} > 2.7$ and $D_{f2} < 2.3$, typically $2.7 < D_{f1} \leq 3$ and $1 < \leq D_{f2} < 2.3$, and more preferably $2.9 \leq D_{f1} \leq 3$ and $1 \leq D_{f2} < 2.3$. The upper limit value 3 of $D_{f1}$ corresponds to the dimension of a three-dimensional space whereas the lower limit value 1 of $D_{f2}$ is necessary for ensuring connectivity in the structure.

According to the second aspect of the invention, there is provided a method of forming a fractal structure having a plurality of regions different in fractal dimension characterizing the self-similarity, comprising:

growing a fractal structure from one or more origins, and changing growth conditions with time in the growth process thereof such that different fractal dimensions are obtained.

In the second aspect of the invention, there are used growth conditions ensuring the first fractal dimension to be made from the growth start point of time until a first point of time, and growth conditions ensuring a second fractal dimension lower than the first fractal dimension to be made from the first point of time to a second point of time. This results in forming a fractal structure including a first region having the first fractal dimension and a second region surrounding the first region and having the second fractal dimension lower than the first fractal dimension. In an embodiment that will be explained later in detail, growth conditions of the fractal structure are represented by a of Equation (4). In actual growth, however, if the fractal structure is grown in the liquid phase, for example, natures of solvents employed for the growth are one of the growth conditions. That is, in this case, a plurality of regions different in fractal dimension can be formed by selecting appropriate solvents, respectively, in the growth process.

Similarly to the first aspect of the invention, in the fractal structure including the first region and the second region, from the viewpoint of ensuring sufficient controllability of the nature of phase transition or correlation between interactive electrons in an electron system, that is, from the viewpoint of forming a satisfactory junction between a Mott insulator and a metal by satisfactorily controlling the magnetization curve of ferromagnetic phase transition, quantum chaos, and so on, or by satisfactorily forming $D_{f1}$ and the second fractal dimension $D_{f2}$ are determined to be preferably $D_{f1} > 2.7$ and $D_{f2} < 2.3$, typically $2.7 < D_{f1} \leq 3$ and $1 \leq D_{f2} < 2.3$, and more preferably $2.9 \leq D_{f1} < 3$ and $1 \leq D_{f2} < 2.3$. The upper limit value 3 of $D_{f1}$ corresponds to the dimension of a three-dimensional space whereas the lower limit value 1 of $D_{f2}$ is necessary for ensuring connectivity in the structure.

According to the invention having the above-summarized configuration, a fractal structure, such as a stellar fractal structure, including a plurality of regions different in fractal dimension from each other can be obtained by changing the growth condition of the fractal structure with time. Then, in this fractal structure, the nature of phase transition occurring in the fractal structure can be controlled by adjusting the ratios in volume of the plurality of regions relative to the entire fractal structure. Optimization of the fractal dimensions also improves the controllability.

DETAILED DESCRIPTION OF THE INVENTION

Figure 1:
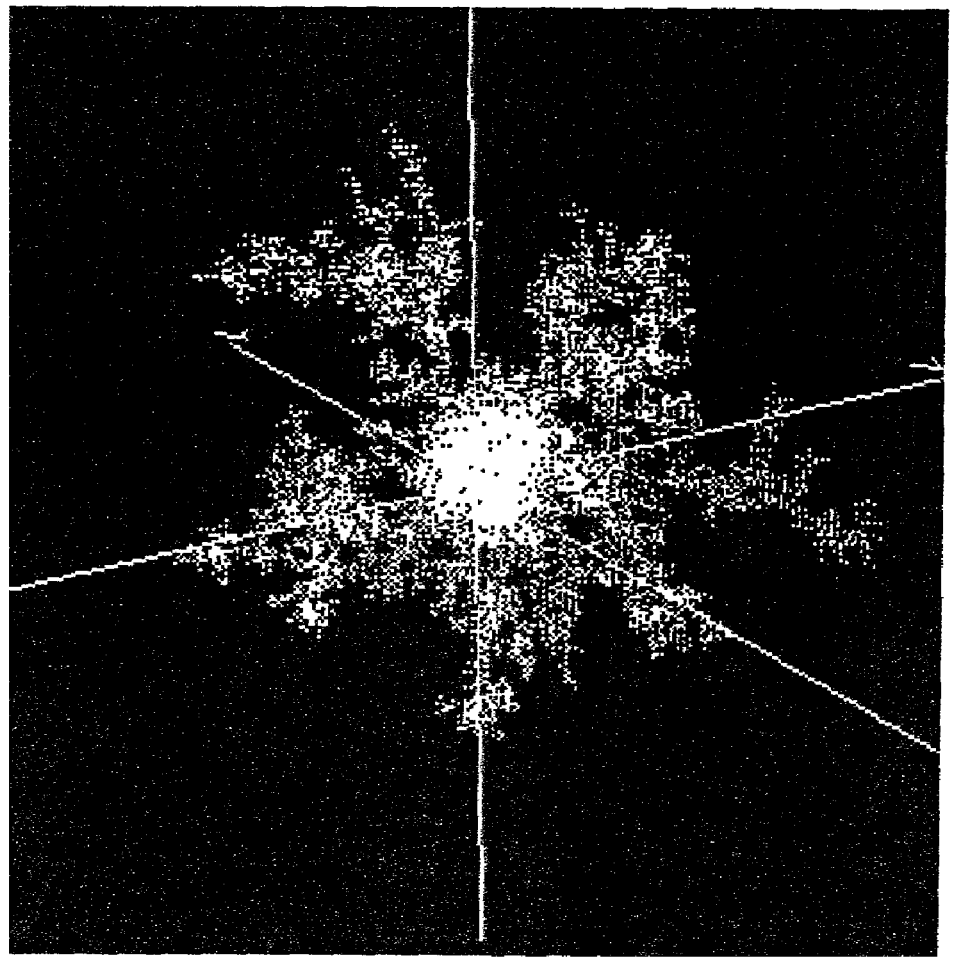
FIG. 1 is a schematic diagram that shows a stellar fractal structure obtained by simulation according to the first embodiment of the invention.

Some embodiments of the invention will now be explained below. In the following embodiments, stellar fractal structures are taken as one type of fractal structures including a plurality of portions characterized in a plurality of fractal dimensions. These stellar fractal structures each have a form of a nerve cell obtained by forming a region with a low fractal dimension around a core with a high fractal dimension in the process of growing random fractals.

First Embodiment (1) Formation of a Stellar Fractal Structure

A method of forming a stellar fractal structure according to the first embodiment can be obtained by developing Dielectric Breakdown Model ((32) A. Erzan, L. Pietronero, A. Vespignani, Rev. Mod. Phys. 67, 545 (1995); (33) L. Niemeyer, L. Pietronero, H. J. Wiesmann, Phys. Rev. Lett. 52, 1033 (1984)).

Here is defined a cubic lattice S in a three-dimensional space, and a scalar potential field $\phi(i_1, i_2, i_3)$ is defined on its lattice site $(i_1, i_2, i_3) \in S$ and called a potential. Let this potential obey the Laplace's equation $$\Delta\phi(i_1, i_2, i_3) = 0 \quad (1)$$

A pattern $T_n$, which will be defined later, is a set of lattice sites on the three-dimensional lattice. $T_0$ contains (0, 0, 0) alone, and $T_{n+1}$ is created by sequentially adding a single lattice site to $T_n$ according to the rule given below.

Let the potential of each site contained in $T_n$ be 1 and let the potential at infinity be 0. That is, $$\phi(i_1, i_2, i_3) = 0 \text{ when } (i_1, i_2, i_3) \to \infty \quad (2)$$

$$\phi(i_1, i_2, i_3) = 1 \text{ when } (i_1, i_2, i_3) \in T_n \quad (3)$$

Under these boundary conditions, Equation (1) is solved to determine the potential. The lattice site, which will be added to $T_n$ to construct $T_{n+1}$, is not contained in $T_n$, and it is selected from the set of lattice sites, i.e. $U_n$, nearest to $T_n$. The number of lattice sites contained in $U_n$ is denoted by $N_n$.

Intensity of the electric fields for lattice sites $(i_{1,m}, i_{2,m}, i_{3,m})$ (where m=1, 2, ..., $N_n$) in $U_n$ is defined as $$E_n(\alpha) = |\phi(i_{1,m}, i_{2,m}, i_{3,m}) - 1|^\alpha \quad (4)$$

The probability that a certain site $(i_{1,m}, i_{2,m}, i_{3,m})$ in $U_n$ is selected is proportional to the electric field $E_m(\alpha)$. That is, the probability is $$p_m(\alpha) = \frac{E_m(\alpha)}{\sum_{j=1}^{N_n} E_j(\alpha)} \quad (5)$$

By repeating these operations, construction of $T_n$ is progressed. An ideal fractal will be a set of limits repeated infinitely as $$T_\infty = \lim_{n \to \infty} T_n \quad (6)$$

When $\alpha=1$, the foregoing and the result of generation of the pattern by Diffusion limited aggregation are consistent ((34) T. A. Witten, Jr. and L. M. Sander, Phys. Rev. Lett. 47, 1400 (1984); Phys. Rev. B 27, 5686 (1983)).

Figure 2:
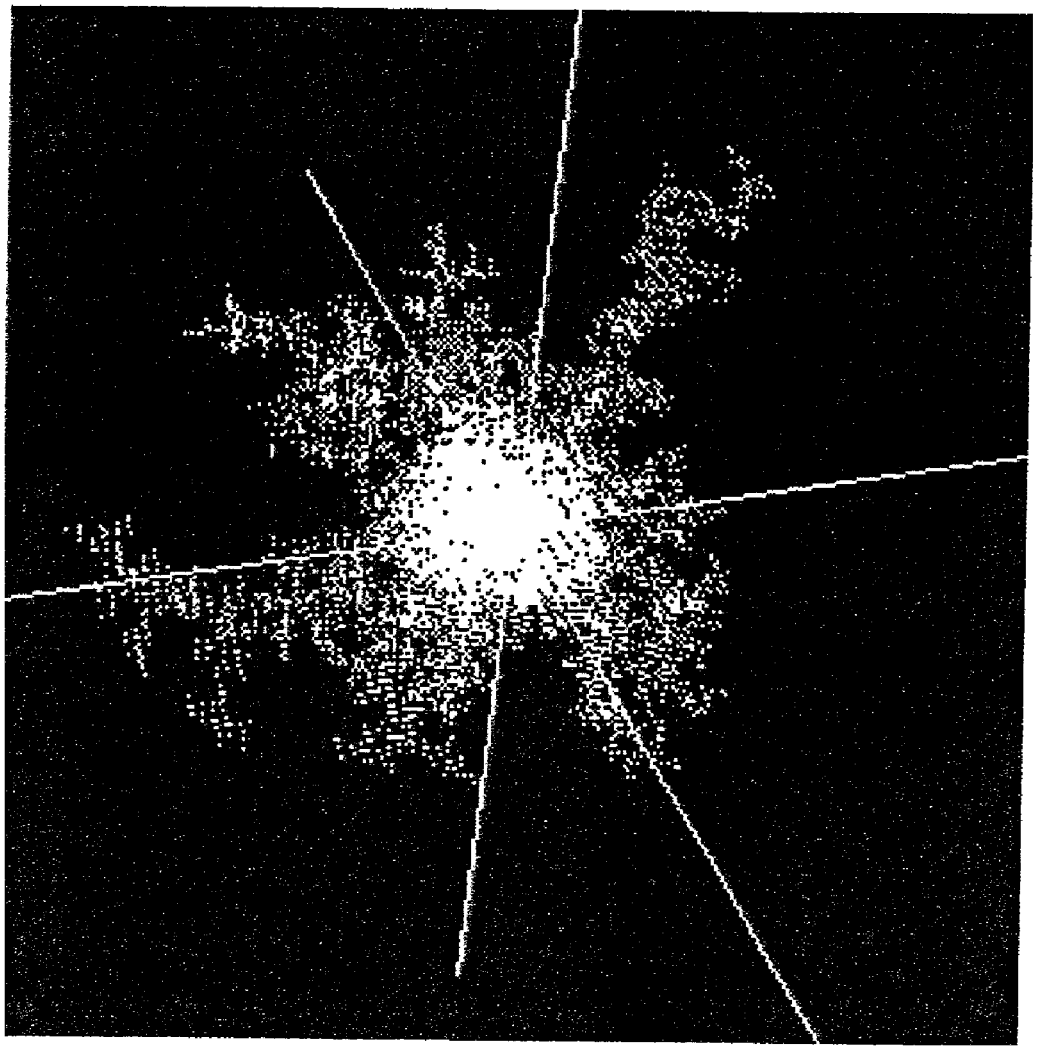
FIG. 2 is a schematic diagram that shows a stellar fractal structure obtained by simulation according to the first embodiment of the invention.
Figure 3:
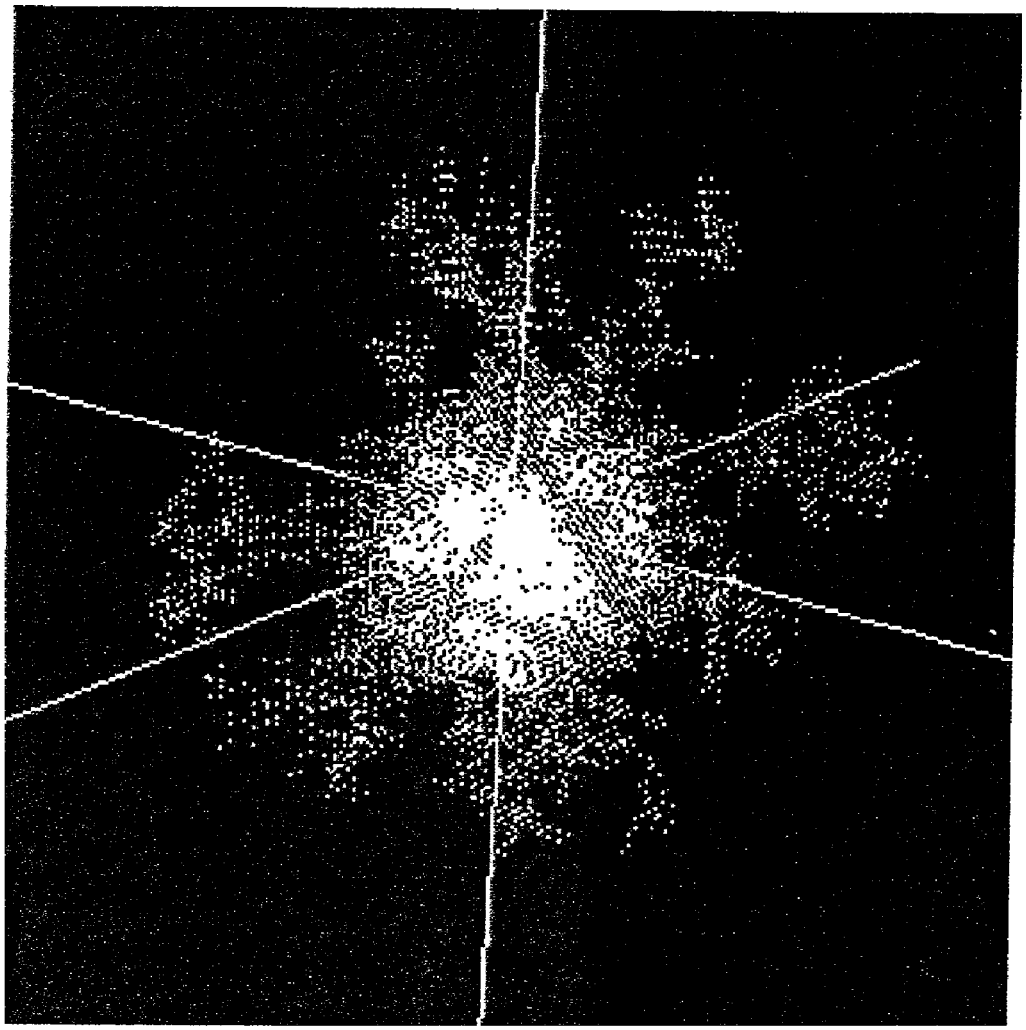
FIG. 3 is a schematic diagram for explaining dimensions of a stellar fractal structure according to the first embodiment.

The stellar fractal structure according to the first embodiment is formed by changing the α parameter in accordance with the step n of the above-mentioned growth. That is, the above growth process is progressed using $\alpha_1$ under $1 \leq n \leq \tau_1$, $\alpha_2$ under $\tau_1 + 1 \leq n \leq \tau_2$, and $\alpha_3$ under $\tau_2 + 1 \leq n \leq \tau_3$. Simulation is performed below, taking fractal structure having two different fractal dimensions. Results of the simulation are shown in FIGS. 1, 2 and 3. In that simulation, $\tau_2 = 10000$, $\alpha_1 = 0$ and $\alpha_2 = 2$ are commonly used in all cases whereas $\tau_1 = 3000$ is used in FIG. 1, $\tau_1 = 5000$ is used in FIG. 2 and $\tau_1 = 7000$ is used in FIG. 3, respectively. It will be understood from FIGS. 1, 2 and 3 that the fractal structure includes a ball-shaped region with a high fractal dimension (somatic fractal) at the center (growth origin) and a tree-like region with a low fractal dimension (dendritic fractal) around it. Nerve cells often exhibit this type of structure. That is, tree-like projections extend from the soma of a cell and perform their function.

Figure 4:
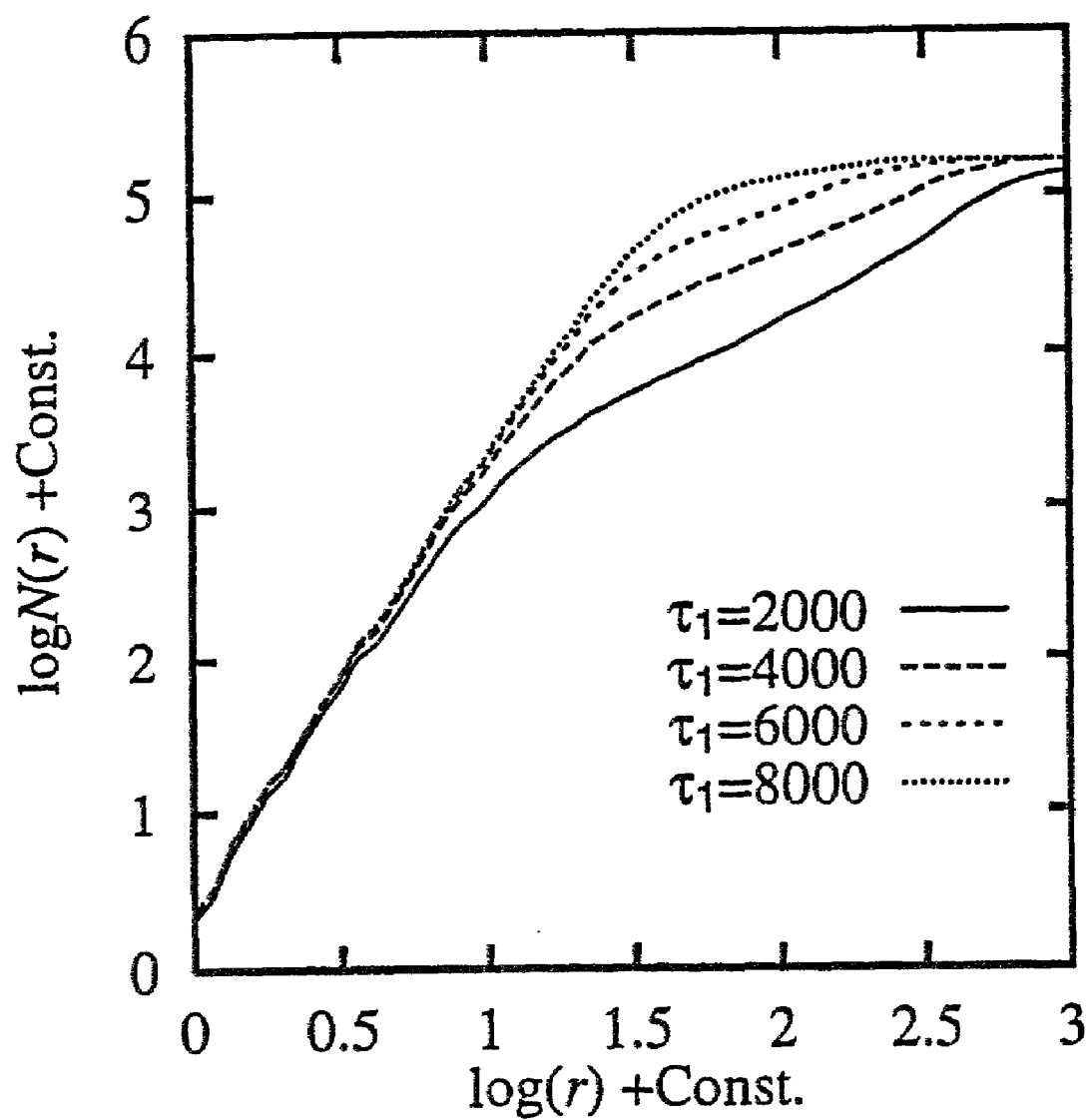
FIG. 4 is a schematic diagram that shows log—log plots of a distance r from the growth origin in the stellar fractal structure according to the first embodiment and the number of growth points N(r) contained in a ball with the radius r.

For the purpose of understanding the structure in greater detail, a calculation process of fractal dimensions is used. Let r represent the distance from the growth origin (0, 0, 0) and N(r) represent the number of growth points contained in a ball with the radius r. Then, using a as a factor of proportionality, if N(r) can be expressed as $$N(r) = ar^{D_f} \quad (7)$$

then $D_f$ is called the fractal dimension. Therefore, since logarithms of both sides are $$\log N(r) = \log \alpha + D_f \log r \quad (8)$$

if log—log plots ride on a straight line, the structure can be regarded as a fractal, and its inclination is the fractal dimension. In FIG. 4, log—log plotting was made for various cases obtained by the above-mentioned growth experiment. It is found from FIG. 4 that, under a small log(r), plots ride on a straight line with a large inclination, but they ride on a straight line with a small inclination when log(r) exceeds a certain critical point. This demonstrates that the structure include two different fractal dimensions. More specifically, in this example, the fractal dimension before log(r) exceeds the critical point is approximately 2.9, and excluding the case of $\tau_1 = 8000$, the fractal dimension after log(r) exceeds the critical point is approximately 2.1. Sites of the critical point increase as $\tau_1$ increases, and this supports this growth model and its interpretation.

(2) Correlative Electron System in a Stellar Fractal Structure

An electron system is defined on the stellar fractal structure defined in (1). A review is made about the lattice point $$r_p = (i_{1,p}, i_{2,p}, i_{3,p}) \in T_n \quad (9)$$

that is the origin of $T_n$. In Equation (9), p=1, 2, ..., n+1. An operator $\hat{c}^\dagger_{p,\sigma}$ for generating an electron of a spin σ is defined at the lattice point $r_p \in T_n$. Of course, there is the anticommutative relation $$\{\hat{c}_{p,\sigma}, \hat{c}^\dagger_{q,\rho}\} = \delta_{p,q}\delta_{\sigma,\rho} \quad (10)$$

Here is defined a single-band Hubbard Hamiltonian $\hat{H}$ of the electron system as follows.

$$\hat{H} = t \sum_{i,j,\sigma} \lambda_{i,j} \hat{c}^\dagger_{i,\sigma} \hat{c}_{j,\sigma} + U \sum_j \hat{n}_{j,\uparrow} \hat{n}_{j,\downarrow} \quad (11)$$

Assuming that electrons are movable only among nearest-neighbor sites, the following is employed as $\lambda_{p,q}$.

$$\lambda_{p,q} = \begin{cases} 1 & \text{when } |r_p - r_q| = 1 \\ 0 & \text{otherwise} \end{cases} \quad (12)$$

Additionally, the spin $\sigma$ electron density operator of the j-th site, $\hat{n}_{j,\sigma} = \hat{c}^\dagger_{j,\sigma} \hat{c}_{j,\sigma}$, and their sum, $\hat{n}_j = \Sigma_\sigma \hat{n}_{j,\sigma}$, are defined.

For the purpose of defining a temperature Green's function, here is introduced a grand canonical Hamiltonian $\hat{K} = \hat{H} - \mu\hat{N}$ where $\hat{N} = \Sigma_j \hat{n}_j$. In the half-filled taken here, chemical potential is $\mu = U/2$. The half-filled grand canonical Hamiltonian can be expressed as $$\hat{K} = t \sum_{i,j,\sigma} \lambda_{j,i} \hat{t}_{j,i,\sigma} + U/2 \sum_i (\hat{u}_i - 1) \quad (13)$$

Operators $\hat{t}_{j,i,\sigma}$, $\hat{j}_{j,i,\sigma}$, $\hat{u}_i$ and $\hat{d}_{i,\sigma}$ are defined beforehand as $$\hat{t}_{j,i,\sigma} = \hat{c}^\dagger_{j,\sigma} \hat{c}_{i,\sigma} + \hat{c}^\dagger_{i,\sigma} \hat{c}_{j,\sigma} \quad (14)$$

$$\hat{j}_{j,i,\sigma} = \hat{c}^\dagger_{j,\sigma} \hat{c}_{i,\sigma} - \hat{c}^\dagger_{i,\sigma} \hat{c}_{j,\sigma} \quad (15)$$

$$\hat{u}_i = \hat{c}^\dagger_{i,\uparrow} \hat{c}_{i,\uparrow} \hat{c}^\dagger_{i,\downarrow} \hat{c}_{i,\downarrow} \hat{c}_{i,\uparrow} \hat{c}^\dagger_{i,\uparrow} \hat{c}_{i,\downarrow} \hat{c}^\dagger_{i,\downarrow} \quad (16)$$

$$\hat{d}_{i,\sigma} = \hat{c}^\dagger_{i,\sigma} \hat{c}_{i,\sigma} - \hat{c}_{i,\sigma} \hat{c}^\dagger_{i,\sigma} \quad (17)$$

If the temperature Green function is defined for operators $\hat{A}$ and $\hat{B}$ given, taking $\tau$ as imaginary time, it is as follows.

$$<\hat{A};\hat{B}> = -\int_0^\beta d\tau <T_\tau \hat{A}(\tau) \hat{B}> e^{i\omega_M \tau} \quad (18)$$

The on-site Green function $$G_{j,\sigma}(i\omega_M) = <\hat{c}_{j,\sigma}; \hat{c}^\dagger_{j,\sigma}> \quad (19)$$

is especially important.

Imaginary time development of the system is obtained by the Heisenberg equation $$\frac{d}{d\tau}\hat{A}(\tau) = [\hat{K}, \hat{A}] \quad (20)$$

As the equation of motion of the on-site Green function, $$i\omega_n <\hat{c}_{j,\sigma}; \hat{c}^\dagger_{j,\sigma}> = 1 + t\sum_{p,j} \lambda_{p,j} <\hat{c}_{p,\sigma}; \hat{c}^\dagger_{j,\sigma}> + \frac{U}{2} <\hat{d}_{j,-\sigma}\hat{c}_{j,\sigma}; \hat{c}^\dagger_{j,\sigma}> \quad (21)$$

is obtained. Then, the approximation shown below is introduced, following Gros ((35) C. Gros, Phys. Rev. B50, 7295 (1994)). If the site p is the nearest-neighbor site of the site j, the resolution $$<\hat{c}_{p,\sigma}; \hat{c}^\dagger_{j,\sigma}> \to i<\hat{c}_{p,\sigma}; \hat{c}^\dagger_{p,\sigma}><\hat{c}_{i,\sigma}; \hat{c}^\dagger_{j,\sigma}> \quad (22)$$

is introduced as the approximation. This is said to be exact in case of infinite-dimensional Bethe lattices, but in this case, it is only within approximation. Under the approximation, the following equation is obtained.

$$(i\omega_n - t^2 \Gamma_{j,\sigma}) G_{j,\sigma} = 1 + \frac{U}{2} <\hat{d}_{j,-\sigma} \hat{c}_{j,\sigma}; \hat{c}^\dagger_{j,\sigma}> \quad (23)$$

where $$\Gamma_{j,\sigma} = \sum_p \lambda_{p,j} G_{p,\sigma} \quad (24)$$

was introduced. To solve the equation, obtained, $<\hat{d}_{j,-\sigma} \hat{c}_{j,\sigma}; \hat{c}^\dagger_{j,\sigma}>$ has to be analyzed. In case of half-filled models, this equation of motion is $$i\omega_n <\hat{d}_{j,-\sigma} \hat{c}_{j,\sigma}; \hat{c}^\dagger_{j,\sigma}> = \frac{U}{2} G_{j,\sigma} - 2t\sum_p \lambda_{p,j} <\hat{j}_{p,j,-\sigma} \hat{c}_{j,\sigma}; \hat{c}^\dagger_{j,\sigma}> + t\sum_p \lambda_{p,j} <\hat{d}_{j,-\sigma} \hat{c}_{p,\sigma}; \hat{c}^\dagger_{j,\sigma}> \quad (25)$$

Here again, with reference to the Gros theory, approximation is introduced. It is the following translation.

$$<\hat{j}_{p,j,-\sigma}; \hat{c}^\dagger_{j,\sigma}> \to -tG_{p,-\sigma} <\hat{d}_{j,-\sigma} \hat{c}_{j,\sigma}; \hat{c}^\dagger_{j,\sigma}> \quad (26)$$

$$<\hat{d}_{j,-\sigma} \hat{c}_{j,\sigma}; \hat{c}^\dagger_{j,\sigma}> \to tG_{p,-\sigma} <\hat{d}_{j,-\sigma} \hat{c}_{j,\sigma}; \hat{c}^\dagger_{j,\sigma}> \quad (27)$$

By executing this translation, the following closed equation is obtained.

$$(i\omega_n - t^2 \Gamma_{j,\sigma}) G_{j,\sigma} = 1 + \frac{(U/2)^2}{i\omega_n - t^2 \Gamma_{j,\sigma} - 2t^2 \Gamma_{j,-\sigma}} G_{j,\sigma} \quad (28)$$

Here is assumed that there is no dependency on spin. That is, assuming $$G_{j,\uparrow} = G_{j,\downarrow} \quad (29)$$

the following calculation is executed. This is because, when analytic continuation is conducted as $i\omega_n \to \omega + i\delta$ for small $\delta$, $$D_j(\omega) = -\text{Im} G_j(\omega + i\delta) \quad (30)$$

becomes the local density of states of the site j, and $$D(\omega) = -\frac{1}{n+1} \sum_j D_j(\omega) \quad (31)$$

becomes the density of states of the system. For later numerical calculation of densities of states, $\delta = 0.0001$ will be used.

Figure 5:
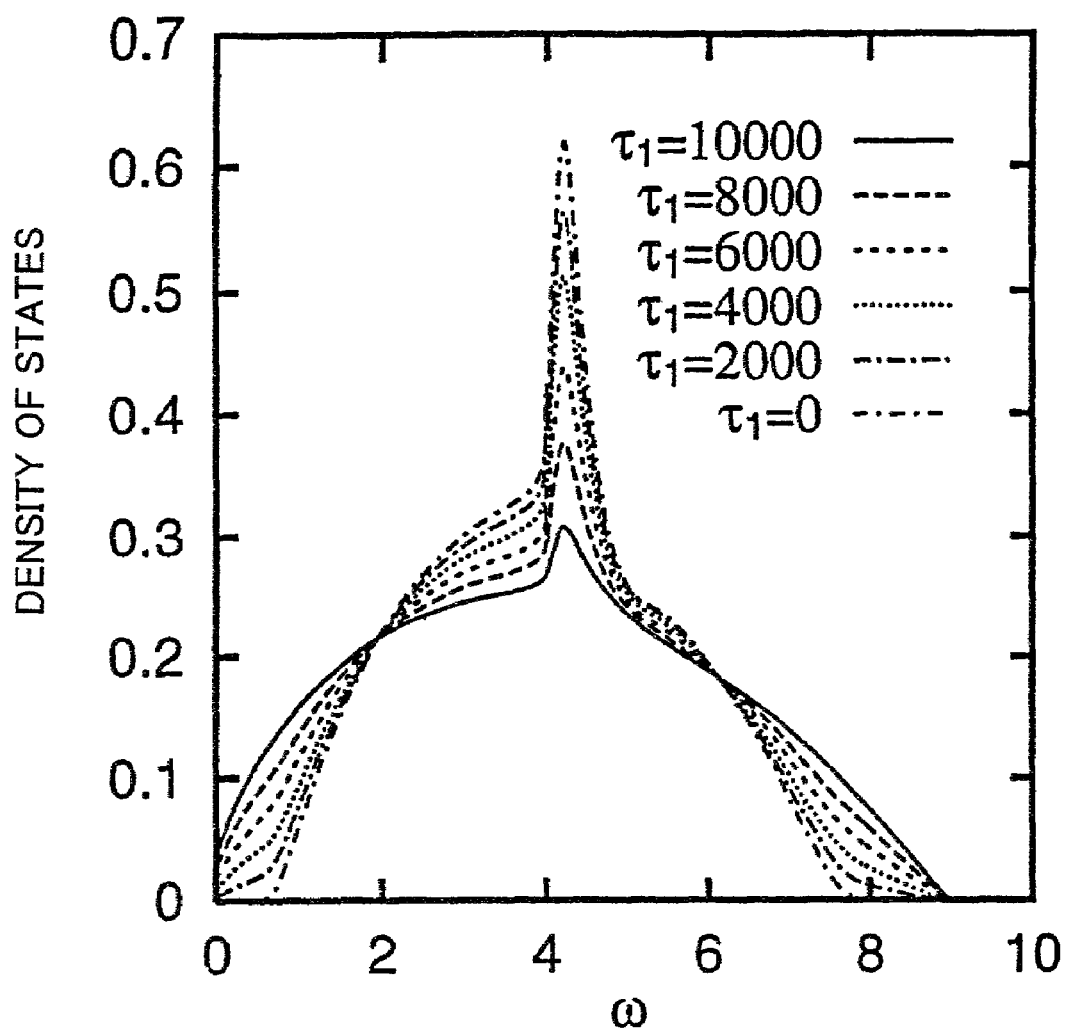
FIG. 5 is a schematic diagram that shows a relation between energy and density of states in the stellar fractal structure according to the first embodiment of the invention.
Figure 6:
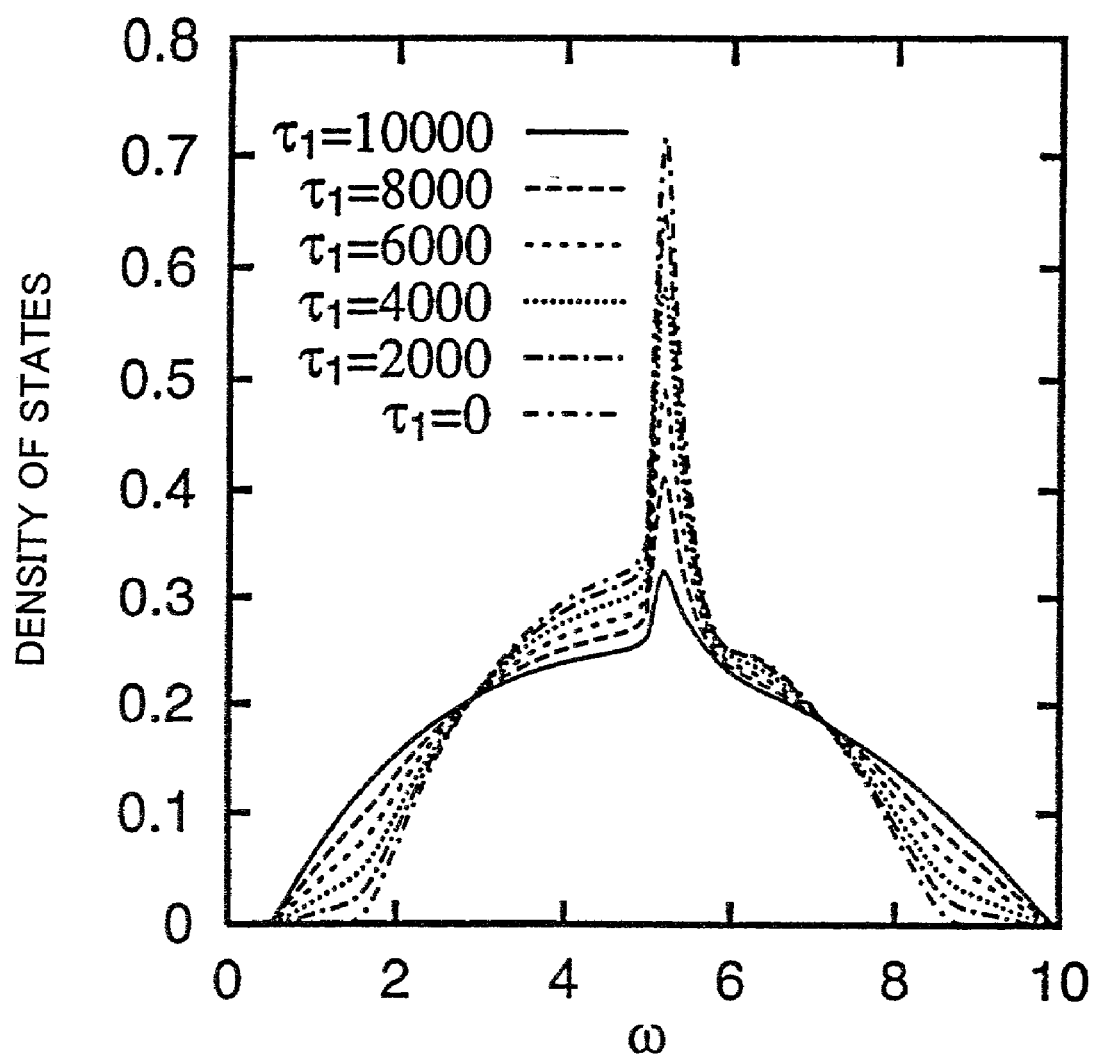
FIG. 6 is a schematic diagram that shows a relation between energy and density of states in the stellar fractal structure according to the first embodiment of the invention.
Figure 7:
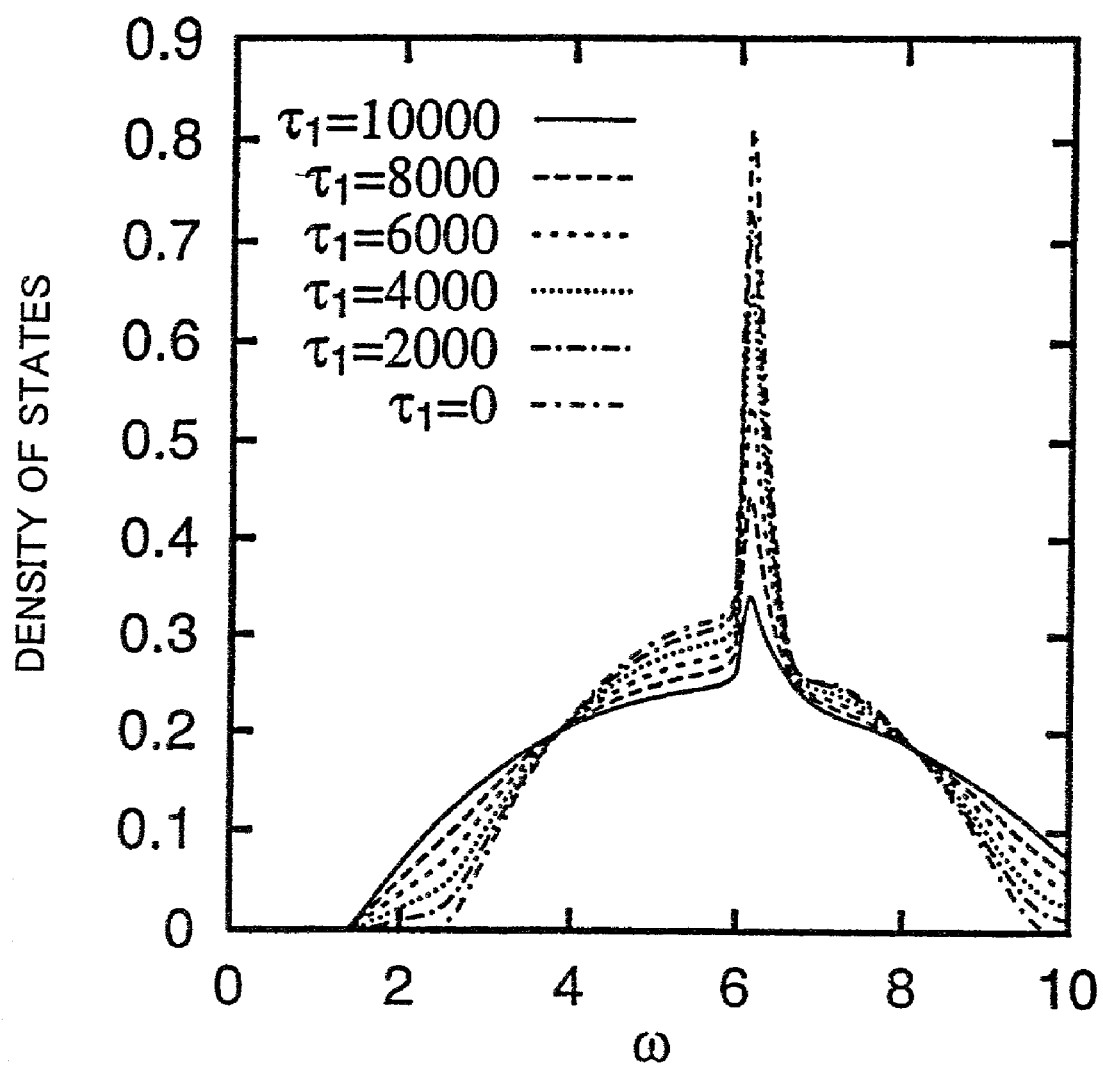
FIG. 7 is a schematic diagram that shows a relation between energy and density of states in the stellar fractal structure according to the first embodiment of the invention.

Regarding the stellar fractal structure obtained in (1), its Mott transition is analyzed. There were commonly used $\tau_2 = 10000$, $\alpha_1 = 0$ and $\alpha_2 = 2$, and used as $\tau_1$ were $\tau_1 = 0$, 2000, 4000, 6000, 8000 and 10000. Densities of states obtained by numerical calculation using t=1 are shown in FIGS. 5, 6 and 7. U=8 was used in FIG. 5, U=10 in FIG. 6, and U=12 in FIG. 7. In FIG. 5, in case of $\tau_1$=10000, that is, in case of a pure fractal structure of $\alpha$=0, the density of states D(0) under $\omega$=0 is finite, and this electron system is in the metal phase. As $\tau_1$ becomes smaller, D(0) gradually decreases, and the nature as an insulator is enhanced. Under $\tau_1$<4000, almost all of D(0) disappears, and Mott insulator transformation occurs.

In FIG. 6, the system behaves as a Mott insulator under all parameters; however, its insulating performance, i.e. electron-to-electron correlation effect, increases as $\tau_1$ varies. This is because the effective Hubbard bandwidth increases along with a decrease of $\tau_1$.

Spatial changes inside a stellar fractal structure are reviewed below in detail. For this purpose, spatial changes of the local density of states $D_j$ ($\omega$=0) on the Fermi energy are analyzed. When the distance from the growth origin (0, 0, 0) is r, the set of growth points distant from the growth origin by r to r+dr is written as $U_s(r)$, and its original number is written as $M_s(r)$. Then, $D_{ave}(r)$ is defined as follows.

$$D_{ave}(r) = \frac{1}{M_s(r)} \sum_{j \in U_s(r)} D_j(0) \tag{32}$$

Figure 8:
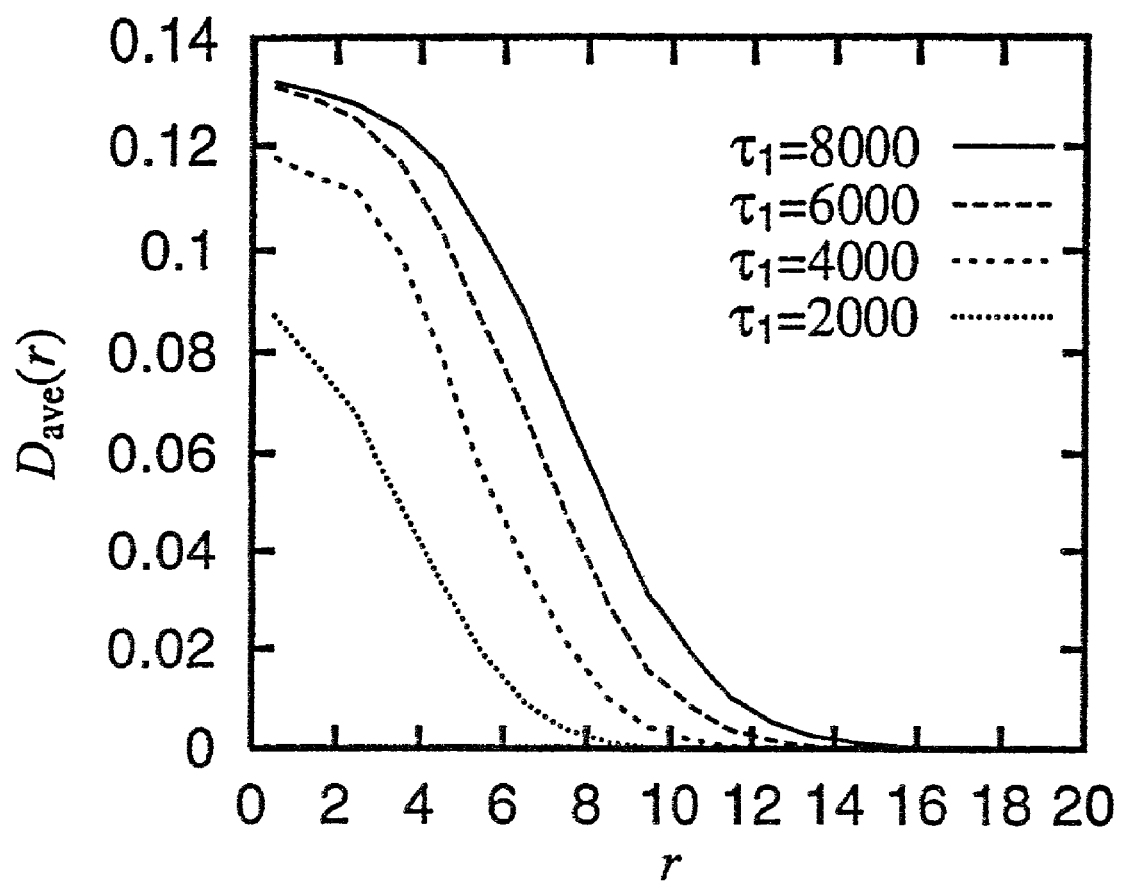
FIG. 8 is a schematic diagram for explaining spatial changes inside the stellar fractal structure according to the first embodiment of the invention.

This amount is the average value of local densities of states on the Fermi energy on the spherical surface with the distance r from the growth origin. In FIG. 8, values of $D_{ave}(r)$ under U=8 are shown. In this calculation, dr=1 was used, and values of $D_{ave}(r)$ were plotted for various values of $\tau_1$. In the region with small r, that is, in the region of the somatic fractal region, $D_{ave}(r)$ takes finite values, and the system behaves as a metal. As r increases, $D_{ave}(r)$ decreases and approaches zero asymptotically. That is, Mott insulator transformation occurs. The value of r causing Mott insulator transformation varies, and it will be needless to say that the larger $\tau_1$ the larger value of r is required, considering that Mott metal-insulator transition can be controlled with the $\alpha$ parameter. That is, it results in realizing a new electron system in which the central metal region is wrapped by the Mott insulator region.

Thus, it has been confirmed that, in the star-shaped fractal structure, the Mott metal-insulator transition occurring in the structure and the nature of the Mott insulator can be controlled with $\tau_1$.

Second Embodiment (1) Formation of a Stellar Fractal Structure

A method of forming the star-shaped fractal structure according to the second embodiment is the same as the method of forming the stellar fractal structure according to the first embodiment. As growth conditions, however, ($\alpha_1$, $\alpha_2$)=(0, 1) and ($\alpha_1$, $\alpha_2$)=(1, 2) were used in addition to ($\alpha_1$, $\alpha_2$)=(0, 2), and numerical experiment of growth was conducted for these cases.

Figure 9:
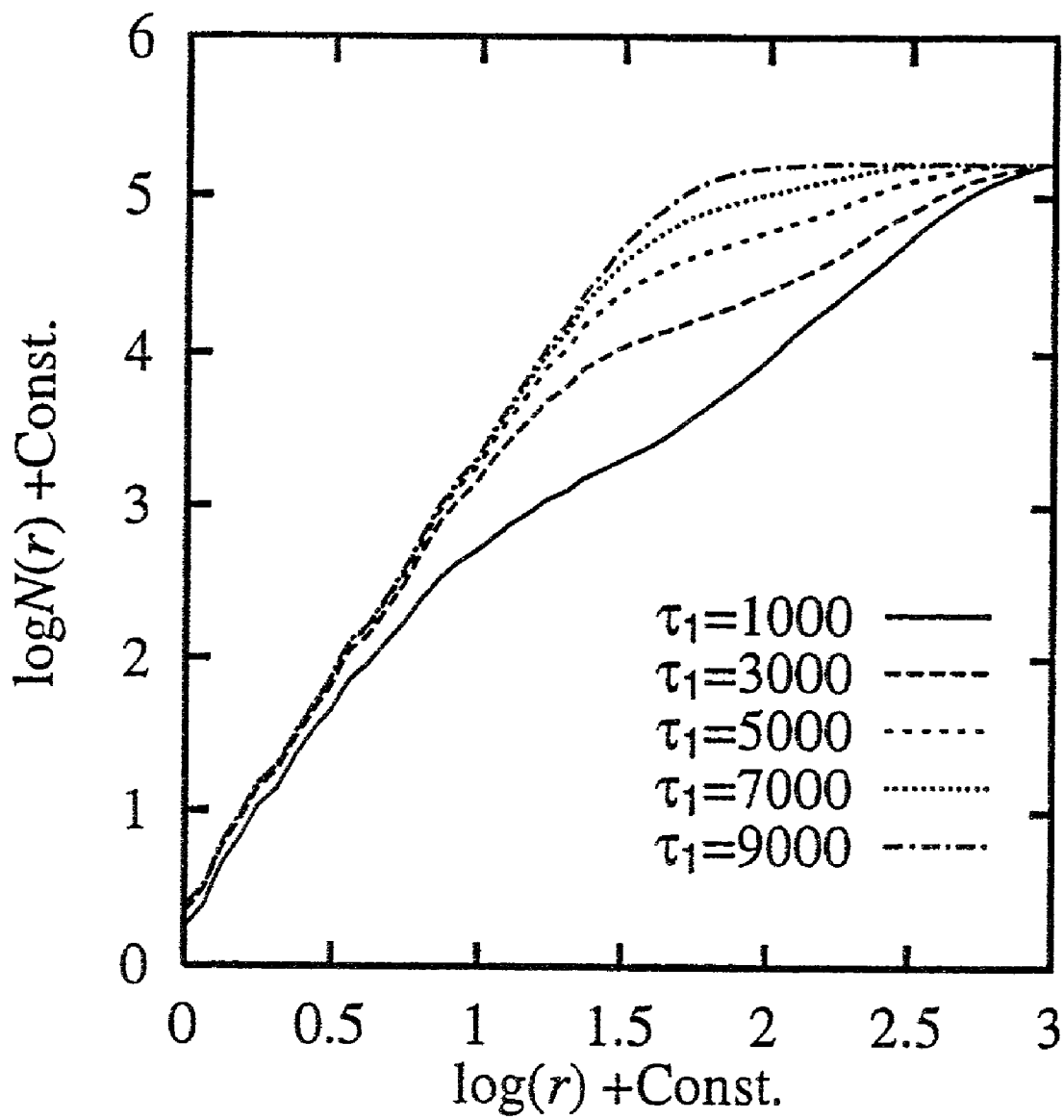
FIG. 9 is a schematic diagram that shows log—log plots of a distance r from the growth origin in a stellar fractal structure according to the second embodiment and the number of growth points N(r) contained in a ball with the radius r.
Figure 10:
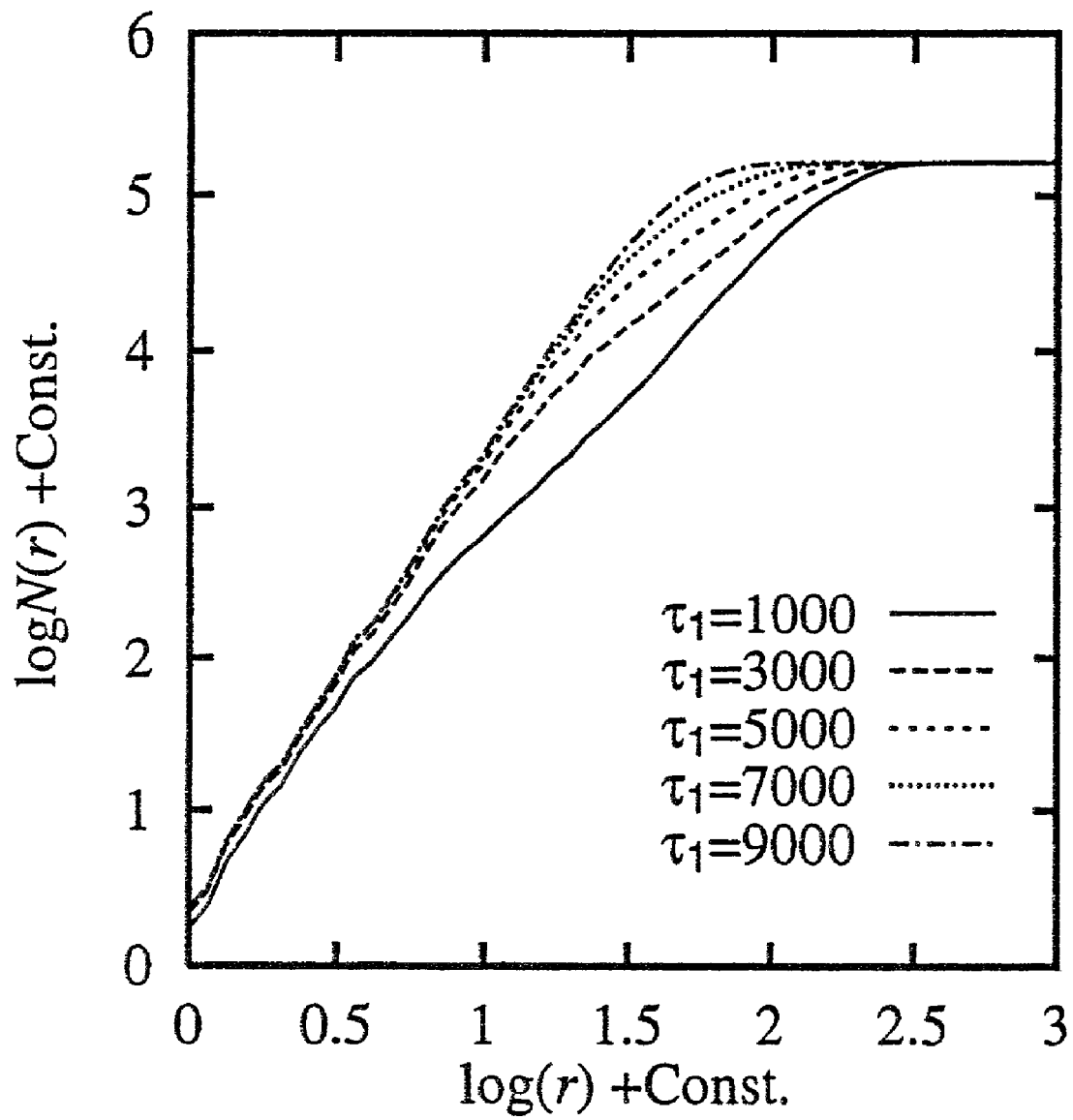
FIG. 10 is a schematic diagram that shows log—log plots of a distance r from the growth origin in a stellar fractal structure according to the second embodiment and the number of growth points N(r) contained in a ball with the radius r.
Figure 11:
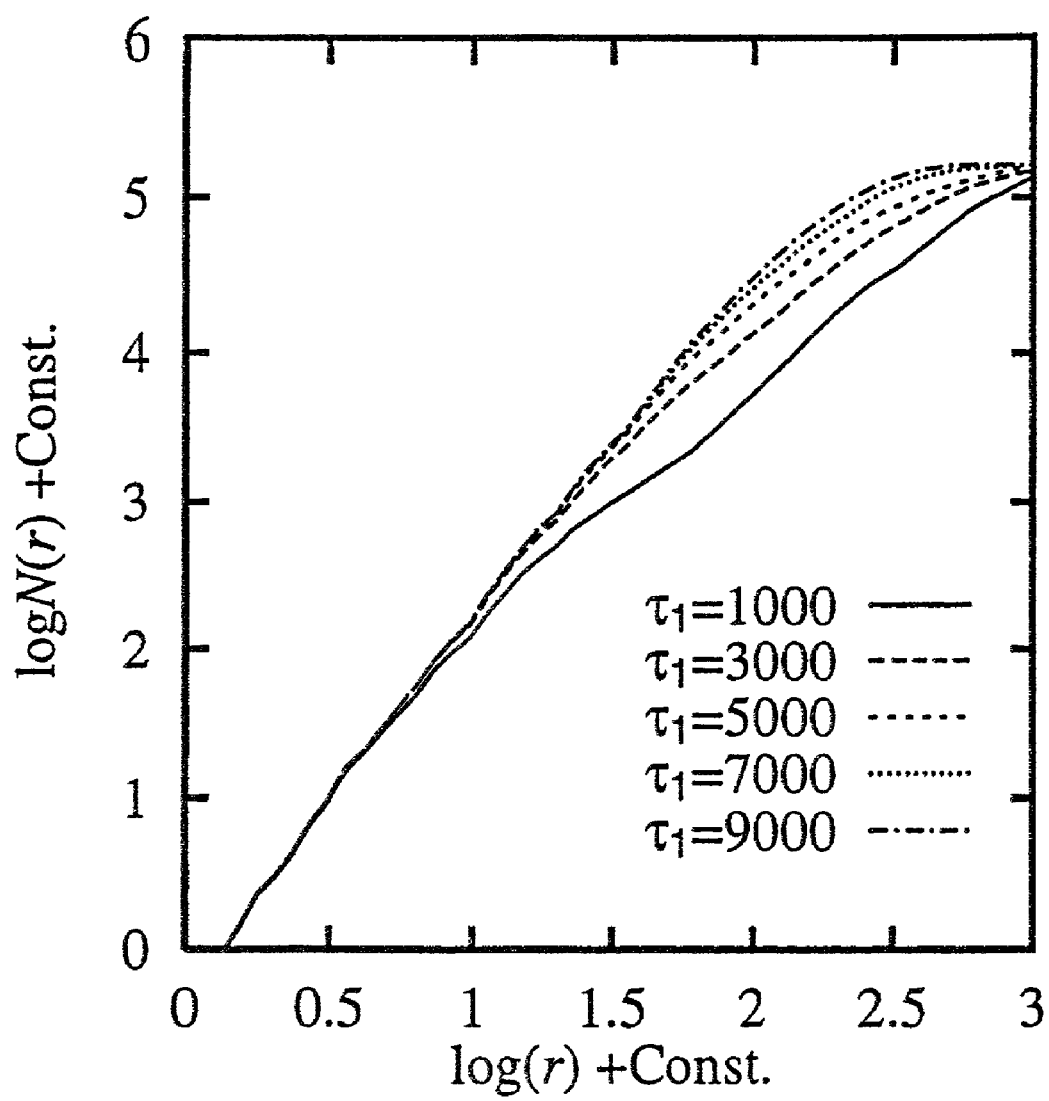
FIG. 11 a schematic diagram that shows log—log plots of a distance r from the growth origin in a stellar fractal structure according to the second embodiment and the number of growth points N(r) contained in a ball with the radius r.

In FIGS. 9 through 11, for respective examples obtained by the growth experiment, log—log plotting was made similarly to the first embodiment. ($\alpha_1$, $\alpha_2$)=(0, 2) was used in FIG. 9, ($\alpha_1$, $\alpha_2$)=(0, 1) was used in FIG. 10, and ($\alpha_1$, $\alpha_2$)=(1, 2) was used in FIG. 11. As shown in FIGS. 9 through 11, when log(r) is small, plots ride on a straight line with a large inclination. When log(r) exceeds a certain critical point, plots ride on a straight line with a small inclination. This means that the structure includes two different fractal dimensions. The site of the critical point increases as $\tau_1$ increases, and this supports this growth model and its interpretation.

(2) Ferromagnetic Transition in a Stellar Fractal Structure

A spin system describing a ferromagnetic structure is defined on the stellar fractal structure defined in (1). A review is made about the lattice point $$r_p = (i_{1,p}, i_{2,p}, i_{3,p}) \in T_n \tag{33}$$

that is the origin of $T_n$. In Equation 33, p=0, 1, 2, ..., n. By placing a spin on a lattice site $r_p \in T_n$, here is taken a spin system that can be described by the following Hamiltonian.

$$H = -\sum_{p,q} J_{p,q} S_p \cdot S_q \tag{34}$$

$S_p$ is the spin at the p site. A natural model of spin—spin interaction $J_{p,q}$ is:

$$J_{p,q} = \begin{cases} 1 & \text{when } |r_p - r_q| = 1 \\ 0 & \text{otherwise} \end{cases} \tag{35}$$

That is, spin—spin interaction exists only between nearest-neighbor sites. For the purpose of calculating spontaneous magnetization M at a finite temperature T, statistical mechanics of an equilibrium system is introduced. A partition function Z is defined as follows.

$$Z = \sum_{\{S_p\}} e^{-H/T} \tag{36}$$

where $\{S_p\}$ in the symbol of the sum pertains to the sum regarding all spin states. Spontaneous magnetization is defined as the statistical average of spins as follows.

$$M = \frac{1}{n+1} \sum_{p=1}^{n+1} \langle S_p \rangle \tag{37}$$

where the expected value $<S_p>$ is $$\langle S_p \rangle = \frac{1}{Z} \sum_{\{S_p\}} S_p e^{-H/T} \tag{38}$$

and n+1 is the total number of spins. M is generally a vector quantity in a spin space, but its absolute value M=|M| is calculated.

Here is made a review about an Ising model. In an Ising model, only two states of $$S_p = 1 \text{ or } -1 \tag{39}$$

can exist. Let a mean field approximation be introduced into the Ising model. Spontaneous magnetization of the p-th site is written as $\mu_p$. In this system, since the molecule field varies with site, let it written as $\bar{\mu}_p$. As an assumption of the mean field approximation, here is employed a molecule field that can be written by spontaneous magnetization of the nearest-neighbor site as $$\bar{\mu}_p = \sum_q J_{p,q}\mu_q \qquad (40)$$

This assumption simplifies the foregoing Hamiltonian to $$H_{MF} = -\sum_{P=1}^{n+1} \bar{\mu}_p \sigma_p \qquad (41)$$

A self-consistent equation ensuring spontaneous magnetization obtained by using a partition function by the simplified Hamiltonian becomes $\mu_p$ results in $$\mu_p = \tan h(\beta\bar{\mu}_p) \qquad (42)$$

and by numerically solving this equation, spontaneous magnetization of the system $$M_{Ising} = \frac{1}{n+1}\sum_{j=0}^{n} \mu_j \qquad (43)$$

is obtained.

Figure 12:
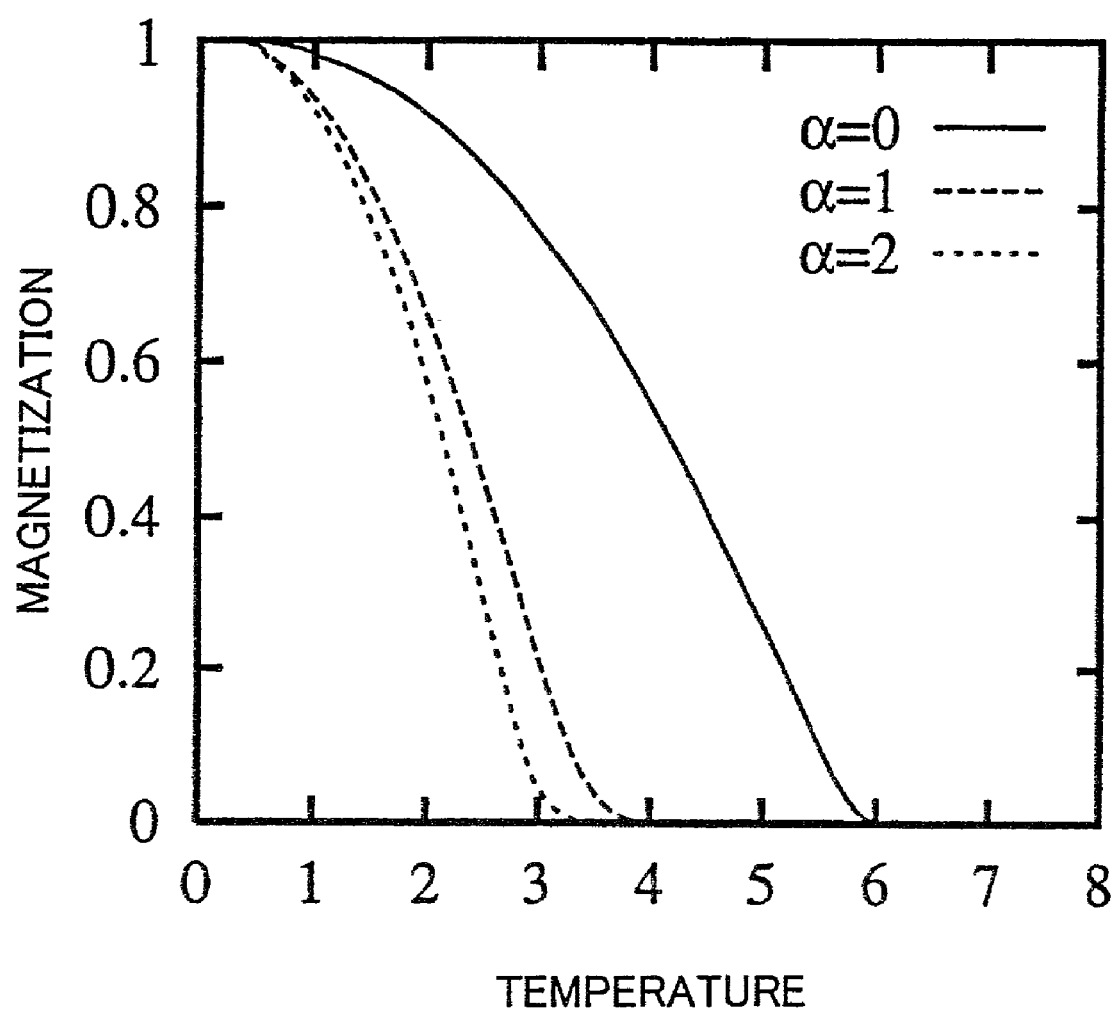
FIG. 12 is a schematic diagram that shows spontaneous magnetization in a fractal structure having a single fractal dimension.
Figure 13:
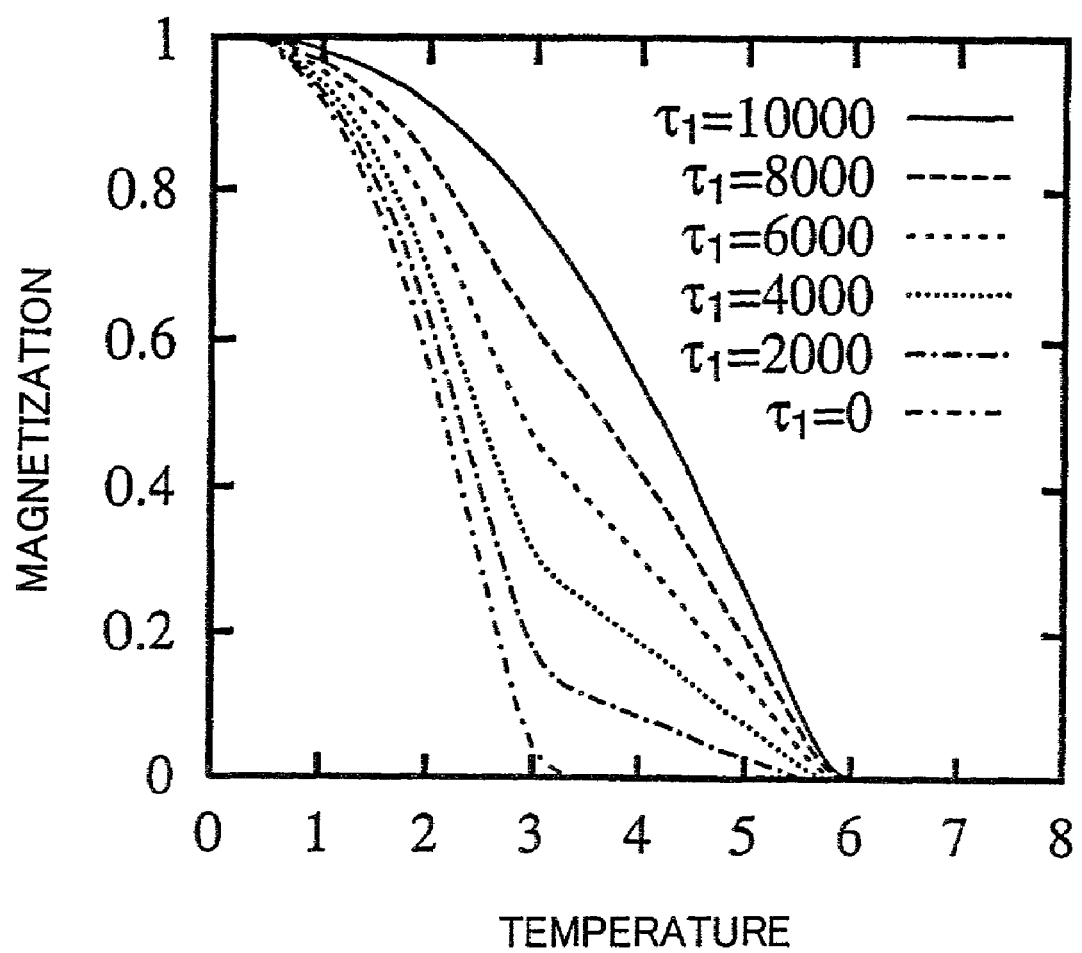
FIG. 13 is a schematic diagram that shows spontaneous magnetization in a stellar fractal structure according to the second embodiment of the invention.
Figure 14:
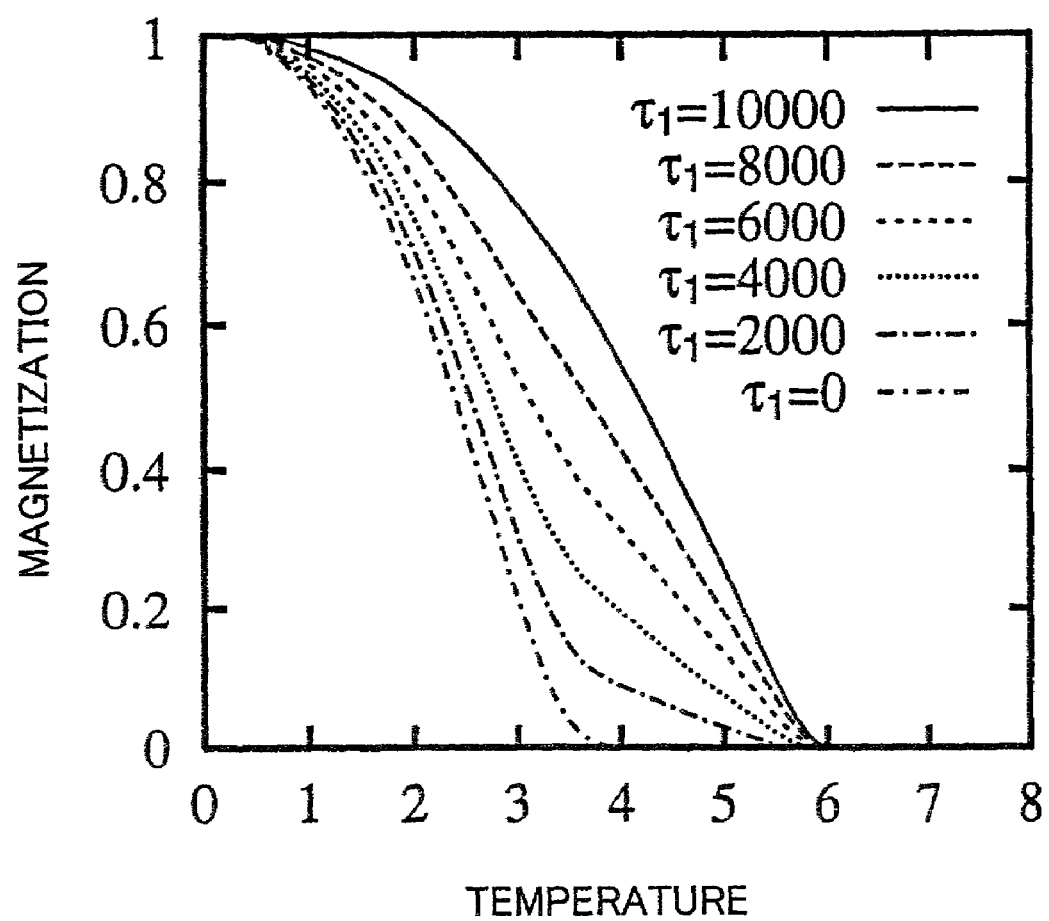
FIG. 14 is a schematic diagram that shows spontaneous magnetization in a stellar fractal structure according to the second embodiment of the invention.
Figure 15:
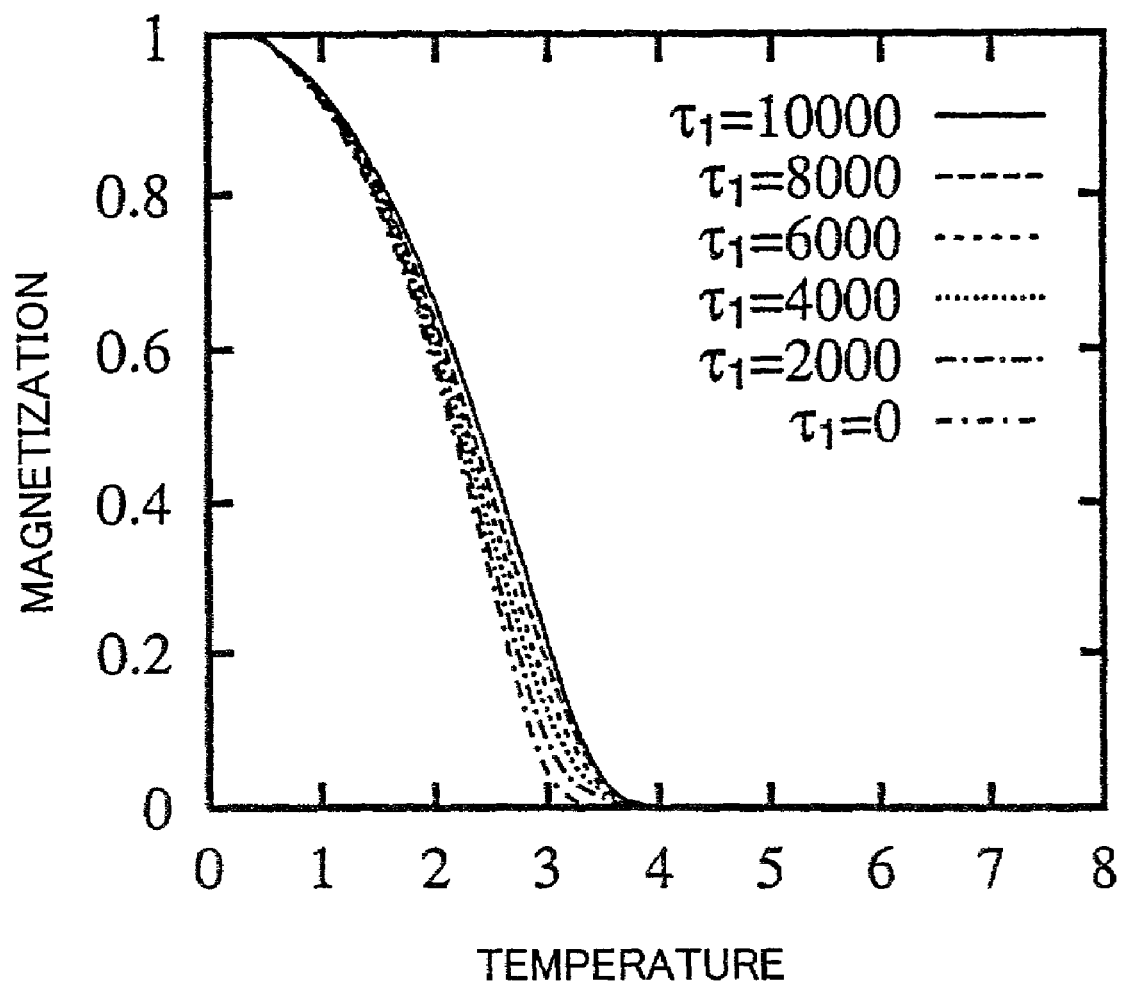
FIG. 15 is a schematic diagram that shows spontaneous magnetization in a stellar fractal structure according to the second embodiment of the invention.

FIG. 12 shows spontaneous magnetization in a typical fractal structure having a single fractal dimension. Here are shown results of $\alpha=0$, $\alpha=1$ and $\alpha=2$. Now, spontaneous magnetization in a star-shaped fractal structure is demonstrated. FIGS. 13 through 15 spontaneous magnetization in stellar fractal structures, for $(\alpha_1, \alpha_2)=(0, 2)$ in FIG. 13, for $(\alpha_1, \alpha_2)=(0, 1)$ in FIG. 14, and $(\alpha_1, \alpha_2)=(1, 2)$ in FIG. 15. FIG. 13 is discussed in greater detail. In case of $\tau_1=0$, spontaneous magnetization is the same as that of a simple fractal structure of $\alpha=2$. On the other hand, in case of $\tau_1=10000$, it is the same as that of a simple fractal structure of $\alpha=0$. When intermediate values between those two poles are taken sequentially, a new magnetization curve interpolating the two poles appears. Of course, this magnetization curve is near to the weighted mean of individual portions of the two poles. Actually, however, there is an interaction between the region of $\alpha=2$ and the region of $\alpha=0$, and the structure construct a new magnetic structure as a whole. Also in FIG. 14, a new magnetization curve interpolating simple fractal structures of $\alpha=1$ and $\alpha=0$ appears, and in FIG. 15, a new magnetization curve interpolating simple fractal structures of $\alpha=2$ and $\alpha=1$ appears. It has been found, therefore, that the use of this stellar fractal structure, which is a fractal-based complex, leads to realization of materials exhibiting various magnetic properties.

Third Embodiment (1) Formation of a Stellar Fractal Structure

A method of forming the star-shaped fractal structure according to the third embodiment is the same as the method of forming the stellar fractal structure according to the first embodiment. As growth conditions, however, similarly to the second embodiment, $(\alpha_1, \alpha_2)=(0, 1)$ and $(\alpha_1, \alpha_2)=(1, 2)$ were used in addition to $(\alpha_1, \alpha_2)=(0, 2)$, and numerical experiment of growth was conducted for these cases. Results of log—log plotting for respective cases obtained by the growth experiment are the same as those shown in FIGS. 9 through 11.

(2) Electron System on a Stellar Fractal Structure

Let us define a quantum system of one particle on the stellar fractal defined in (1). Assume a lattice site shown below, which is the origin of $T_n$.

$$r_p=(i_{1,p},i_{2,p},i_{3,p})\epsilon T_n \qquad (44)$$

where $p=0, 1, 2, \ldots, n$. Here is defined an operator $\hat{c}_p^\dagger$ that creates a quantum at a lattice site $r_p \epsilon T_n$. Of course, an anticommutative relation $$\{\hat{c}_p, \hat{c}^\dagger_q\}=\delta_{p,q} \qquad (45)$$

is established. Here the Hamiltonian H is defined as $$\hat{H} = -\sum_{p,q} t_{p,q}\hat{c}_p^\dagger \hat{c}_q \qquad (46)$$

Here is employed as the transfer $t_{p,q}$, $$t_{p,q} = \begin{cases} 1 & \text{when } |r_p - r_q| = 1 \\ 0 & \text{otherwise} \end{cases} \qquad (47)$$

In this model, hopping is possible only between nearest-neighbor sites.

When $\epsilon_m$ denotes the eigenenergy of the Hamiltonian $\hat{H}$ and |m> denotes the eigenvector, $$\hat{H}|m>=\epsilon_m|m> \qquad (48)$$

where $m=0, 1, 2, \ldots, n$.

First, n+1 quantum levels Em are standardized such that spacing between nearest-neighbor levels becomes 1 in average. That is, $$\omega_j=\epsilon_j-\epsilon_{j-1} \qquad (49)$$

However, when $j=1, 2, \ldots, n$, by using $$\bar{\omega} = \frac{1}{n}\sum_{j=1}^{n} \omega_j \qquad (50)$$

it is converted into new levels $$\epsilon_0=0 \qquad (51)$$

$$\varepsilon_m = \frac{1}{\bar{\omega}}\sum_{j=1}^{m} \omega_j = \sum_{j=1}^{m} \Omega_j \qquad (52)$$

Here, $$\Omega_j = \frac{\omega_j}{\bar{\omega}} \qquad (53)$$

The density of states of the system is defined by $$p(\varepsilon) = \frac{1}{n+1} \sum_{m=1}^{n+1} \delta(\varepsilon - \varepsilon_m) \quad (54)$$

and the staircase function $$\lambda(\epsilon) = \int_{-\infty}^{\epsilon} d\eta \rho(\eta) \quad (55)$$

is calculated. The staircase function obtained is converted by a technique called "unfolding" such that the density of states becomes constant in average. By using quantum levels obtained in this manner, nearest-neighbor level spacing distribution P(s) and $\Delta_3$ statistics of Dyson and Metha are calculated as quantum level statistics. As taught in a literature ((36) L. E. Reichl, The transition to chaos: in conservative classical systems: quantum manifestations (Springer, New York, 1992) (37) F. Haake, Quantum Signatures of chaos, (Springer-Verlag, 1991)), by using these statistics, it can be detected whether quantum chaos has been generated or not. It is also known that a quantum chaotic system is sensitive to perturbation from outside similarly to the classical chaotic system, and analysis of quantum chaos is important as a polestar of designs of non-linear materials.

In case of an integrable system, nearest-neighbor level spacing distribution P(s) and $\Delta_3$ statistics are those of Poisson distribution $$P_p(s) = e^{-S} \quad (56)$$

$$\Delta_3(n) = \frac{n}{15} \quad (57)$$

In case of a quantum chaotic system, it becomes GOE distribution $$P_{GOE}(s) = \frac{\pi s}{2} e^{-\pi s^2/4} \quad (58)$$

$$\Delta_3(n) = \frac{1}{\pi^2} \left[ \log(2\pi n) + \gamma - \frac{\pi^2}{8} - \frac{5}{4} \right] + O(n^{-1}) \quad (59)$$

where $\gamma$ is the Euler's constant.

Figure 16:
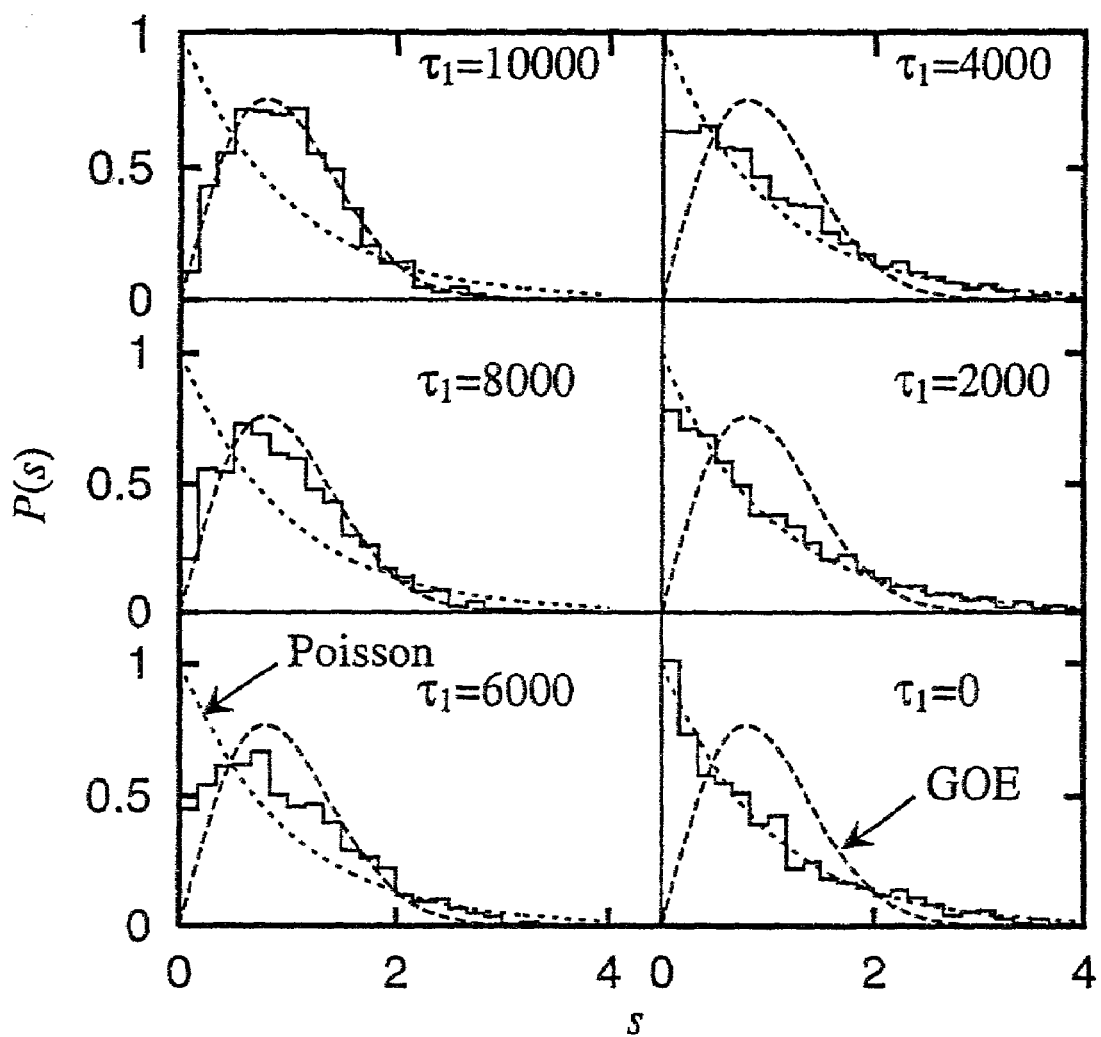
FIG. 16 is a schematic diagram that shows quantum level statistics in a stellar fractal structure according to the third embodiment of the invention.
Figure 17:
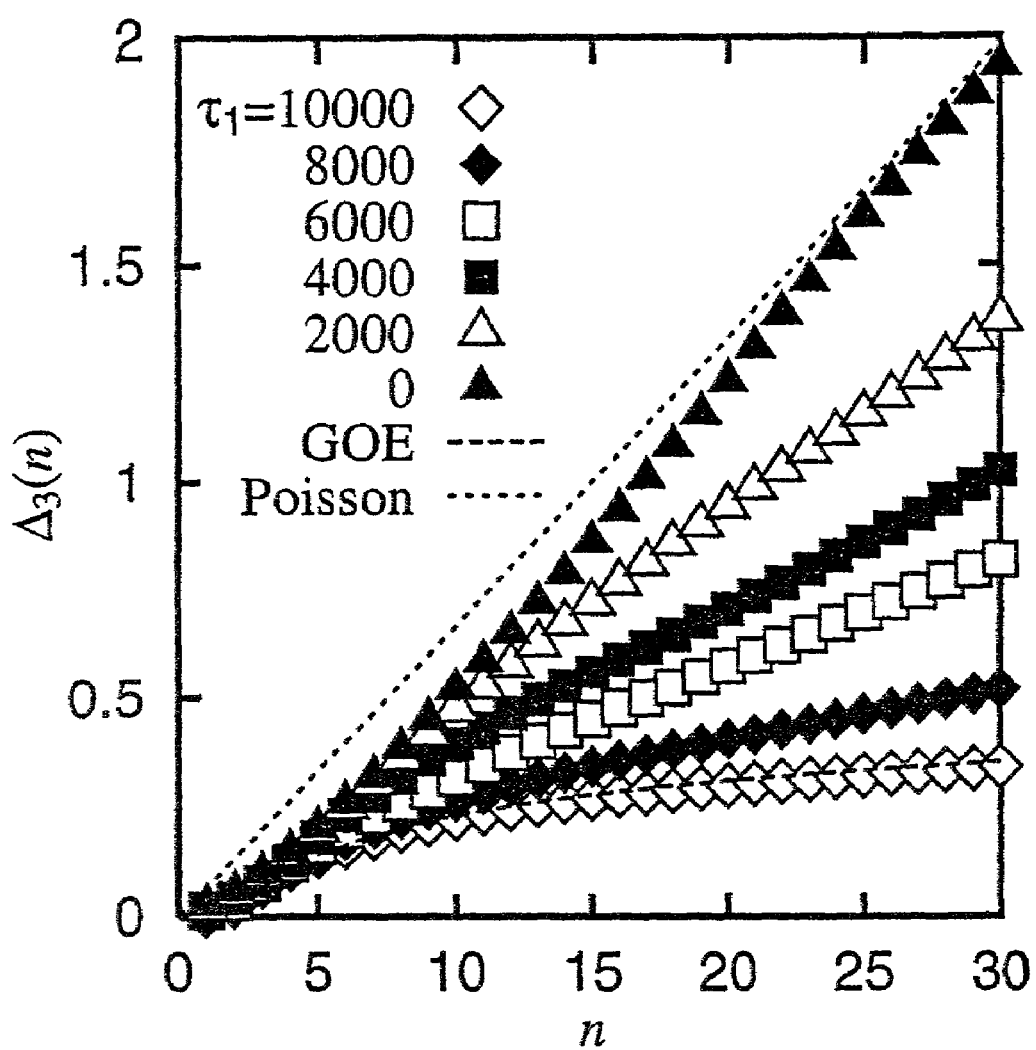
FIG. 17 is a schematic diagram that shows quantum level statistics in a stellar fractal structure according to the third embodiment of the invention.

Since the stellar fractal structure analyzed here is one obtained by growth experiment of n=10000, this quantum system includes n+1=10001 eigenstates. Based on energy eigenvalues concerning 1501 states from the 510-th to 2001-th eigenstates from the ground state, among those eigenstates, the following quantum level statistics was calculated. FIGS. 16 and 17 show quantum level statistics in a stellar fractal structure of $(\alpha_1, \alpha_2)$=(0, 2). FIG. 16 shows P(s) and FIG. 17 shows $\Delta_3$ statistics. In case of $\tau_1$=10000, the structure is the same as the simple fractal of $\alpha$=0, and the fractal dimension is near 3 ($D_f$~2.91). Therefore, the system behaves as a quantum chaotic system. In this case, the quantum level statistics is that of GOE distribution. On the other hand, in case of $\tau_1$=0, the structure is the same as the simple fractal of $\alpha$=2, and the fractal dimension is near 2 ($D_f$~2.16). Therefore, the system behaves as an integrable system. Then as $\tau_1$ increases from 0 to 10000, the quantum level statistics changes from Poisson distribution to GOE distribution. Therefore, wide kinds of quantum systems can be realized by setting $\tau_1$ at predetermined values.

Figure 18:
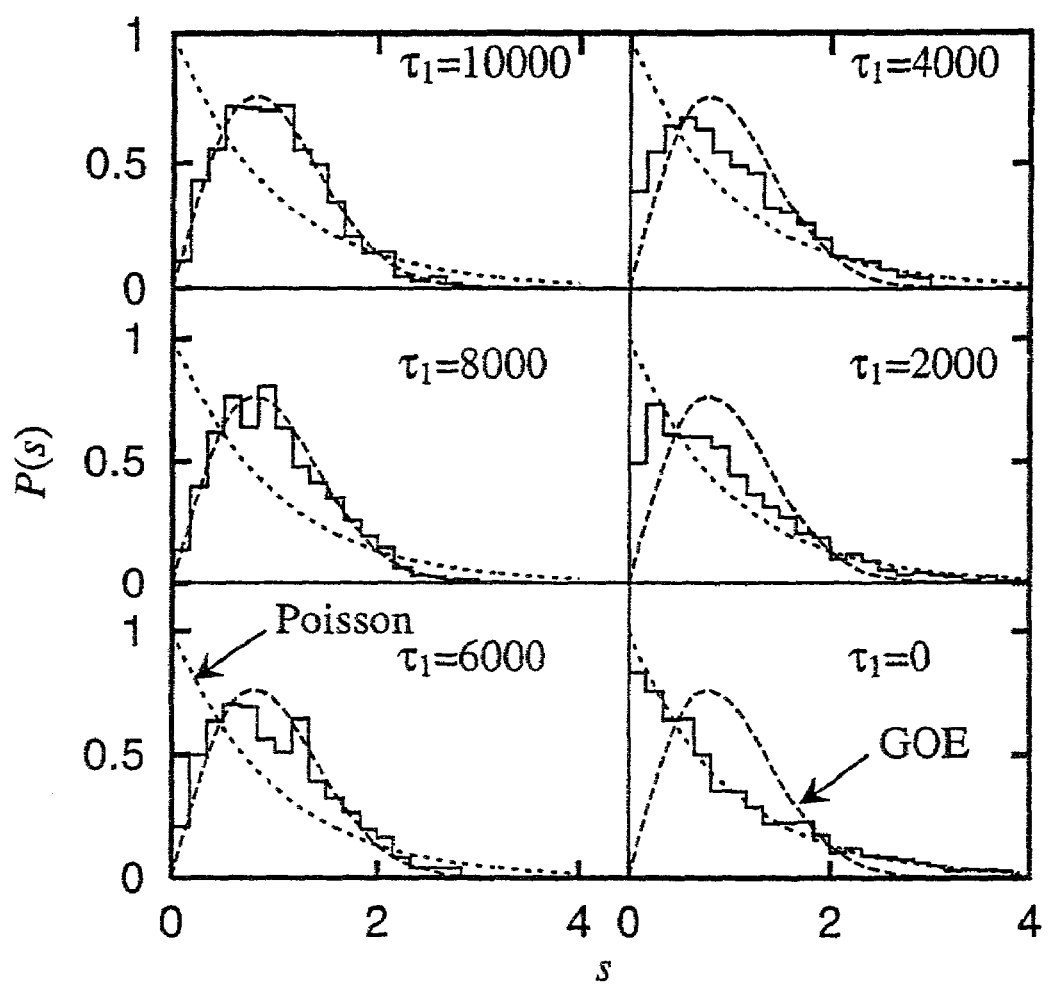
FIG. 18 is a schematic diagram that shows quantum level statistics in a stellar fractal structure according to the third embodiment of the invention.
Figure 19:
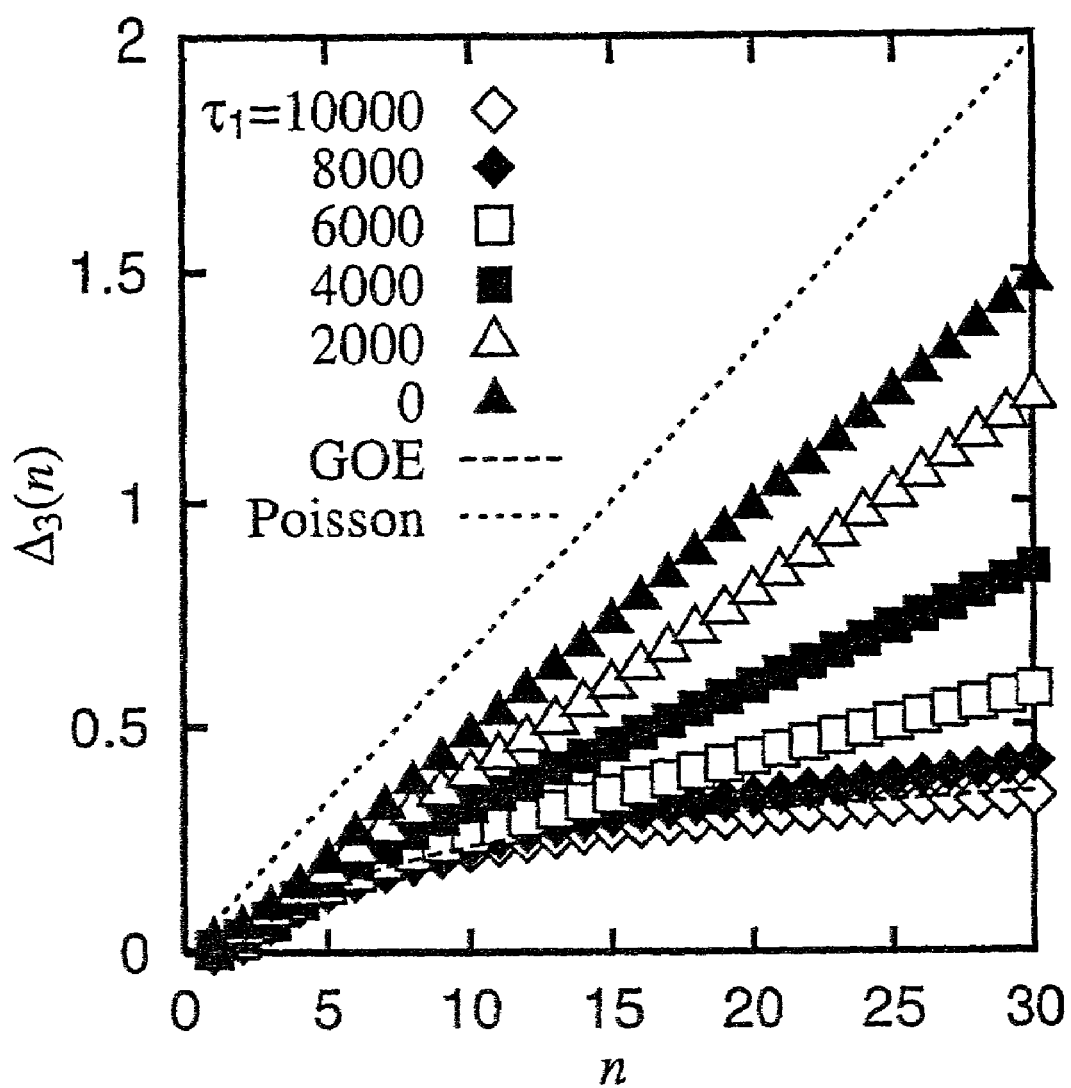
FIG. 19 is a schematic diagram that shows quantum level statistics in a stellar fractal structure according to the third embodiment of the invention.
Figure 20:
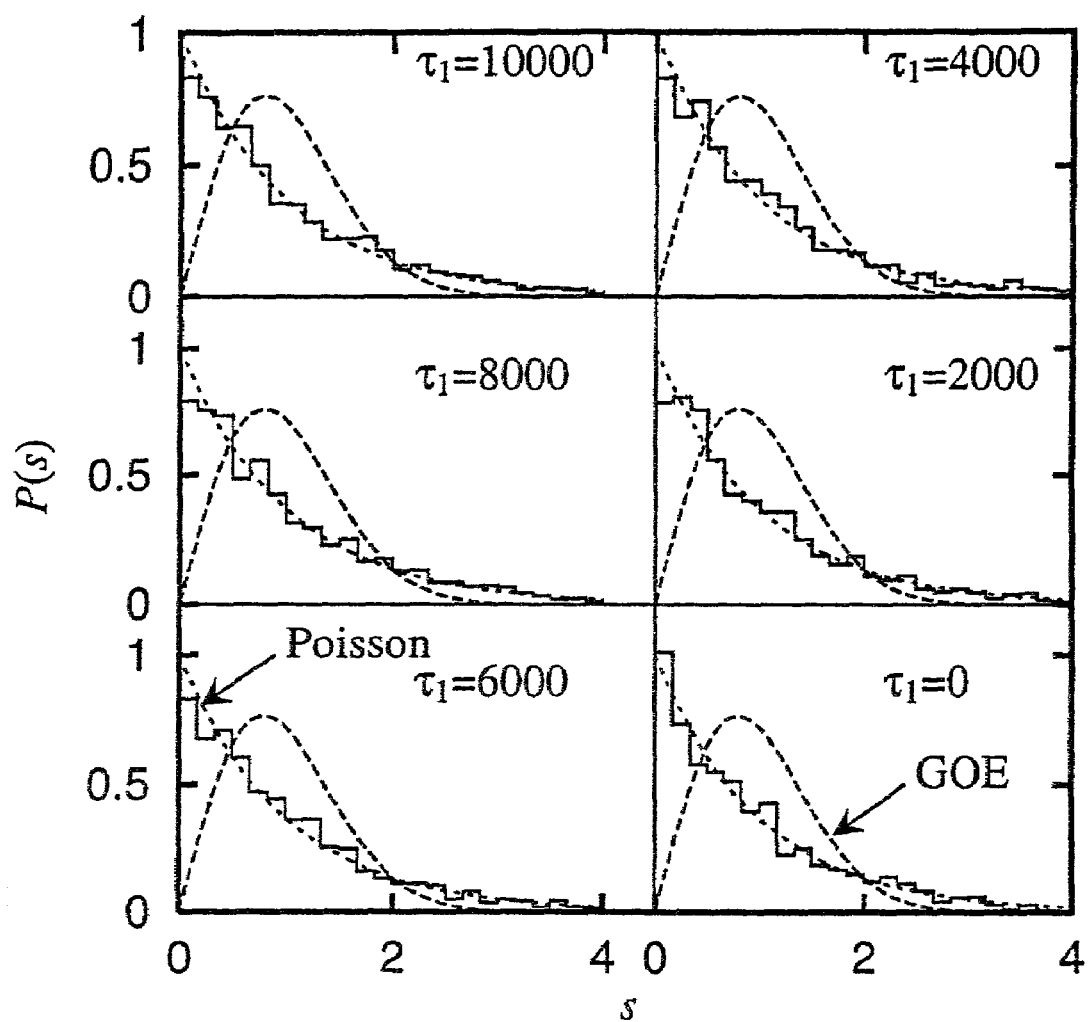
FIG. 20 is a schematic diagram that shows quantum level statistics in a stellar fractal structure according to the third embodiment of the invention.
Figure 21:
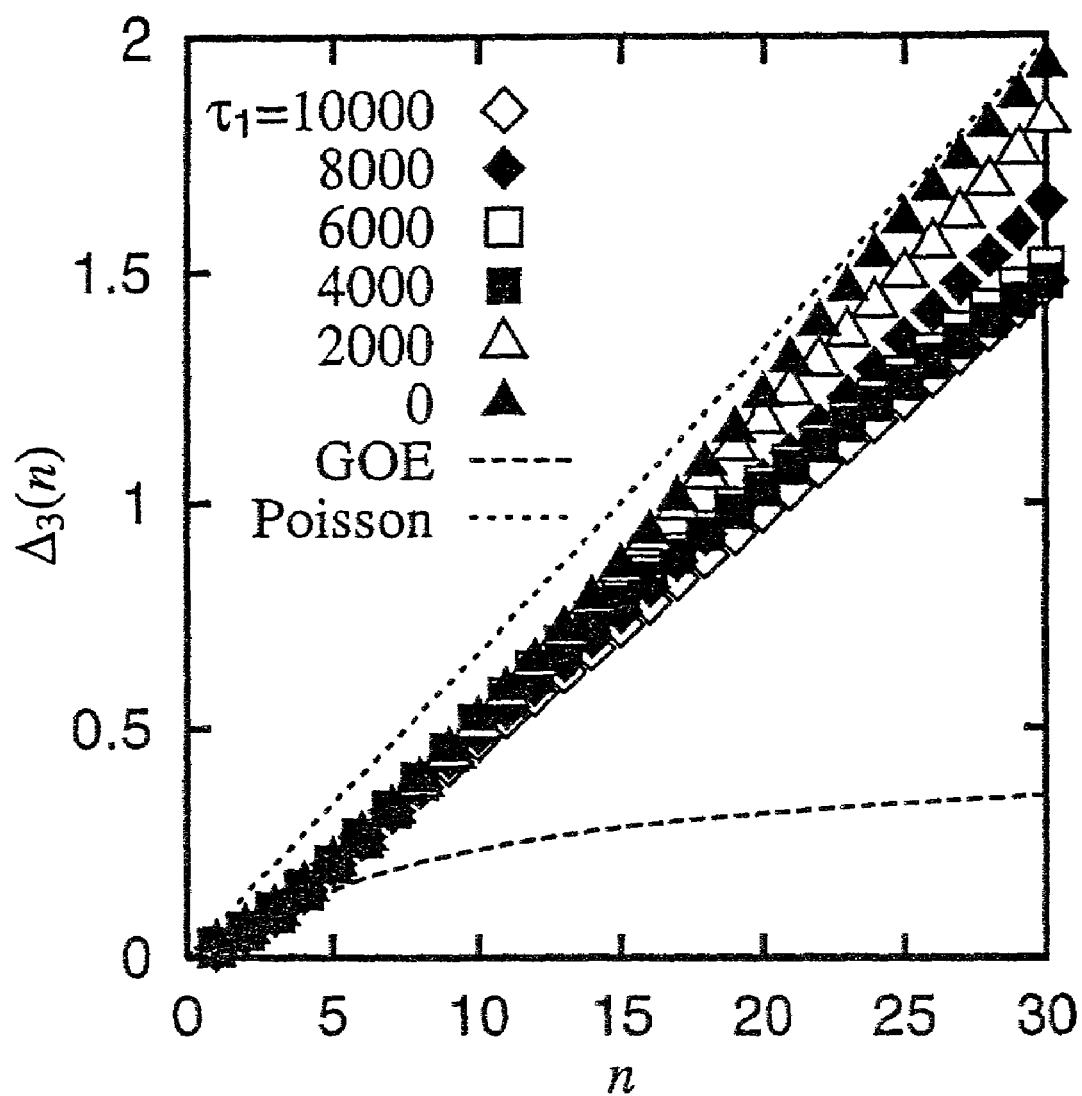
FIG. 21 is a schematic diagram that shows quantum level statistics in a stellar fractal structure according to the third embodiment of the invention.

The above examples are stellar fractal structures in which $\alpha$=0 and $\alpha$=2 coexist. In contrast, a simple fractal structure of $\alpha$=1 is of a level of the fractal dimension ($D_f$~2.45), and a quantum chaotic system of $\alpha$=0 and an integrable system can be connected via the simple fractal of $\alpha$=1. FIGS. 18 and 19 show quantum level statistics in a stellar fractal structure of $(\alpha_1, \alpha_2)$=(0, 1). FIGS. 20 and 21 show quantum level statistics in a stellar fractal structure of $(\alpha_1, \alpha_2)$=(1, 2). FIGS. 18 and 20 show P(s), and FIGS. 19 and 21 show $\Delta_3$ statistics. $\tau_1$=10000 of FIGS. 18 and 19 is the same quantum chaotic system as $\tau_1$=10000 of FIGS. 16 and 17. As shown in FIGS. 18 and 19, as $\tau_1$ decreases, the quantum level statistics changes from that of GOE distribution to that of Poisson distribution. However, even in $\tau_1$=0 of FIGS. 18 and 19, i.e., even in the simple fractal of $\alpha$=1, it does not exhibit complete Poisson distribution. Let us change the eyes to FIGS. 20 and 21. $\tau_1$=10000 of FIGS. 20 and 21 is the same as $\tau_1$=0 of FIGS. 18 and 19, and it is the quantum level statistics in the simple fractal structure of $\alpha$=1. As $\tau_1$ decreases, the quantum level statistics approaches that of Poisson distribution, and in a region with small $\tau_1$, it asymptotically approaches that of Poisson distribution. Of course, $\tau_1$=0 of FIGS. 20 and 21 is the quantum level statistics in the simple fractal of $\alpha$=2, and it is the same as $\tau_1$=0 of FIGS. 16 and 17.

Fourth Embodiment (1) Formation of a Stellar Fractal Structure

A method of forming the star-shaped fractal structure according to the fourth embodiment is the same as the method of forming the stellar fractal structure according to the first embodiment. As growth conditions, however, similarly to the second embodiment, $(\alpha_1, \alpha_2)$=(0, 1) and $(\alpha_1, \alpha_2)$=(1, 2) were used in addition to $(\alpha_1, \alpha_2)$=(0, 2), and numerical experiment of growth was conducted for these cases. Results of log—log plotting for respective cases obtained by the growth experiment are the same as those shown in FIGS. 9 through 11.

(2) Electron System on a Stellar Fractal Structure

Let us define a quantum system of one particle on the stellar fractal defined in (1). Assume a lattice site shown below, which is the origin of $T_n$.

$$r_p = (i_{1,p}, i_{2,p}, i_{3,p}) \in T_n \quad (60)$$

where p=0, 1, 2, . . . , n. Here is defined an operator $\hat{c}\dagger_p$ that creates a quantum at a lattice site $r_p \in T_n$. Of course, an anticommutative relation $$\{\hat{c}_p, \hat{c}_q^\dagger\} = \delta_{p,q} \quad (61)$$

is established. Here the Hamiltonian $\hat{H}$ is defined as $$\hat{H} = -\sum_{p,q} t_{p,q} \hat{c}_p^\dagger \hat{c}_q \quad (62)$$

Here is employed as the transfer $t_{p,q}$, $$t_{p,q} = \begin{cases} \exp(i\theta_{p,q}) & \text{when } |r_p - r_q| = 1 \\ 0 & \text{otherwise} \end{cases} \quad (63)$$

In this equation, $\theta_{p,q} = \theta_{q,p}$ is a random real number satisfying $$0 < \theta_{p,q} < 2\pi \quad (64)$$

In this model, hopping is possible only between nearest-neighbor sites. Then, along with the hopping, phase factors $\theta_{p,q}$, which are random from one site to another, are added. If the phase factor is integrated in the loop making one turn around a lattice point, a magnetic flux passing through the loop is obtained. This means a magnetic field is locally introduced to the random distribution of $0<\theta_{p,q}<2\pi$. This magnetic field is absolutely random in both intensity and direction, and in spatial average, it becomes a zero magnetic field and never breaks the fractal property of the system.

When $\epsilon_m$ denotes the eigenenergy of the Hamiltonian $\hat{H}$ and $|m\rangle$ denotes the eigenvector, $$\hat{H}|m\rangle = \epsilon_m |m\rangle \quad (65)$$

where m=0, 1, 2, . . . , n.

First, n+1 quantum levels $\epsilon_m$ are standardized such that spacing between nearest-neighbor levels becomes 1 in average. That is, $$\omega_j = \epsilon_j - \epsilon_{j-1} \quad (66)$$

However, when j=1, 2, . . . , n, by using $$\bar{\omega} = \frac{1}{n} \sum_{j=1}^{n} \omega_j \quad (67)$$

it is converted into new levels $$\epsilon_0 = 0 \quad (68)$$

$$\varepsilon_m = \frac{1}{\bar{\omega}} \sum_{j=1}^{m} \omega_j = \sum_{j=1}^{m} \Omega_j \quad (69)$$

Here, $$\Omega_j = \frac{\omega_j}{\bar{\omega}} \quad (70)$$

The density of states of the system is defined by $$\rho(\varepsilon) = \frac{1}{n+1} \sum_{m=1}^{n+1} \delta(\varepsilon - \varepsilon_m) \quad (71)$$

and the staircase function $$\lambda(\epsilon) = \int_{-\infty}^{\epsilon} d\eta \rho(\eta) \quad (72)$$

is calculated. The staircase function obtained is converted by a technique called "unfolding" such that the density of states becomes constant in average. By using quantum levels obtained in this manner, nearest-neighbor level spacing distribution P(s) and $\Delta_3$ statistics of Dyson and Metha are calculated as quantum level statistics. As taught in a literature ((36) L. E. Reichl, The transition to chaos: in conservative classical systems: quantum manifestations (Springer, New York, 1992) (37) F. Haake, Quantum Signatures of chaos, (Springer-Verlag, 1991)), by using these statistics, it can be detected whether quantum chaos has been generated or not. It is also known that a quantum chaotic system is sensitive to perturbation from outside similarly to the classical chaotic system, and analysis of quantum chaos is important as a polestar of designs of non-linear materials.

In case of an integrable system, nearest-neighbor level spacing distribution P(s) and $\Delta_3$ statistics are those of Poisson distribution $$P_P(s) = e^{-s} \quad (73)$$

$$\Delta_3(n) = \frac{n}{15} \quad (74)$$

In case of a quantum chaotic system under a magnetic field, it becomes GUE (Gaussian unitary ensemble) distribution $$P_{GUE}(s) = \frac{32s^2}{\pi^2} e^{-4s^2/\pi} \quad (75)$$

$$\Delta_3(n) = \frac{1}{2\pi^2}\left[\log(2\pi n) + \gamma - \frac{5}{4}\right] + O(n^{-1}) \quad (76)$$

where $\gamma$ is the Euler's constant.

Figure 22:
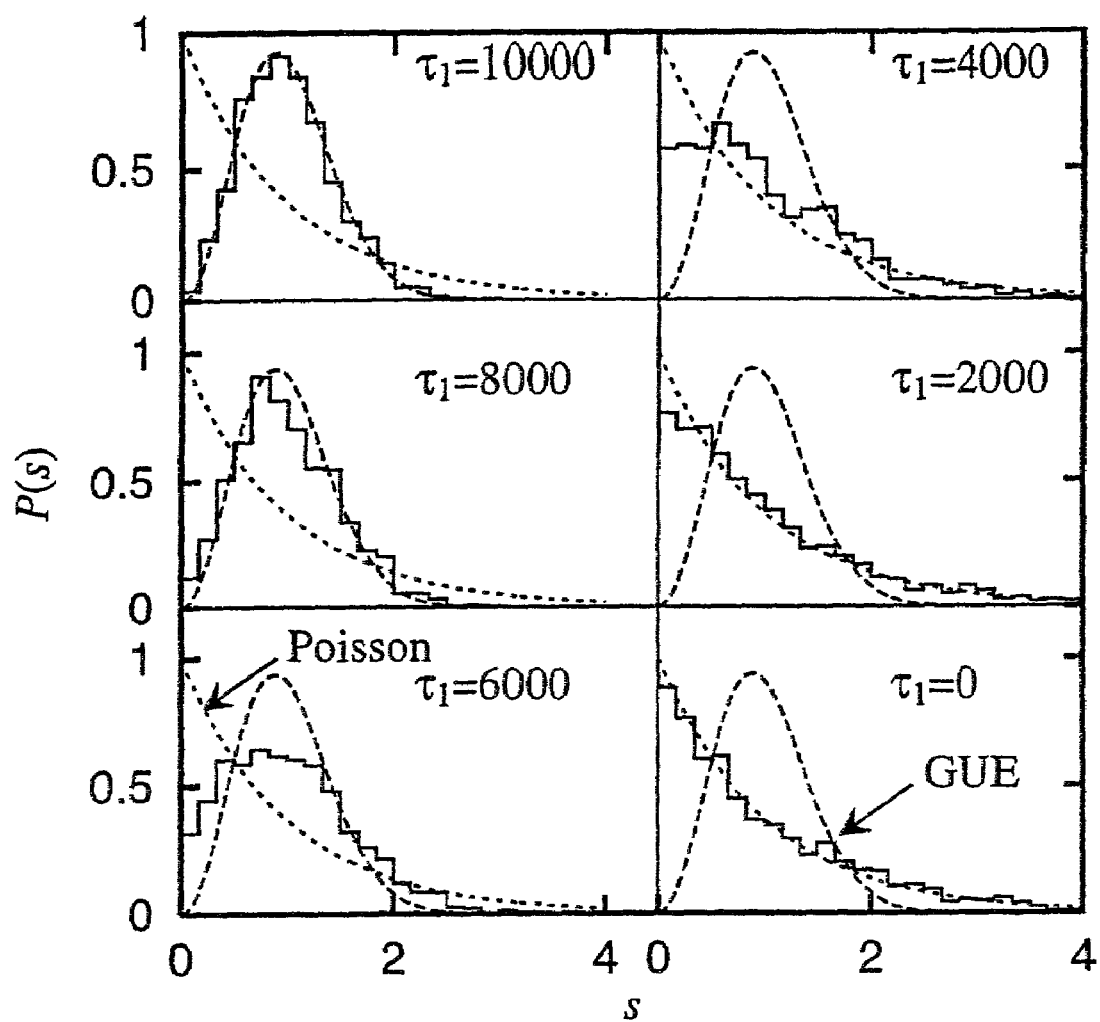
FIG. 22 is a schematic diagram that shows quantum level statistics in a stellar fractal structure according to the fourth embodiment of the invention.
Figure 23:
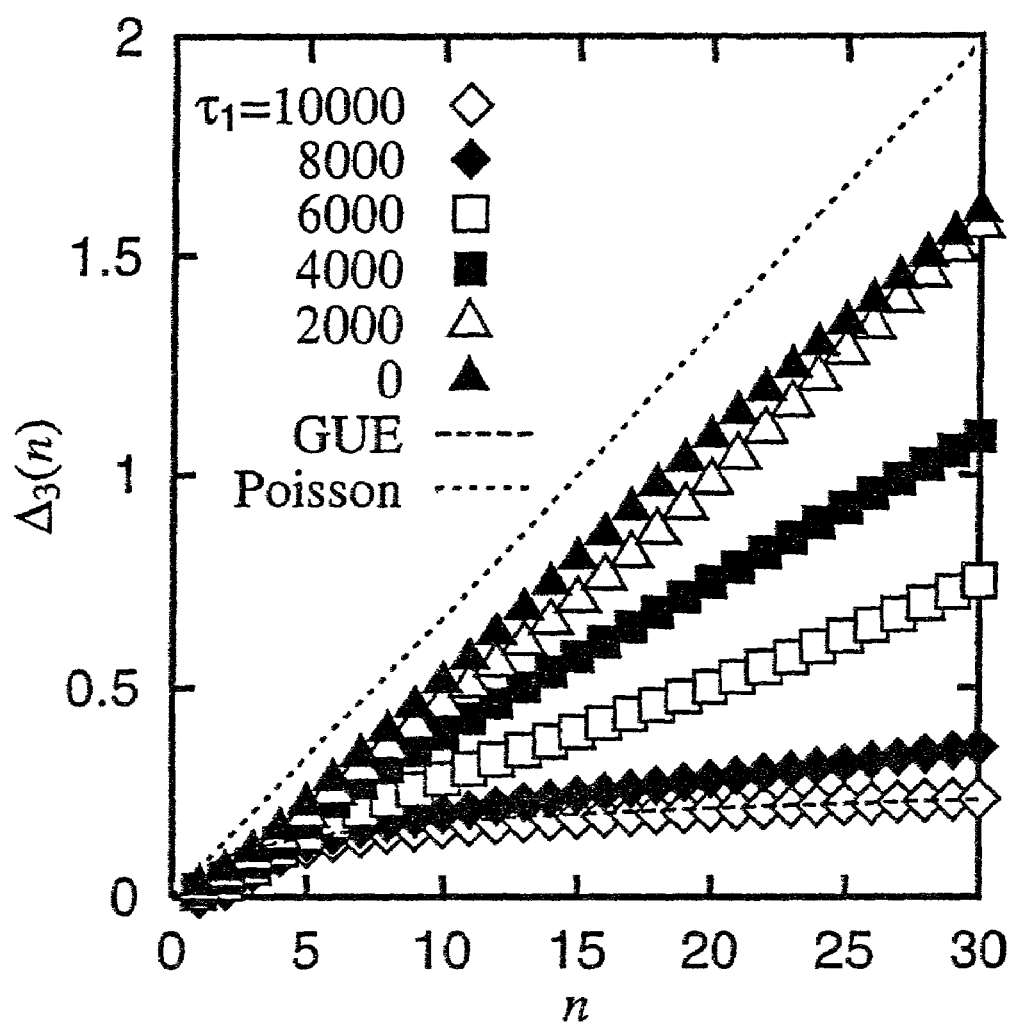
FIG. 23 is a schematic diagram that shows quantum level statistics in a stellar fractal structure according to the fourth embodiment of the invention.

Since the stellar fractal structure analyzed here is one obtained by growth experiment of n=10000, this quantum system includes n+1=10001 eigenstates. Based on energy eigenvalues concerning 1501 states from the 510-th to 2001-th eigenstates from the ground state, among those eigenstates, the following quantum level statistics was calculated. FIGS. 22 and 23 show quantum level statistics in a stellar fractal structure of $(\alpha_1, \alpha_2)=(0, 2)$. FIG. 22 shows P(s) and FIG. 23 shows $\Delta_3$ statistics. In case of $\tau_1=10000$, the structure is the same as the simple fractal of $\alpha=0$, and the fractal dimension is near 3 ($D_f \sim 2.91$). Therefore, the system behaves as a quantum chaotic system. In this case, the quantum level statistics is that of GOE distribution. On the other hand, in case of $\tau_1=0$, the structure is the same as the simple fractal of $\alpha=2$, and the fractal dimension is near 2 ($D_f \sim 2.16$). Therefore, the system behaves as an integrable system. Then as $\tau_1$ increases from 0 to 10000, the quantum level statistics changes from Poisson distribution to GOE distribution. Therefore, wide kinds of quantum systems can be realized by setting $\tau_1$ at predetermined values.

Figure 24:
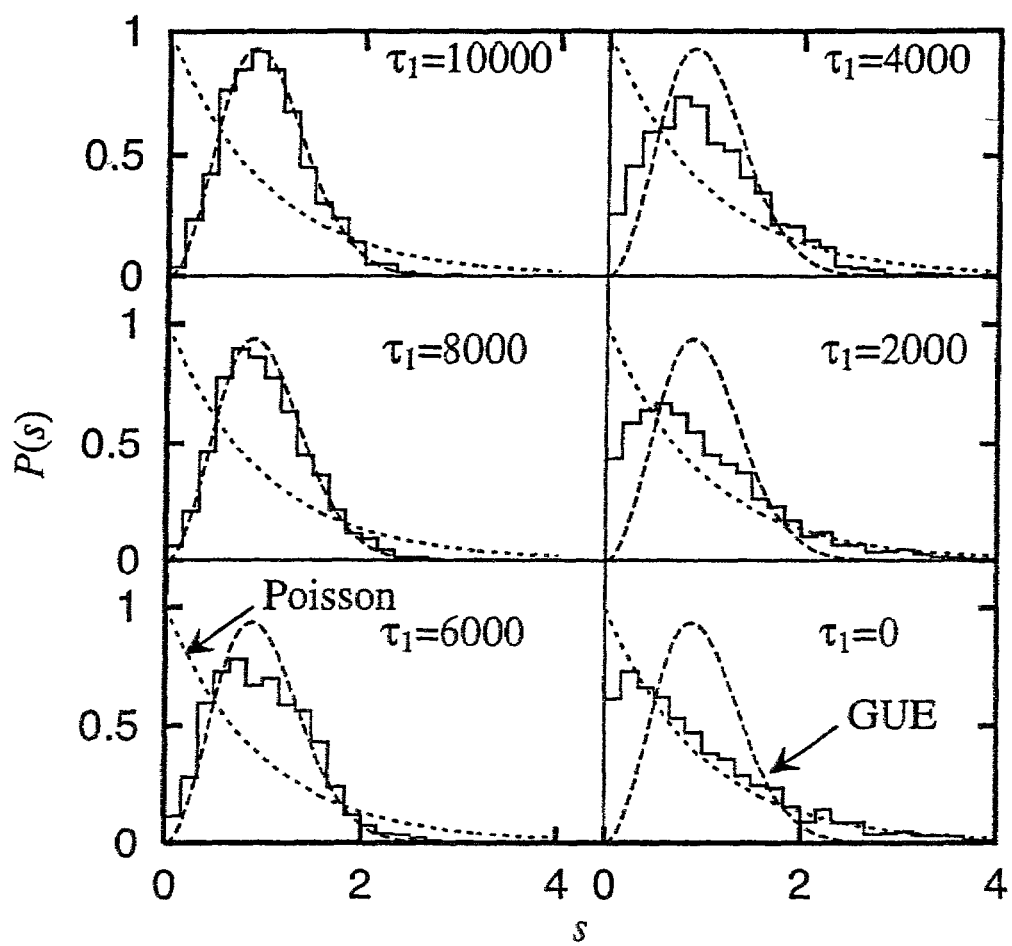
FIG. 24 is a schematic diagram that shows quantum level statistics in a stellar fractal structure according to the fourth embodiment of the invention.
Figure 25:
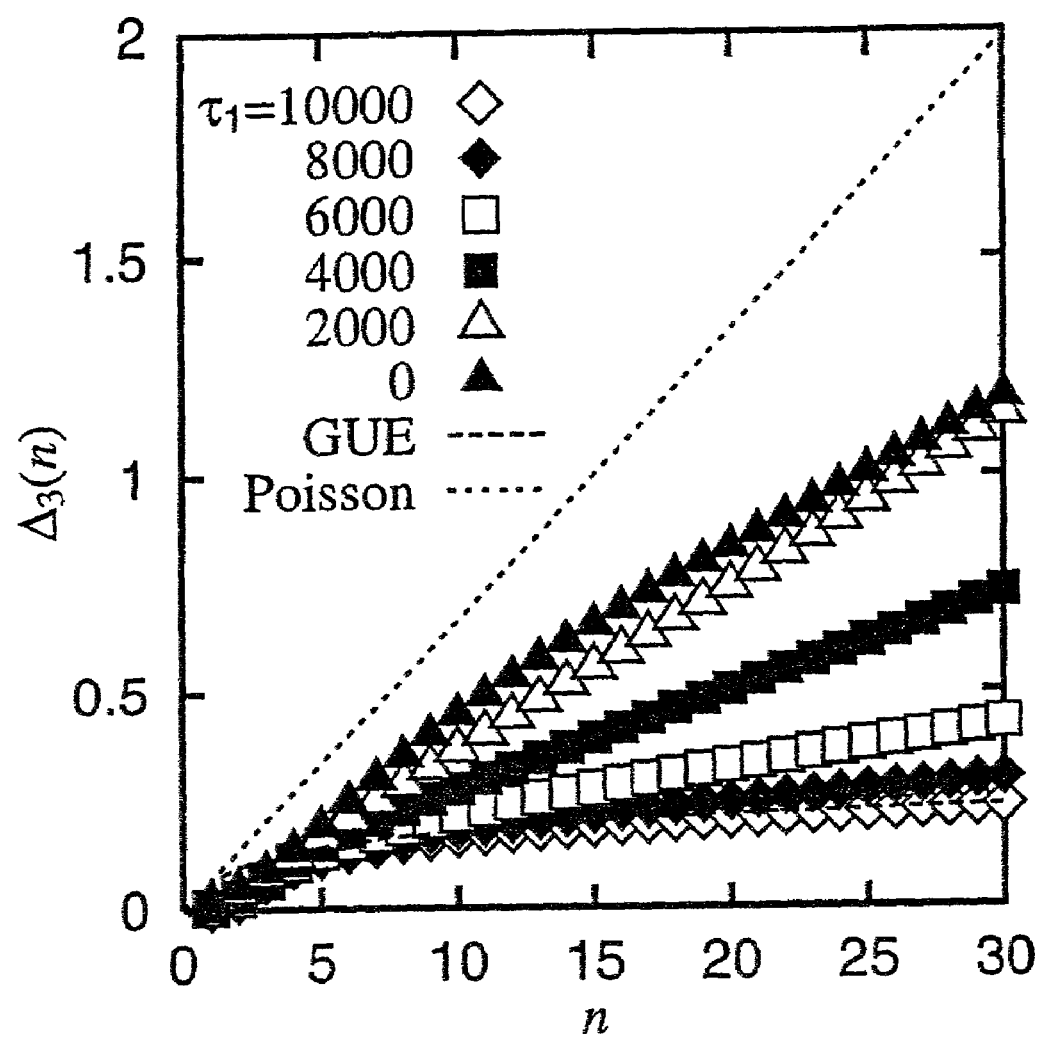
FIG. 25 is a schematic diagram that shows quantum level statistics in a stellar fractal structure according to the fourth embodiment of the invention.
Figure 26:
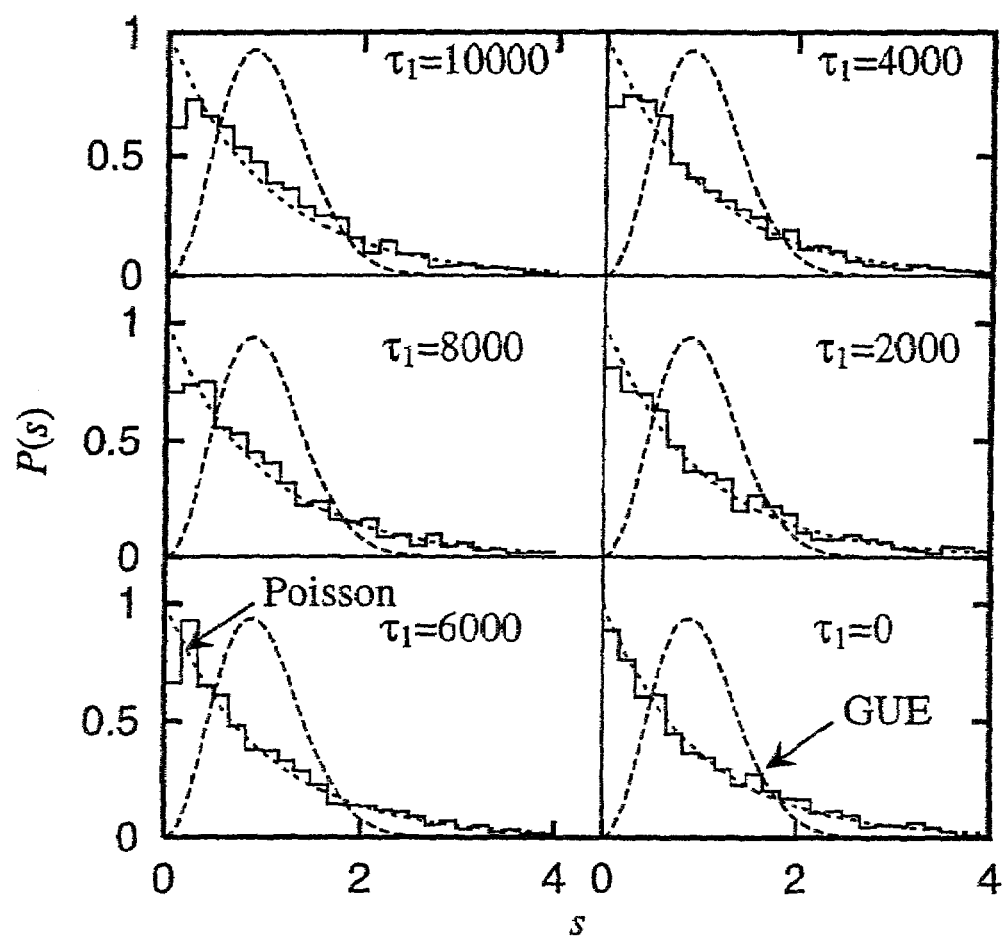
FIG. 26 is a schematic diagram that shows quantum level statistics in a stellar fractal structure according to the fourth embodiment of the invention.
Figure 27:
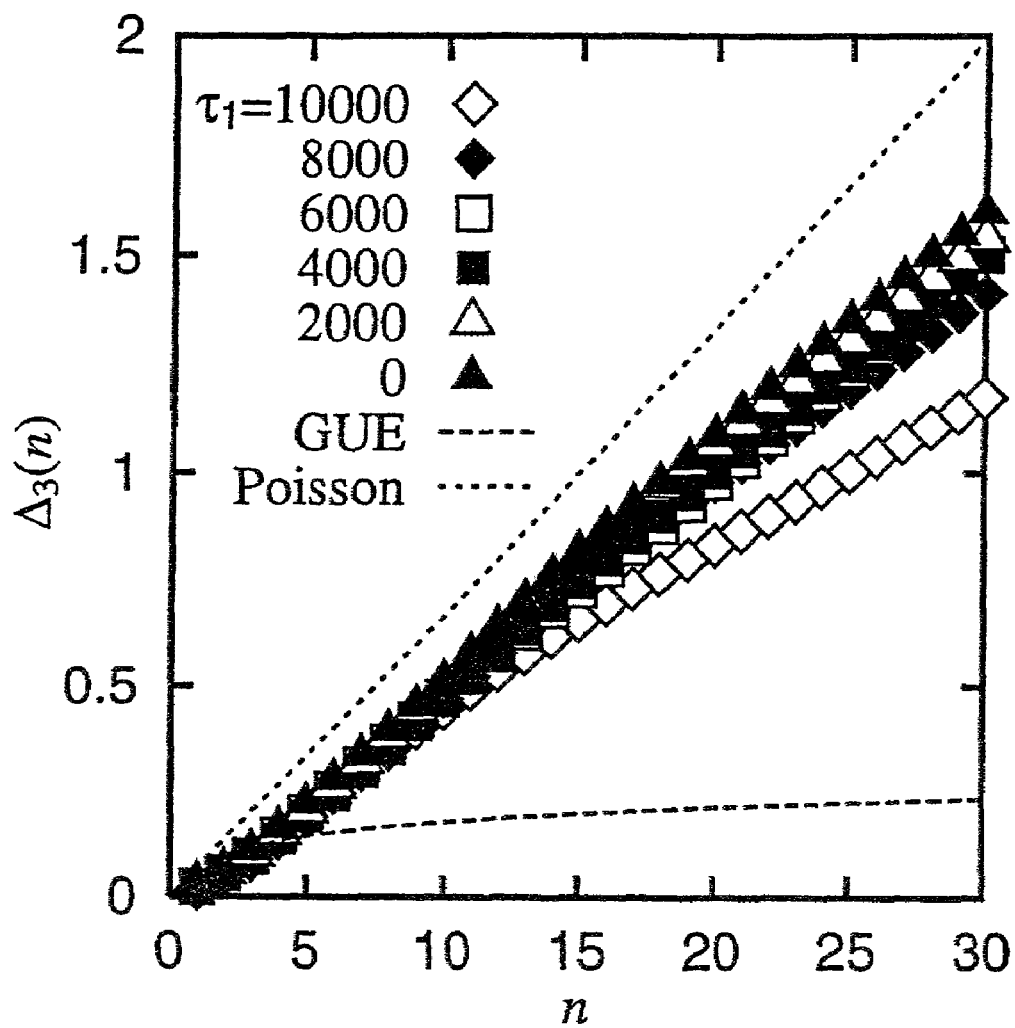
FIG. 27 is a schematic diagram that shows quantum level statistics in a stellar fractal structure according to the fourth embodiment of the invention.

The above examples are stellar fractal structures in which $\alpha=0$ and $\alpha=2$ coexist. In contrast, a simple fractal structure of $\alpha=1$ is of a level of the fractal dimension ($D_f \sim 2.45$), and a quantum chaotic system of $\alpha=0$ and an integrable system can be connected via the simple fractal of $\alpha=1$. FIGS. 24 and 25 show quantum level statistics in a stellar fractal structure of $(\alpha_1, \alpha_2)=(0, 1)$. FIGS. 26 and 27 show quantum level statistics in a stellar fractal structure of $(\alpha_1, \alpha_2)=(1, 2)$. FIGS. 24 and 26 show P(s), and FIGS. 25 and 27 show $\Delta_3$ statistics. $\tau_1=10000$ of FIGS. 24 and 25 is the same quantum chaotic system as $\tau_1=10000$ of FIGS. 22 and 23. As shown in FIGS. 24 and 25, as $\tau_1$ decreases, the quantum level statistics changes from that of GUE distribution to that of Poisson distribution. However, even in $\tau_1=0$ of FIGS. 24 and 25, i.e., even in the simple fractal of $\alpha=1$, it does not exhibit complete Poisson distribution. Let us change the eyes to FIGS. 26 and 27. $\tau_1=10000$ of FIGS. 26 and 27 is the same as $\tau_1=0$ of FIGS. 24 and 25, and it is the quantum level statistics in the simple fractal structure of $\alpha=1$. As $\tau_1$ decreases, the quantum level statistics approaches that of Poisson distribution, and in a region with small $\tau_1$, it asymptotically approaches that of Poisson distribution. Of course, $\tau_1=0$ of FIGS. 26 and 27 is the quantum level statistics in the simple fractal of $\alpha=2$, and it is the same as $\tau_1=0$ of FIGS. 22 and 23.

In correspondence with the change from the quantum chaotic system described by GOE distribution, observed under no magnetic field, to the integrable quantum system described by Poisson distribution, it is observed under the random magnetic field that the quantum chaotic system described by GUE distribution changes to an integrable quantum system described by Poisson distribution. That is, it has been confirmed that widely various kinds of quantum chaotic systems from quantum chaotic system described by GOE distribution to quantum chaotic systems described by GUE distribution can be obtained.

Fifth Embodiment

In the fifth embodiment, fractal dimensions suitable for controlling correlative electron systems by stellar fractal structures will be explained.

(1) Formation of a Stellar Fractal Structure

A method of forming the star-shaped fractal structure according to the fifth embodiment is the same as the method of forming the stellar fractal structure according to the first embodiment. As growth conditions, however, while fixing $\tau_1=5000$ and $\tau_2=10000$, $(\alpha_1, \alpha_2)$ was changed variously within the range satisfying $\alpha_1<\alpha_2$ for conducting numerical experiment of growth.

Figure 28:
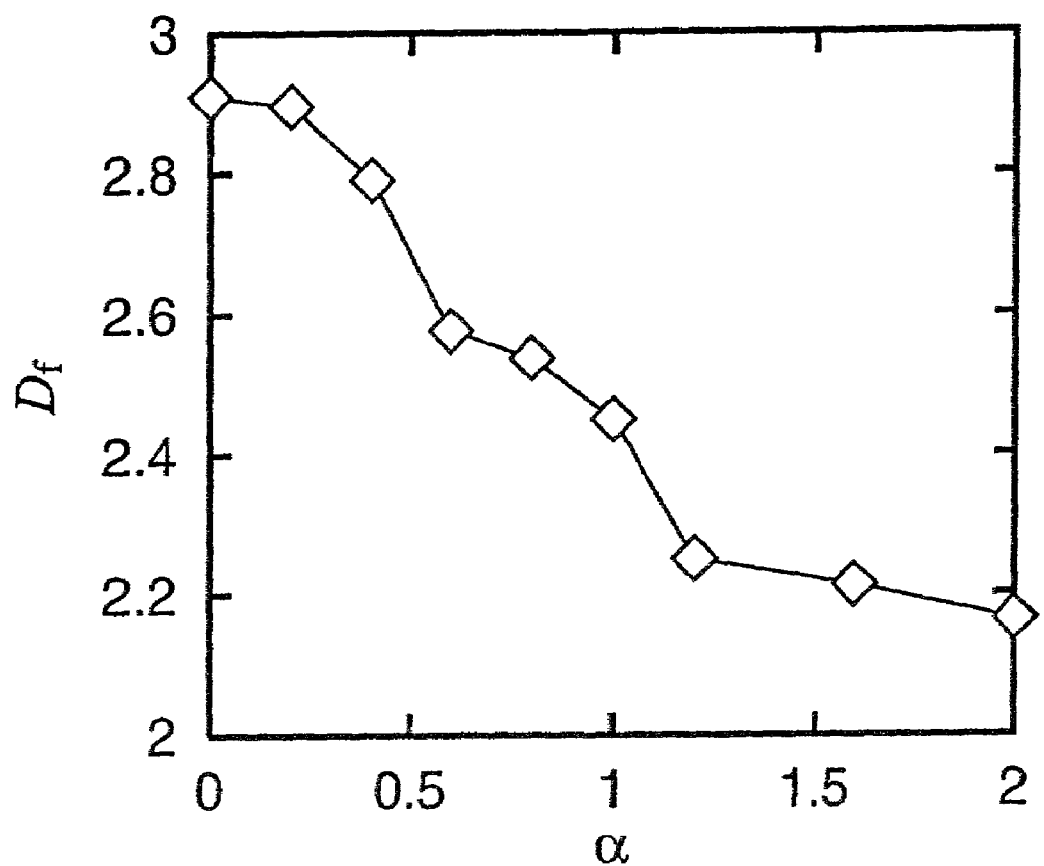
FIG. 28 is a schematic diagram that shows a relation between $\alpha$ and the fractal dimension $D_f$ in a simplex fractal structure.

Regarding methods of forming a single fractal structure by a dielectric breakdown model, it is known that changes of $\alpha$ invite changes of the fractal dimension $D_f$ of the fractal structure to be formed. Fractal dimensions having obtained by simulation are shown in FIG. 28 (see Literature (34)). As apparent from FIG. 28, as $\alpha$ increases, $D_f$ decreases. When $\alpha<0.5$, $D_f<2.7$ is obtained. When $\alpha>1$, $D_f<2.3$ is obtained.

(2) Correlative Electron System in a Stellar Fractal Structure

An electron system is defined on the stellar fractal structure defined in (1). A review is made about the lattice point $$r_p=(i_{1,p}, i_{2,p}, i_{3,p}) \in T_n \tag{77}$$

that is the origin of $T_n$. In Equation (9), $p=0, 1, 2, \ldots, n$. An operator $\hat{c}^\dagger_{p,\sigma}$ for generating an electron of a spin $\sigma$ is defined at the lattice point $r_p \in T_n$. Of course, there is the anticommutative relation $$\{\hat{c}_{p,\sigma}, \hat{c}^\dagger_{q,p}\} = \delta_{p,q}\delta_{\sigma,p} \tag{78}$$

Here is defined a single-band Hubbard Hamiltonian $\hat{H}$ of the electron system as follows.

$$\hat{H} = t\sum_{i,j,\sigma} \lambda_{i,j} \hat{c}^\dagger_{i,\sigma} \hat{c}_{j,\sigma} + U \sum_j \hat{n}_{j,\uparrow} \hat{n}_{j,\downarrow} \tag{79}$$

Assuming that electrons are movable only among nearest-neighbor sites, the following is employed $$\lambda_{p,q} = \begin{cases} 1 & \text{when } |r_p - r_q| = 1 \\ 0 & \text{otherwise} \end{cases} \tag{80}$$

Additionally, the spin $\sigma$ electron density operator of the j-th site, $\hat{n}_{j,\sigma}=\hat{c}^\dagger_{j,\sigma}\hat{c}_{j,\sigma}$, and their sum, $\hat{n}_j=\Sigma_\sigma \hat{n}_{j,\sigma}$, are defined.

For the purpose of defining a temperature Green's function, here is introduced a grand canonical Hamiltonian $\hat{K}=\hat{H}-\mu\hat{N}$ where $\hat{N}=\Sigma_j\hat{n}_j$. In the half-filled taken here, chemical potential is $\mu=U/2$. The half-filled grand canonical Hamiltonian can be expressed as $$\hat{K} = t\sum_{i,j,\sigma} \lambda_{j,i} \hat{t}_{j,i,\sigma} + U/2 \sum_i (\hat{u}_i - 1) \tag{81}$$

Operators $\hat{t}_{j,i,\sigma}$, $\hat{j}_{j,i,\sigma}$, $\hat{u}_i$ and $\hat{d}_{i,\sigma}$ are defined beforehand as $$\hat{t}_{j,i,\sigma} = \hat{c}^\dagger_{j,\sigma}\hat{c}_{i,\sigma} + \hat{c}^\dagger_{j,\sigma}\hat{c}_{i,\sigma} \tag{82}$$

$$\hat{j}_{j,i,\sigma} = \hat{c}^\dagger_{j,\sigma}\hat{c}_{i,\sigma} - \hat{c}^\dagger_{j,\sigma}\hat{c}_{i,\sigma} \tag{83}$$

$$\hat{u}_i = \hat{c}^\dagger_{i,\uparrow}\hat{c}_{i,\uparrow}\hat{c}^\dagger_{i,\downarrow}\hat{c}_{i,\downarrow} + \hat{c}_{i,\uparrow}\hat{c}^\dagger_{i,\downarrow}\hat{c}_{i,\uparrow}\hat{c}^\dagger_{i,\leftarrow} \tag{84}$$

$$\hat{d}_{i,\sigma} = \hat{c}^\dagger_{i,\sigma}\hat{c}_{i,\sigma} - \hat{c}^\dagger_{i,\sigma} \tag{85}$$

If the temperature Green function is defined for operators $\hat{A}$ and $\hat{B}$ given, taking $\tau$ as imaginary time, it is as follows.

$$<\hat{A};\hat{B}> = -\int_0^\beta d\tau <T_\tau \hat{A}(\tau)\hat{B}> e^{i w_M \tau} \tag{86}$$

The on-site Green function $$G_{j,\sigma}(iw_n) = <\hat{c}_{j,\sigma}; \hat{c}^\dagger_{j,\sigma}> \tag{87}$$

is especially important.

Imaginary time development of the system is obtained by the Heisenberg equation $$\frac{d}{d\tau}\hat{A}(\tau) = [\hat{K}, \hat{A}] \tag{88}$$

As the equation of motion of the on-site Green function, $$i\omega_n \langle \hat{c}_{j,\sigma}; \hat{c}^\dagger_{j,\sigma}\rangle = 1 + t\sum_{p,j} \lambda_{p,j}\langle \hat{c}_{p,\sigma}; \hat{c}^\dagger_{j,\sigma}\rangle + \frac{U}{2}\langle \hat{d}_{j,-\sigma}\hat{c}_{j,\sigma}; \hat{c}^\dagger_{j,\sigma}\rangle \tag{89}$$

is obtained. Then, the approximation shown below is introduced, following Gros ((35) C. Gros, Phys. Rev. B50, 7295 (1994)). If the site p is the nearest-neighbor site of the site j, the resolution $$<\hat{c}_{p,\sigma}; \hat{c}^\dagger_{j,\sigma}> \rightarrow t<\hat{c}_{p,\sigma}; \hat{c}^\dagger_{p,\sigma}><\hat{c}_{j,\sigma}; \hat{c}^\dagger_{j,\sigma}> \tag{90}$$

is introduced as the approximation. This is said to be exact in case of infinite-dimensional Bethe lattices, but in this case, it is only within approximation. Under the approximation, the following equation is obtained.

$$(i\omega_n - t^2\Gamma_{j,\sigma})G_{j,\sigma} = 1 + \frac{U}{2}\langle\hat{d}_{j,-\sigma}\hat{c}_{j,\sigma};\hat{c}^\dagger_{j,\sigma}\rangle \quad (91)$$

where $$\Gamma_{j,\sigma} = \sum_p \lambda_{p,j} G_{p,\sigma} \quad (65)$$

was introduced. To solve the equation, obtained, $\langle\hat{d}_{j,-\sigma}\hat{c}_{j,\sigma};\hat{c}^\dagger_{j,\sigma}\rangle$ has to be analyzed. In case of half-filled models, this equation of motion is $$i\omega_n\langle\hat{d}_{j,-\sigma}\hat{c}_{j,\sigma};\hat{c}^\dagger_{j,\sigma}\rangle = \quad (93)$$
$$\frac{U}{2}G_{j,\sigma} - 2t\sum_p \lambda_{p,j}\langle\hat{j}_{p,j,-\sigma}\hat{c}_{j,\sigma};\hat{c}^\dagger_{j,\sigma}\rangle + t\sum_p \lambda_{p,j}\langle\hat{d}_{j,-\sigma}\hat{c}_{j,\sigma};\hat{c}^\dagger_{j,\sigma}\rangle$$

Here again, with reference to the Gros theory, approximation is introduced. It is the following translation.

$$\langle\hat{j}_{p,j,-\sigma}\hat{c}_{j,\sigma};\hat{c}^\dagger_{j,\sigma}\rangle \rightarrow -tG_{p,-\sigma}\langle\hat{d}_{j,-\sigma}\hat{c}_{j,\sigma};\hat{c}^\dagger_{j,\sigma}\rangle \quad (94)$$

$$\langle\hat{d}_{j,-\sigma}\hat{c}_{j,\sigma};\hat{c}^\dagger_{j,\sigma}\rangle \rightarrow tG_{p,\sigma}\langle\hat{d}_{j,-\sigma}\hat{c}_{j,\sigma};\hat{c}^\dagger_{j,\sigma}\rangle \quad (95)$$

By executing this translation, the following closed equation is obtained.

$$i\omega_n - t^2\Gamma_{j,\sigma}G_{j,\sigma} = 1 + \frac{(U/2)^2}{i\omega_n - t^2\Gamma_{j,\sigma} - 2t^2\Gamma_{j,-\sigma}}G_{j,\sigma} \quad (96)$$

Here is assumed that there is no dependency on spin. That is, assuming $$G_j = G_{j,\uparrow} = G_{j,\downarrow} \quad (97)$$

the following calculation is executed. This is because, when analytic continuation is conducted as $i\omega_n \rightarrow \omega + i\delta$ for small $\delta$, $$D_j(\omega) = -\mathrm{Im}G_j(\omega+i\delta) \quad (98)$$

becomes the local density of states of the site j, and $$D(\omega) = -\frac{1}{n+1}\sum_j D_j(\omega) \quad (99)$$

becomes the density of states of the system. For later numerical calculation of densities of states, $\delta=0.0001$ will be used.

In the following calculation, t=1 and U=7 are fixed. For a detailed review of spatial changes inside a stellar fractal structure, spatial changes of the local density of states $D_j(\omega=0)$ on the Fermi energy are analyzed. When the distance from the growth origin (0, 0, 0) is r, the set of growth points distant from the growth origin by r to r+dr is written as $U_s(r)$, and its original number is written as $M_s(r)$. Then, $D_{ave}(r)$ is defined as follows.

$$D_{ave}(r) = \frac{1}{M_s(r)}\sum_{j\in U_s(r)} D_j(0) \quad (100)$$

This amount is the average value of local densities of states on the Fermi energy on the spherical surface with the distance r from the growth origin. In this calculation, dr=1 is used.

Figure 29:
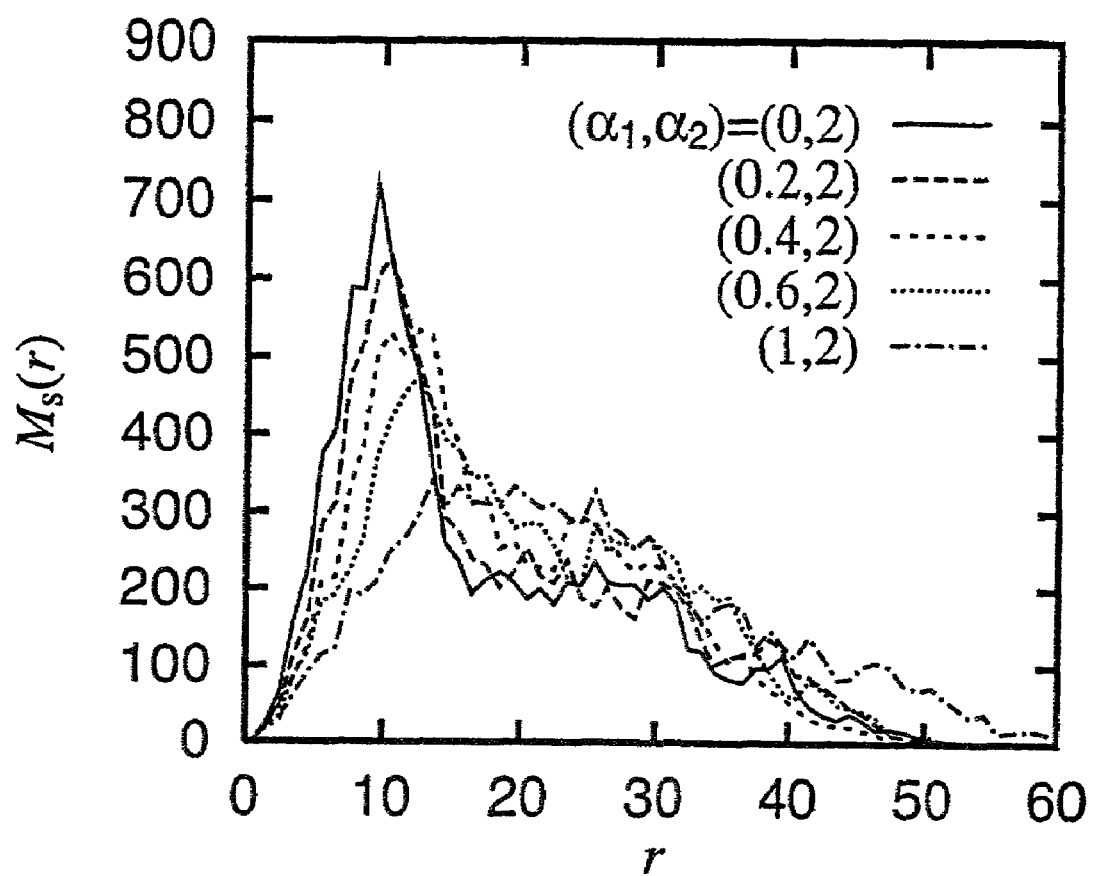
FIG. 29 is a schematic diagram that shows $M_s(r)$ in a stellar fractal structure according to the fifth embodiment of the invention.
Figure 30:
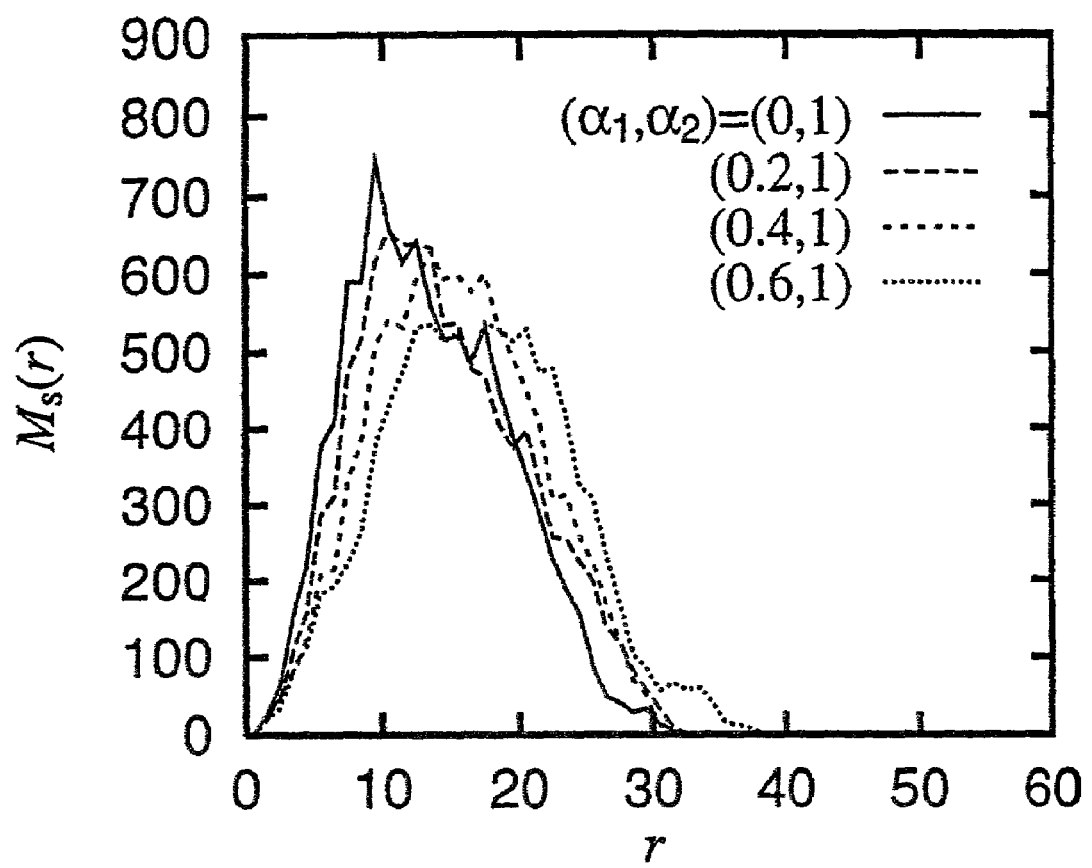
FIG. 30 is a schematic diagram that shows $M_s(r)$ in a stellar fractal structure according to the fifth embodiment of the invention.
Figure 31:
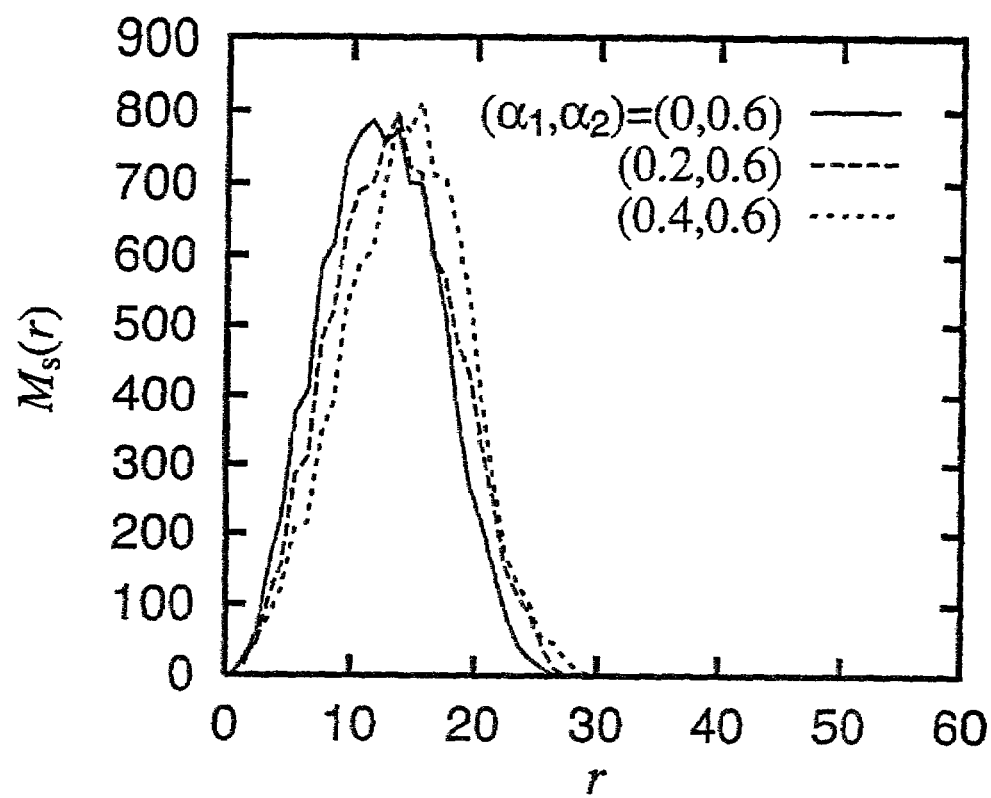
FIG. 31 is a schematic diagram that shows $M_s(r)$ in a stellar fractal structure according to the fifth embodiment of the invention.
Figure 32:
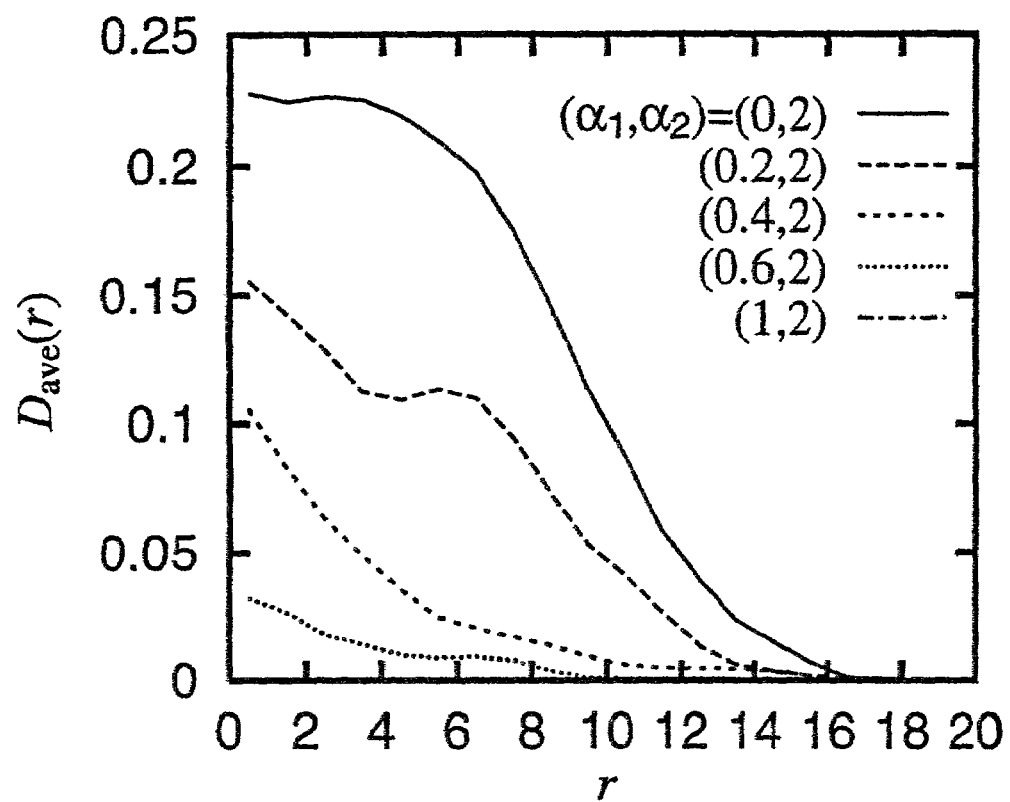
FIG. 32 is a schematic diagram that shows $D_{ave}(r)$ in a stellar fractal structure according to the fifth embodiment of the invention.
Figure 33:
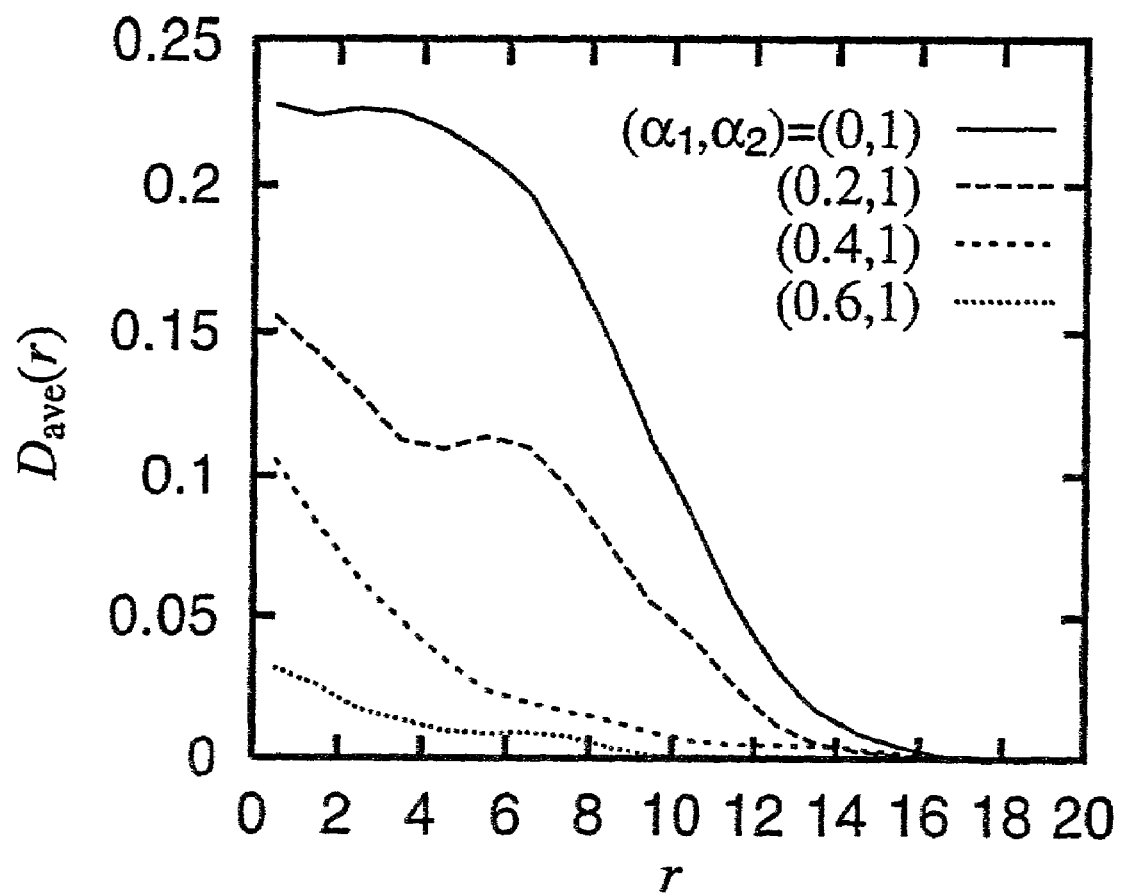
FIG. 33 is a schematic diagram that shows $D_{ave}(r)$ in a stellar fractal structure according to the fifth embodiment of the invention.
Figure 34:
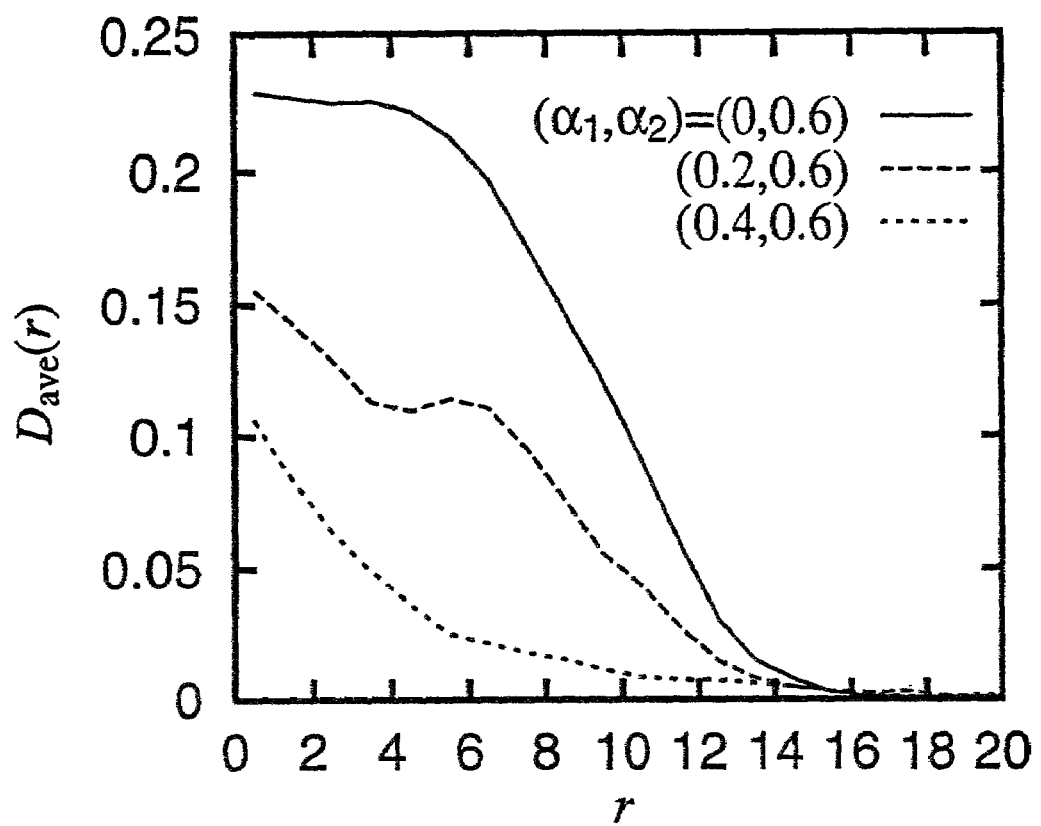
FIG. 34 is a schematic diagram that shows $D_{ave}(r)$ in a stellar fractal structure according to the fifth embodiment of the invention.

FIG. 29 shows $M_s(r)$ under $\alpha_2=2$ and $\alpha_1=0$, 0.2, 0.4, 0.6 and 1. FIG. 30 shows $M_s(r)$ under $\alpha_2=1$ and $\alpha_1=0$, 0.2, 0.4 and 0.6. FIG. 31 shows $M_s(r)$ under $\alpha_2=0.6$ and $\alpha_1=0$, 0.2 and 0.4. FIG. 32 shows $D_{ave}(r)$ under $\alpha_2=2$ and $\alpha_1=0$, 0.2, 0.4 and 0.6. FIG. 33 shows $D_{ave}(r)$ under $\alpha_2=1$ and $\alpha_1=0$, 0.2, 0.4 and 0.6. FIG. 34 shows $D_{ave}(r)$ under $\alpha_2=0.6$ and $\alpha_1=0$, 0.2 and 0.4.

It is confirmed from FIGS. 32, 33 and 34 that, in the region with small r, that is, in the region of the somatic fractal region, $D_{ave}(r)$ takes finite values, the system behaves as a metal. As r increases, $D_{ave}(r)$ decreases and approaches zero asymptotically. That is, Mott insulator transformation occurs. To obtain a sufficient change of densities of states, a value around $\alpha_1<0.4$ inside and a value around $\alpha_2>1$ outside are required, and a fractal dimension of $D_f>2.7$ inside and a fractal dimension of $D_f<2.3$ outside are required.

Sixth Embodiment

In the sixth embodiment, fractal dimensions suitable for controlling magnetization curves by stellar fractal structures will be explained.

(1) Formation of a Stellar Fractal Structure

A method of forming the star-shaped fractal structure according to the sixth embodiment is the same as the method of forming the stellar fractal structure according to the first embodiment. As growth conditions, however, while fixing $\tau_1=5000$ and $\tau_2=10000$, $(\alpha_1, \alpha_2)$ was changed variously within the range satisfying $\alpha_1<\alpha_2$ for conducting numerical experiment of growth.

(2) Ferromagnetic Transition in a Stellar Fractal Structure

A spin system describing a ferromagnetic structure is defined on the stellar fractal structure defined in (1). A review is made about the lattice point $$r_p = (i_{1,p}, i_{2,p}, i_{3,p}) \in T_n \quad (101)$$

that is the origin of $T_n$. In Equation (101), p=0, 1, 2, ..., n. By placing a spin on a lattice site $r_p \in T_n$, here is taken a spin system that can be described by the following Hamiltonian.

$$H = -\sum_{p,q} J_{p,q} S_p \cdot S_q \quad (102)$$

$S_p$ is the spin at the p site. A natural model of spin—spin interaction $J_{p,q}$ is:

$$J_{p,q} = \begin{cases} 1 & \text{when } |r_p - r_q| = 1 \\ 0 & \text{otherwise} \end{cases} \quad (103)$$

That is, spin—spin interaction exists only between nearest-neighbor sites. For the purpose of calculating spontaneous magnetization M at a finite temperature T, statistical mechanics of an equilibrium system is introduced. A partition function Z is defined as follows.

$$Z = \sum_{\{S_p\}} e^{-H/T} \qquad (104)$$

where $\{S_p\}$ in the symbol of the sum pertains to the sum regarding all spin states. Spontaneous magnetization is defined as the statistical average of spins as follows.

$$M = \frac{1}{n+1}\sum_{p=1}^{n} \langle S_p \rangle \qquad (105)$$

where the expected value $<S_p>$ is $$\langle S_p \rangle = \frac{1}{Z}\sum_{\{S_p\}} S_p e^{-H/T} \qquad (106)$$

and n+1 is the total number of spins. M is generally a vector quantity in a spin space, but its absolute value M=|M| is calculated.

Here is made a review about an Ising model. In an Ising model, only two states of $$S_p = 1 \text{ or } -1 \qquad (107)$$

can exist. Let a mean field approximation be introduced into the Ising model. Spontaneous magnetization of the p-th site is written as $\mu_p$. In this system, since the molecular field varies with site, let it written as $\bar{\mu}_p$. As an assumption of the mean field approximation, here is employed one whose molecular field can be written by spontaneous magnetization of the nearest-neighbor site as $$\bar{\mu}_p = \sum_q J_{p,q}\mu_q \qquad (108)$$

This assumption simplifies the foregoing Hamiltonian to $$H_{MF} = -\sum_{P=0}^{n} \bar{\mu}_p \sigma_p \qquad (109)$$

A self-consistent equation ensuring spontaneous magnetization obtained by using a partition function by the simplified Hamiltonian becomes $\mu_p$ results in $$\mu_p = \tan h(\beta\bar{\mu}_p) \qquad (110)$$

and by numerically solving this equation, spontaneous magnetization of the system $$M_{Ising} = \frac{1}{n+1}\sum_{j=0}^{n} \mu_j \qquad (111)$$

Figure 35:
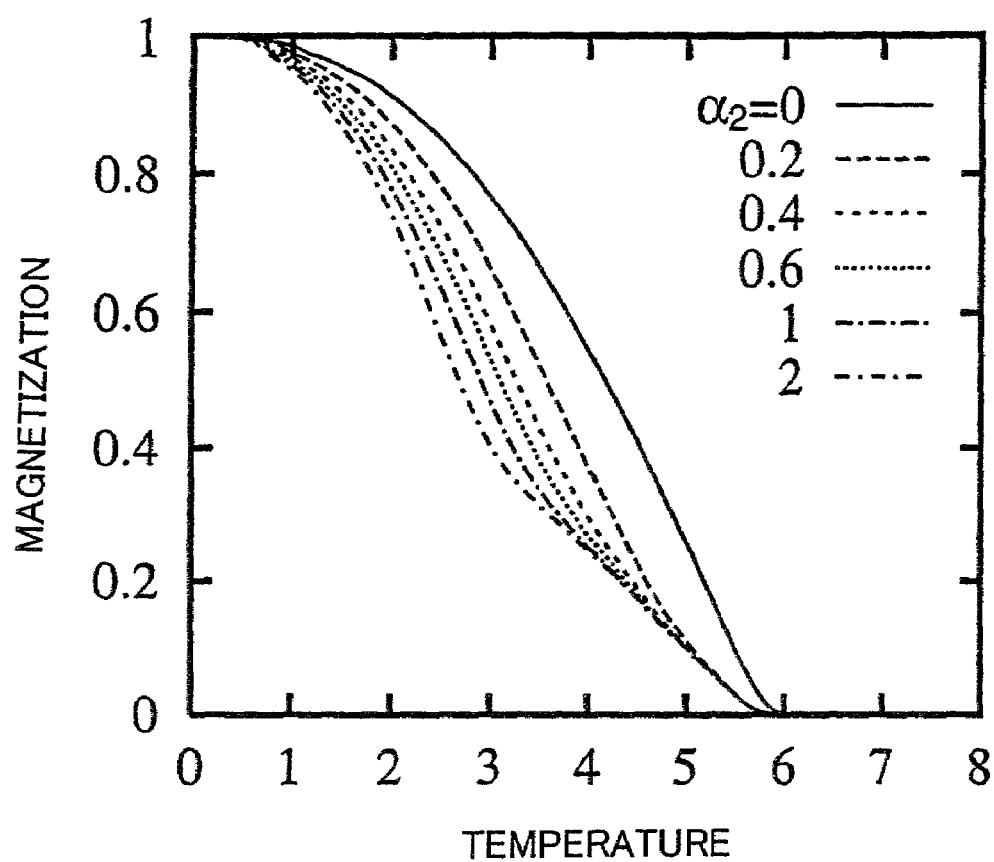
FIG. 35 is a schematic diagram that shows spontaneous magnetization in a stellar fractal structure according to the sixth embodiment of the invention.

FIG. 35 shows spontaneous magnetization in case of $\alpha_1=0$ fixed and $\alpha_2$ changed. Here, $\alpha_2=0$ corresponds to spontaneous magnetization in the same structure as the simple fractal of $\alpha=0$. As compared with the spontaneous magnetization on that structure, as $\alpha_2$ increases, spontaneous magnetization changes to one peculiar to stellar fractal structures, of which the magnetization curve changes in direction of inclination. In this case, favorable spontaneous magnetization is obtained under around $\alpha_2 \geqq 0.6$.

Figure 36:
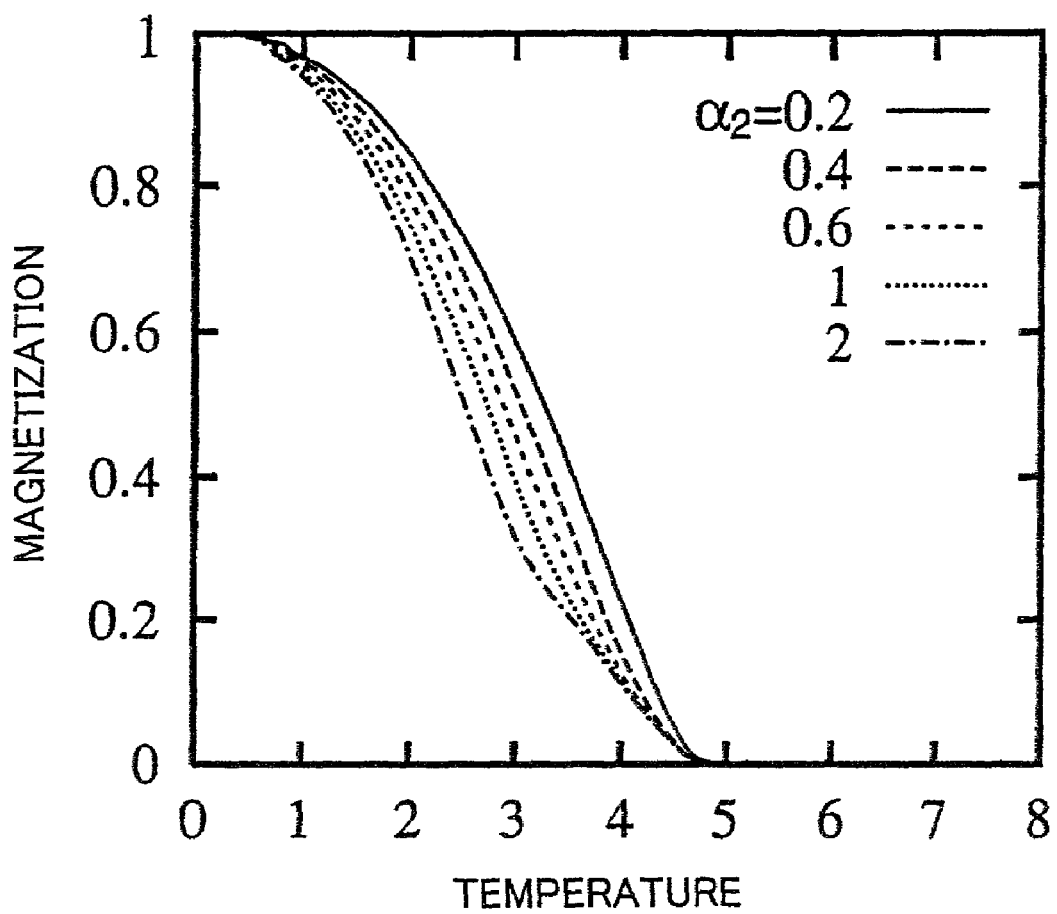
FIG. 36 is a schematic diagram that shows spontaneous magnetization in a stellar fractal structure according to the sixth embodiment of the invention.

FIG. 36 shows spontaneous magnetization in case of $\alpha_1=0.2$ fixed and $\alpha_2$ changed. Here, $\alpha_2=0.2$ corresponds to spontaneous magnetization in the same structure as the simple fractal of $\alpha=0.2$. As compared with the spontaneous magnetization on that structure, as $\alpha_2$ increases, spontaneous magnetization changes to one peculiar to stellar fractal structures, of which the magnetization curve changes in direction of inclination. In this case, favorable spontaneous magnetization is obtained under around $\alpha_2 \geqq 1$.

Figure 37:
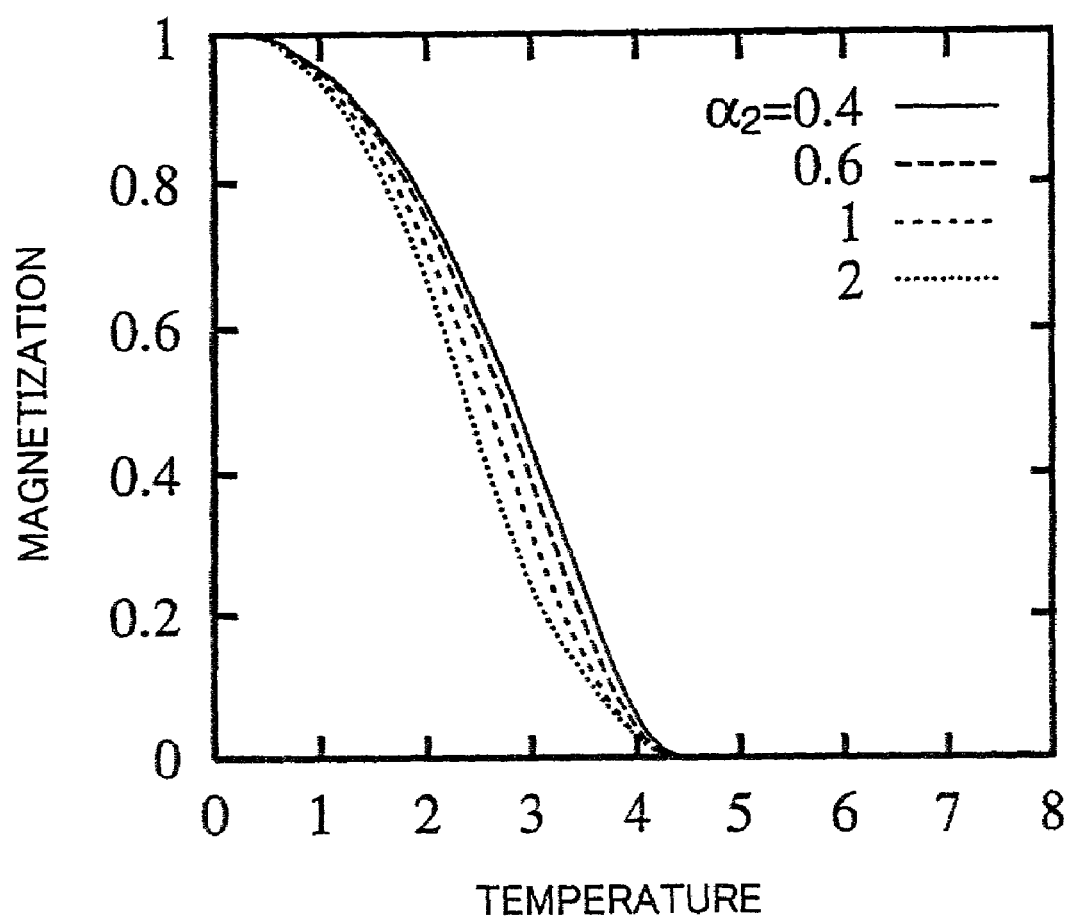
FIG. 37 is a schematic diagram that shows spontaneous magnetization in a stellar fractal structure according to the sixth embodiment of the invention.

FIG. 37 shows spontaneous magnetization in case of $\alpha_1=0.4$ fixed and $\alpha_2$ changed. Here, $\alpha_2=0.4$ corresponds to spontaneous magnetization in the same structure as the simple fractal of $\alpha=0.4$. As compared with the spontaneous magnetization on that structure, as $\alpha_2$ increases, spontaneous magnetization changes to one peculiar to stellar fractal structures, of which the magnetization curve changes in direction of inclination. In this case, favorable spontaneous magnetization is obtained under around $\alpha_2 \geqq 1$.

Figure 38:
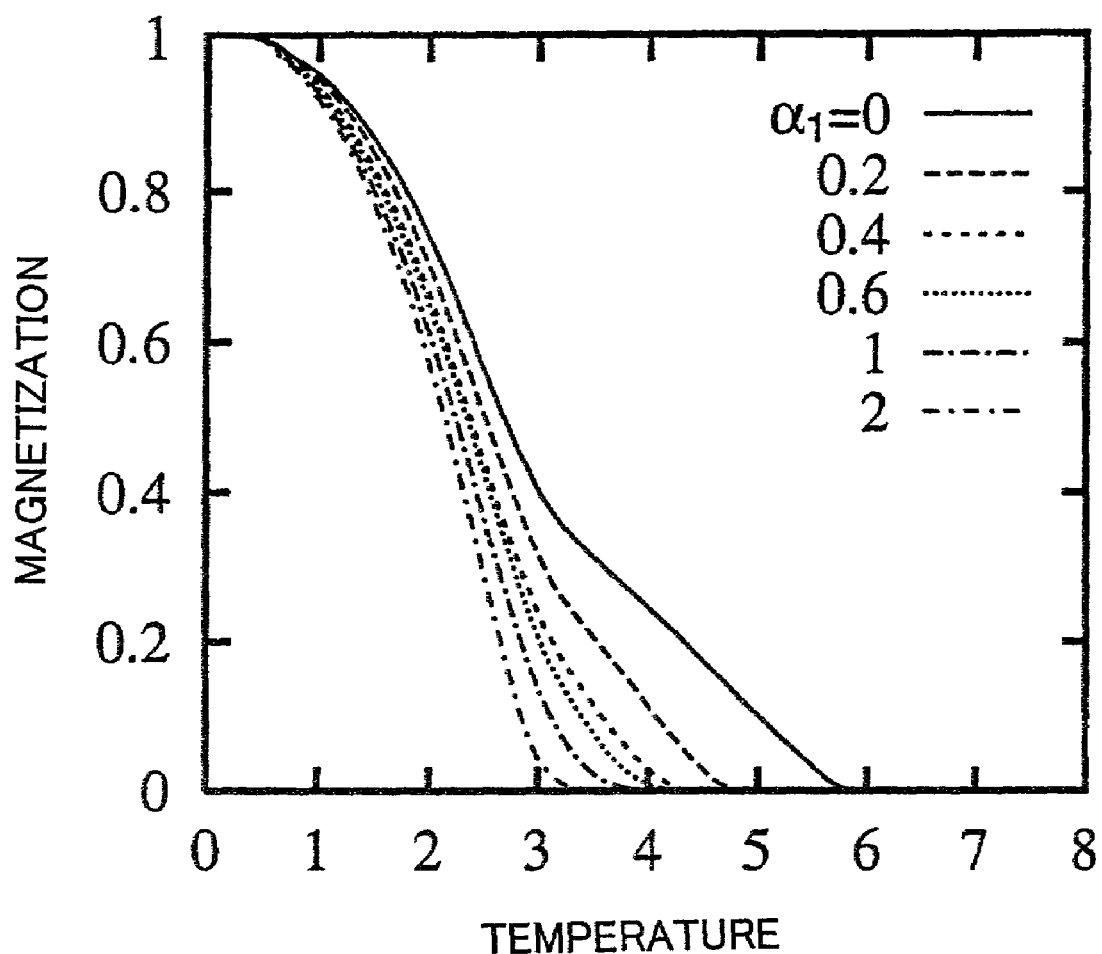
FIG. 38 is a schematic diagram that shows spontaneous magnetization in a stellar fractal structure according to the sixth embodiment of the invention.

FIG. 38 shows spontaneous magnetization in case of $\alpha_2=2$ fixed and $\alpha_1$ changed. Here, $\alpha_1=2$ corresponds to spontaneous magnetization in the same structure as the simple fractal of $\alpha=2$. As compared with the spontaneous magnetization on that structure, as $\alpha_2$ decreases, spontaneous magnetization changes to one peculiar to stellar fractal structures, of which the magnetization curve changes in direction of inclination. In this case, favorable spontaneous magnetization is obtained under around $\alpha_1 \leqq 0.4$.

Figure 39:
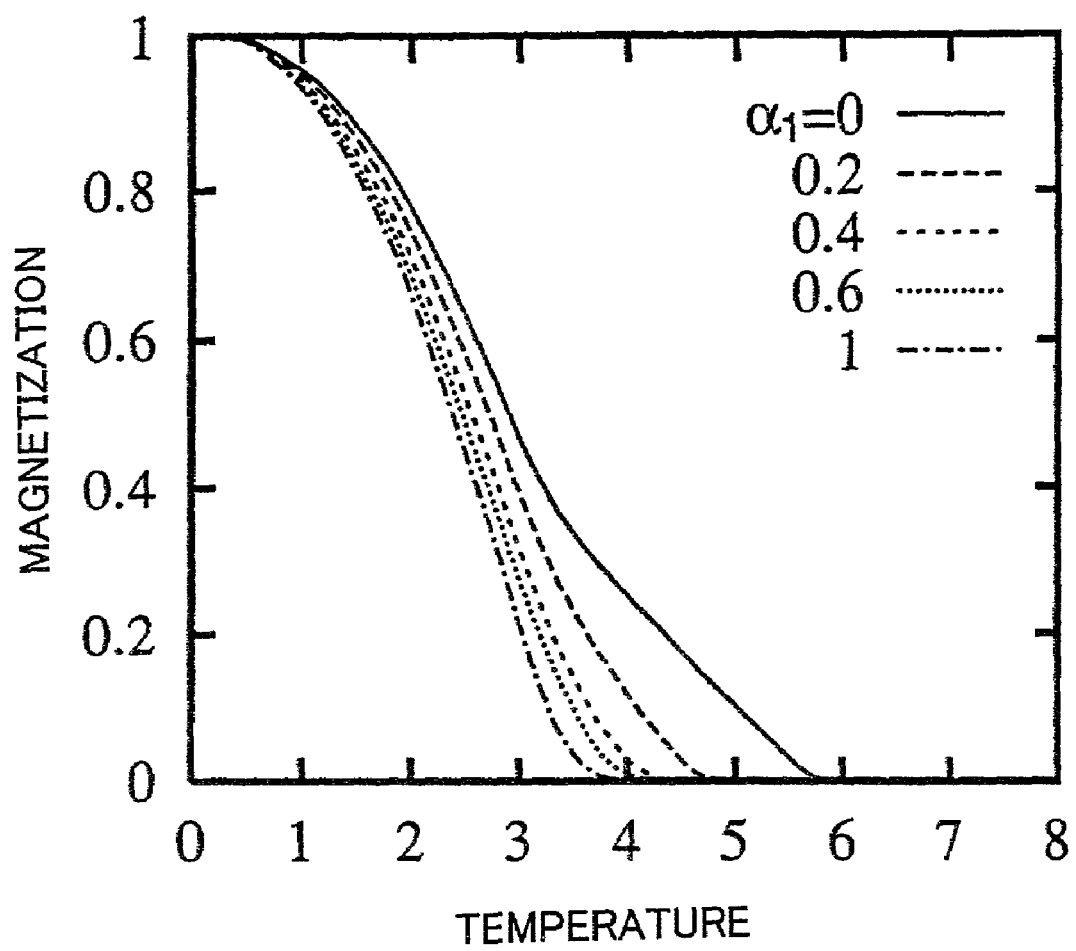
FIG. 39 is a schematic diagram that shows spontaneous magnetization in a stellar fractal structure according to the sixth embodiment of the invention.

FIG. 39 shows spontaneous magnetization in case of $\alpha_2=1$ fixed and $\alpha_1$ changed. Here, $\alpha_1=1$ corresponds to spontaneous magnetization in the same structure as the simple fractal of $\alpha=1$. As compared with the spontaneous magnetization on that structure, as $\alpha_2$ decreases, spontaneous magnetization changes to one peculiar to stellar fractal structures, of which the magnetization curve changes in direction of inclination. In this case, favorable spontaneous magnetization is obtained under around $\alpha_1 \leqq 0.2$.

Figure 40:
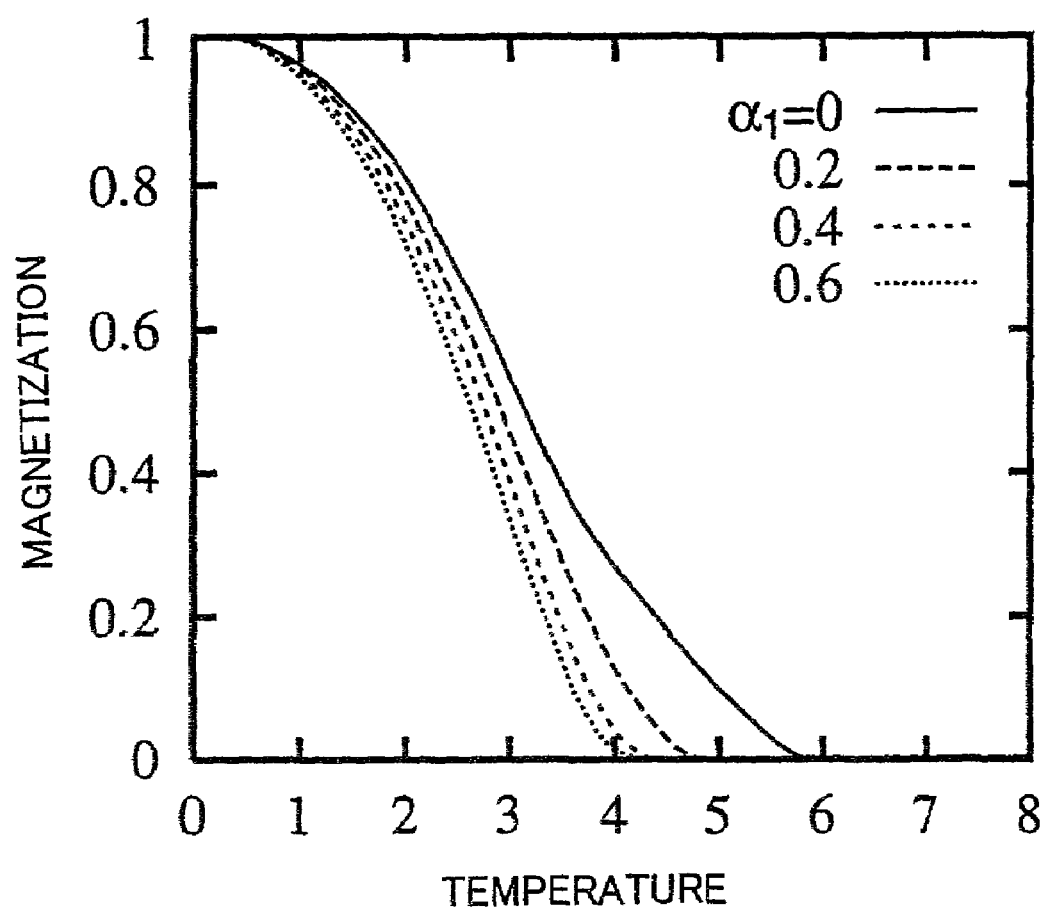
FIG. 40 is a schematic diagram that shows spontaneous magnetization in a stellar fractal structure according to the sixth embodiment of the invention.

FIG. 40 shows spontaneous magnetization in case of $\alpha_2=0.6$ fixed and $\alpha_1$ changed. Here, $\alpha_1=0.6$ corresponds to spontaneous magnetization in the same structure as the simple fractal of $\alpha=0.6$. As compared with the spontaneous magnetization on that structure, as $\alpha_2$ decreases, spontaneous magnetization changes to one peculiar to stellar fractal structures, of which the magnetization curve changes in direction of inclination. In this case, favorable spontaneous magnetization is obtained under around $\alpha_1 \leqq 0.2$.

Generalizing the above aspects of spontaneous magnetization, when a stellar structure satisfies the condition of approximately $D_f > 2.7$ as the fractal dimension of the somatic region inside or approximately $D_f < 2.3$ as the fractal dimension of the dendritic region outside, the magnetization curve of the stellar fractal structure exhibits distinctive behaviors, and enables favorable control.

Seventh Embodiment

A method for forming a stellar fractal structure according to the seventh embodiment is the same as the method of forming the stellar fractal structure according to the fist embodiment. As growth conditions, however, while fixing $\tau_1=5000$ and $\tau_2=10000$, various combinations of $(\alpha_1, \alpha_2)$ satisfying $\alpha_1<\alpha_2$, particularly, 0, 0.2, 0.4, 0.6, 1 and 2 as $\alpha_1$ and $\alpha_2$, were used for conducting numerical experiment of growth.

(2) Electron System on a Stellar Fractal Structure

In the same manner as that shown in Equations (44) through (59) of the third embodiment, a quantum system of one particle is defined on the stellar fractal defined in (1).

Figure 41:
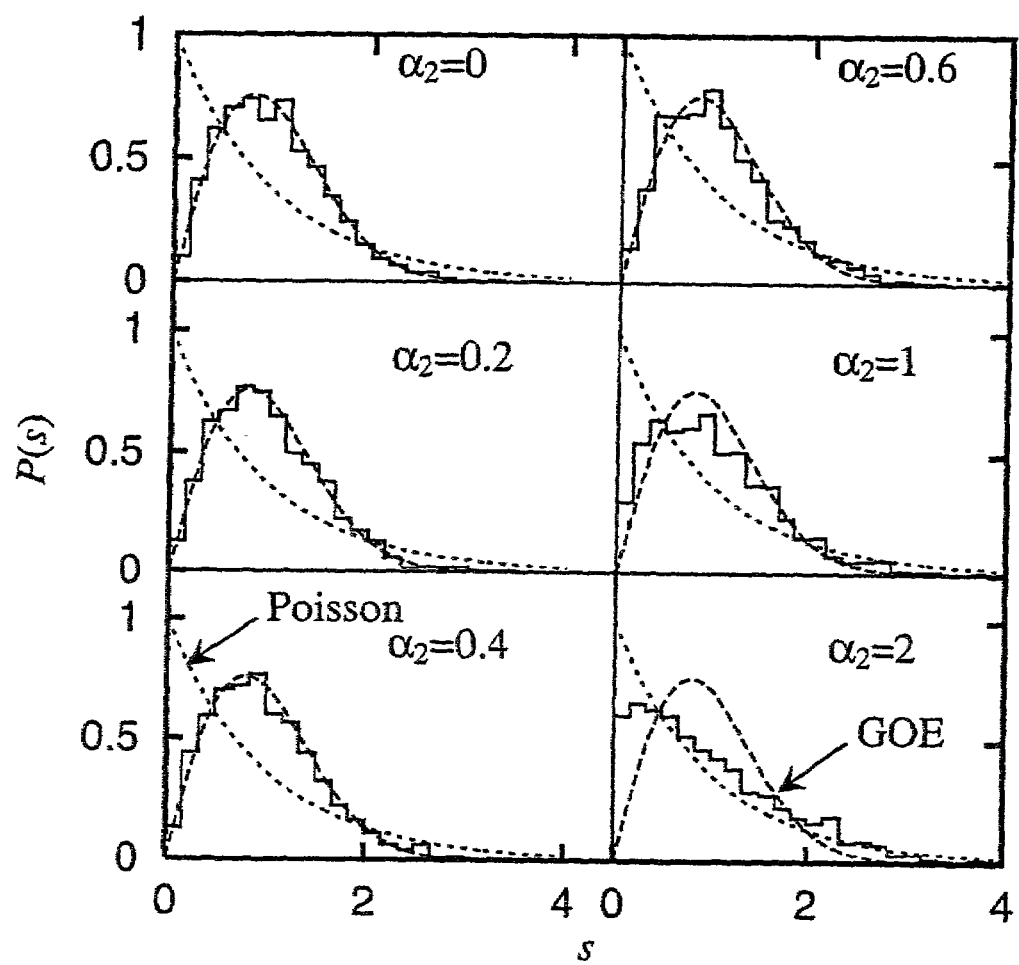
FIG. 41 is a schematic diagram that shows quantum level statistics in a stellar fractal structure according to the seventh embodiment of the invention.
Figure 42:
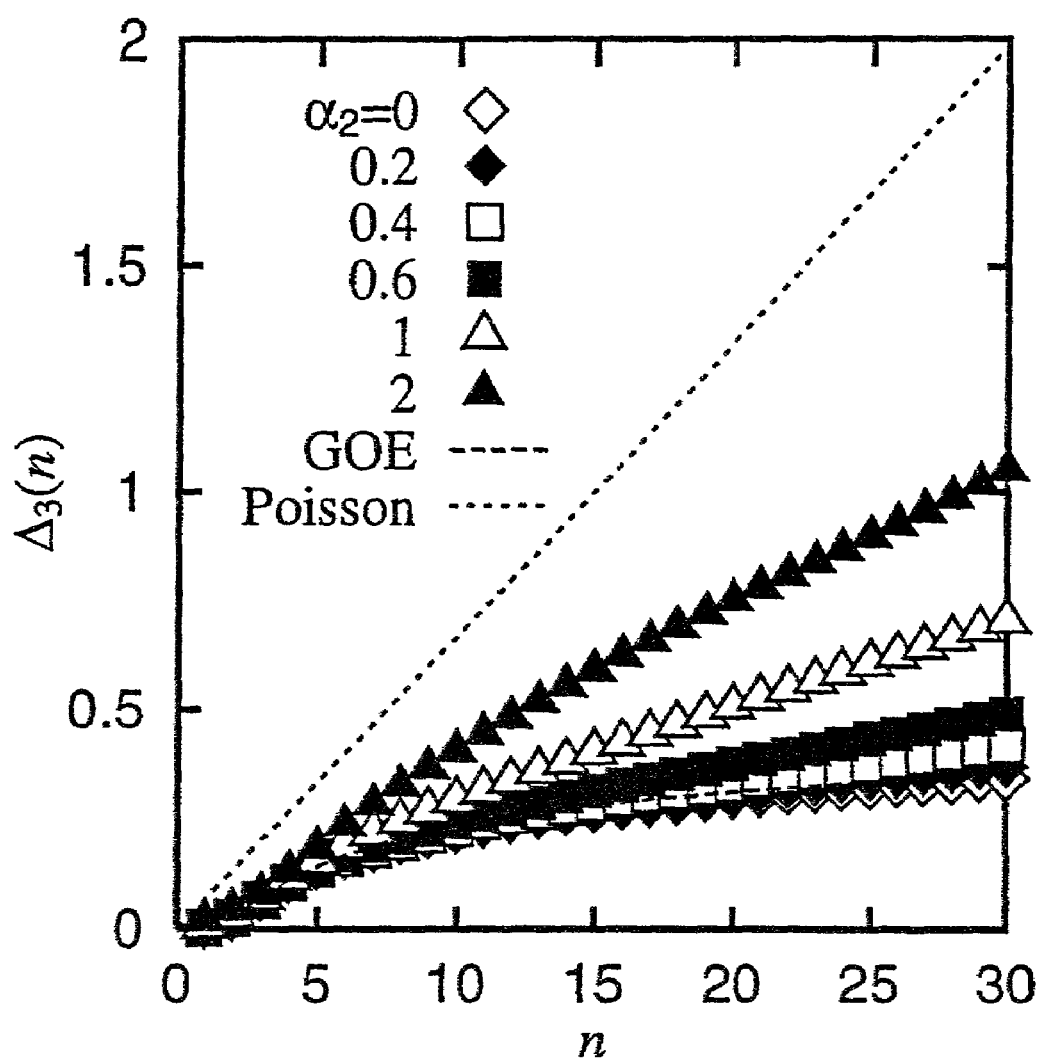
FIG. 42 is a schematic diagram that shows quantum level statistics in a stellar fractal structure according to the seventh embodiment of the invention.

Since the stellar fractal structure analyzed here is one obtained by growth experiment of n=10000, this quantum system includes n+1=10001 eigenstates. Based on energy eigenvalues concerning 1501 states from the 510-th to 2001-th eigenstates from the ground state, among those eigenstates, the following quantum level statistics was calculated. FIGS. 41 and 42 show quantum level statistics in stellar fractal structures of $(\alpha_1, \alpha_2)=(0, x)$ where x=0, 0.2, 0.4, 0.6, 1 and 2. FIG. 41 shows P(s) and FIG. 42 shows $\Delta_3$ statistics. In case of $\alpha_2=0$, the structure is the same as the simple fractal of $\alpha=0$, and the fractal dimension is near 3 ($D_f\sim2.91$). Therefore, the system behaves as a quantum chaotic system. In this case, the quantum level statistics is that of GOE distribution. As $\alpha_2$ increases, the quantum level statistics goes apart from that of GOE distribution toward Poisson distribution. However, even when it reaches $\alpha_2=2$, a large difference from Poisson distribution still remains.

Figure 43:
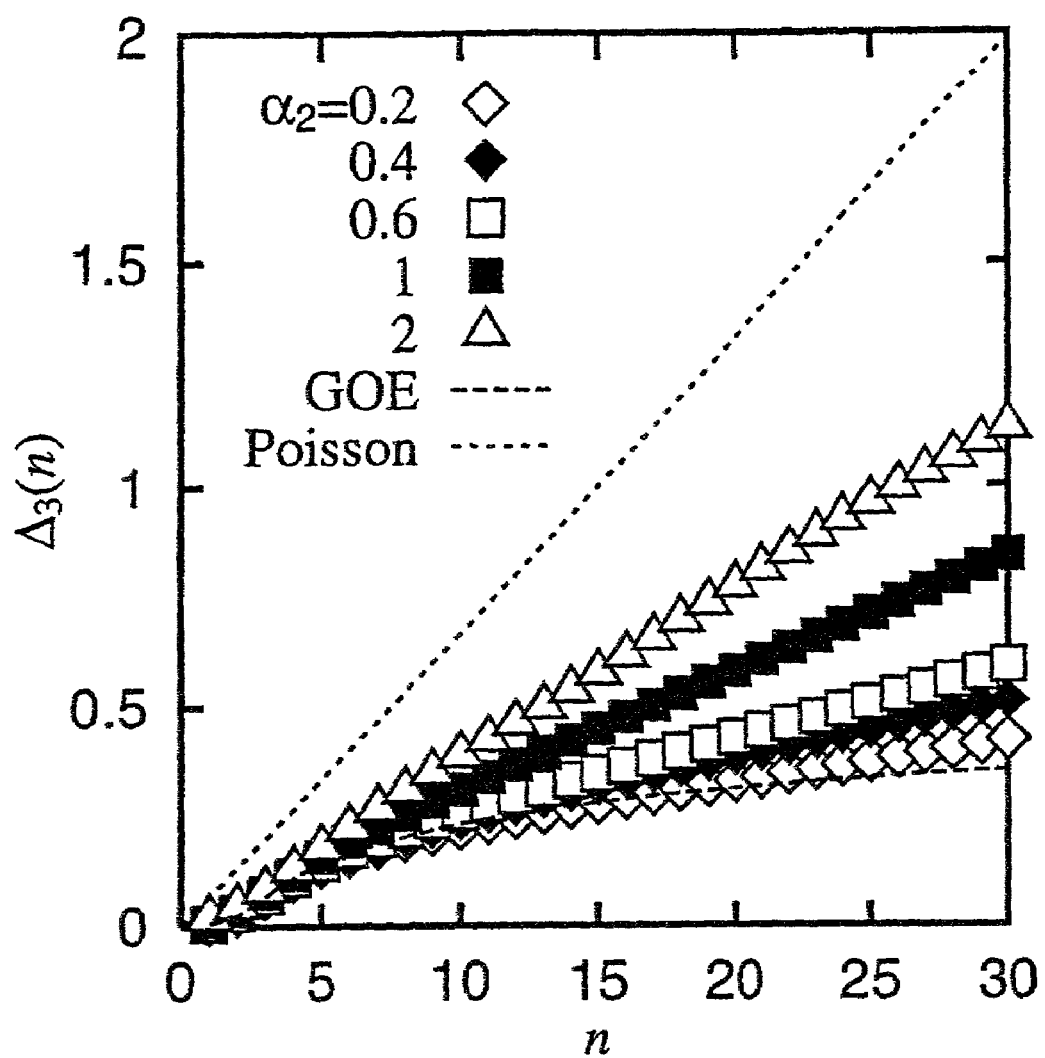
FIG. 43 is a schematic diagram that shows quantum level statistics in a stellar fractal structure according to the seventh embodiment of the invention.
Figure 44:
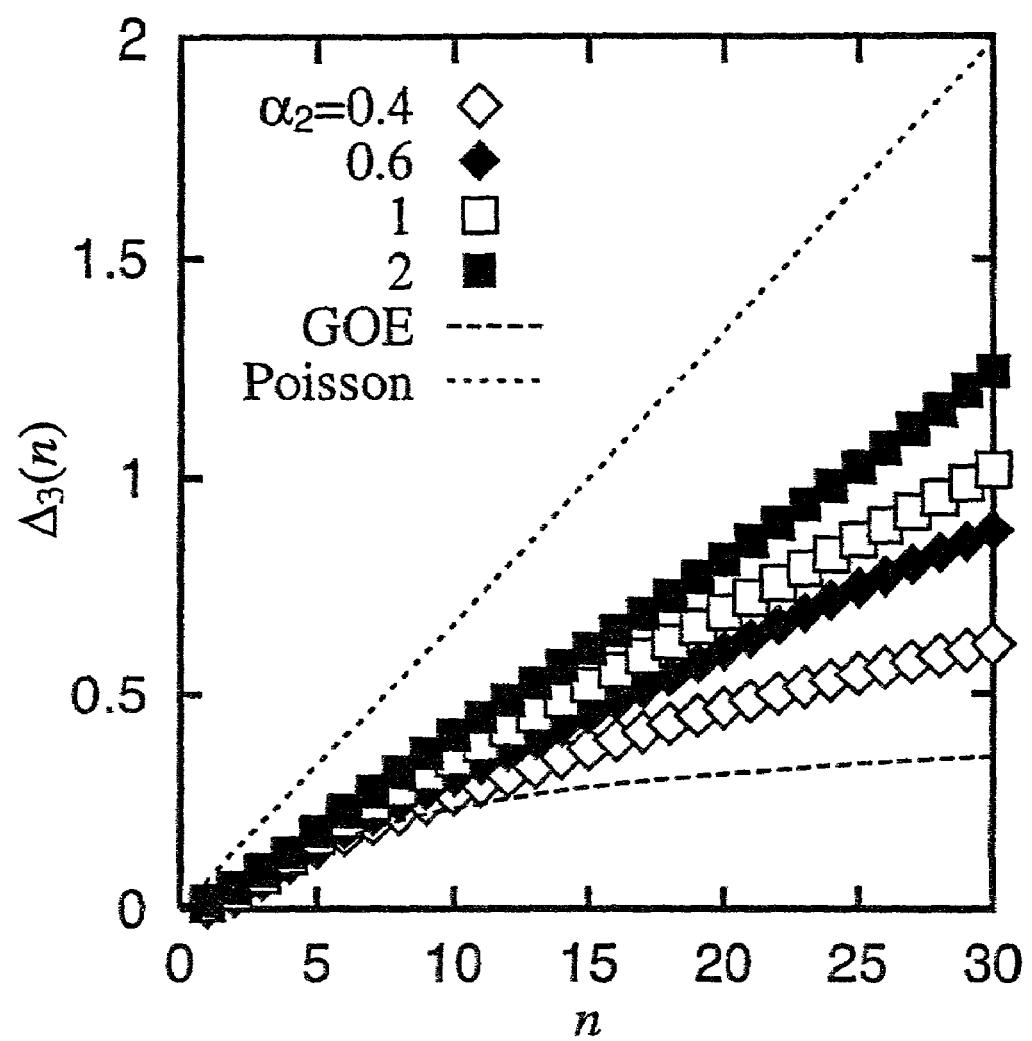
FIG. 44 is a schematic diagram that shows quantum level statistics in a stellar fractal structure according to the seventh embodiment of the invention.

FIG. 43 shows $\Delta_3$ statistics in stellar fractal structures of $(\alpha_1, \alpha_2)=(0.2, x)$ where x=0.2, 0.4, 0.6, 1 and 2. In case of $\alpha_2=0.2$, the structure is the same as the simple fractal of $\alpha=0.2$, and behaves substantially as a quantum chaotic system. As $\alpha_2$ increases, the quantum level statistics goes apart from that of GOE distribution toward Poisson distribution. FIG. 44 shows $\Delta_3$ statistics in stellar fractal structures of $(\alpha_1, \alpha_2)=(0.4, x)$ where x=0.4, 0.6, 1 and 2. In case of $\alpha_2=0.4$, the structure is the same as the simple fractal of $\alpha=0.4$, and it is as far from that of GOE distribution as a level to be no more regarded as a quantum chaotic system. As $\alpha_2$ increases, the quantum level statistics similarly goes apart from that of GOE distribution toward Poisson distribution.

Figure 45:
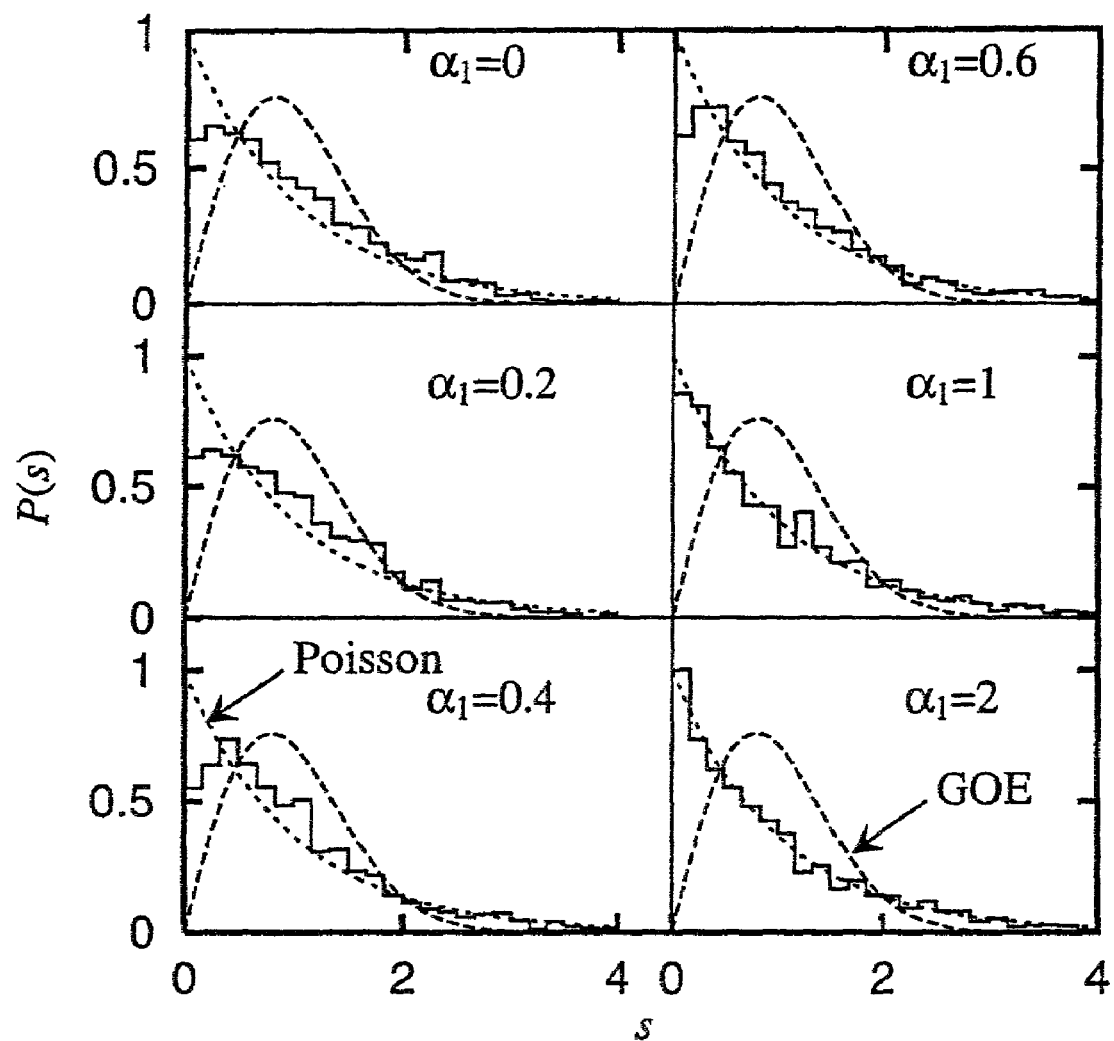
FIG. 45 is a schematic diagram that shows quantum level statistics in a stellar fractal structure according to the seventh embodiment of the invention.
Figure 46:
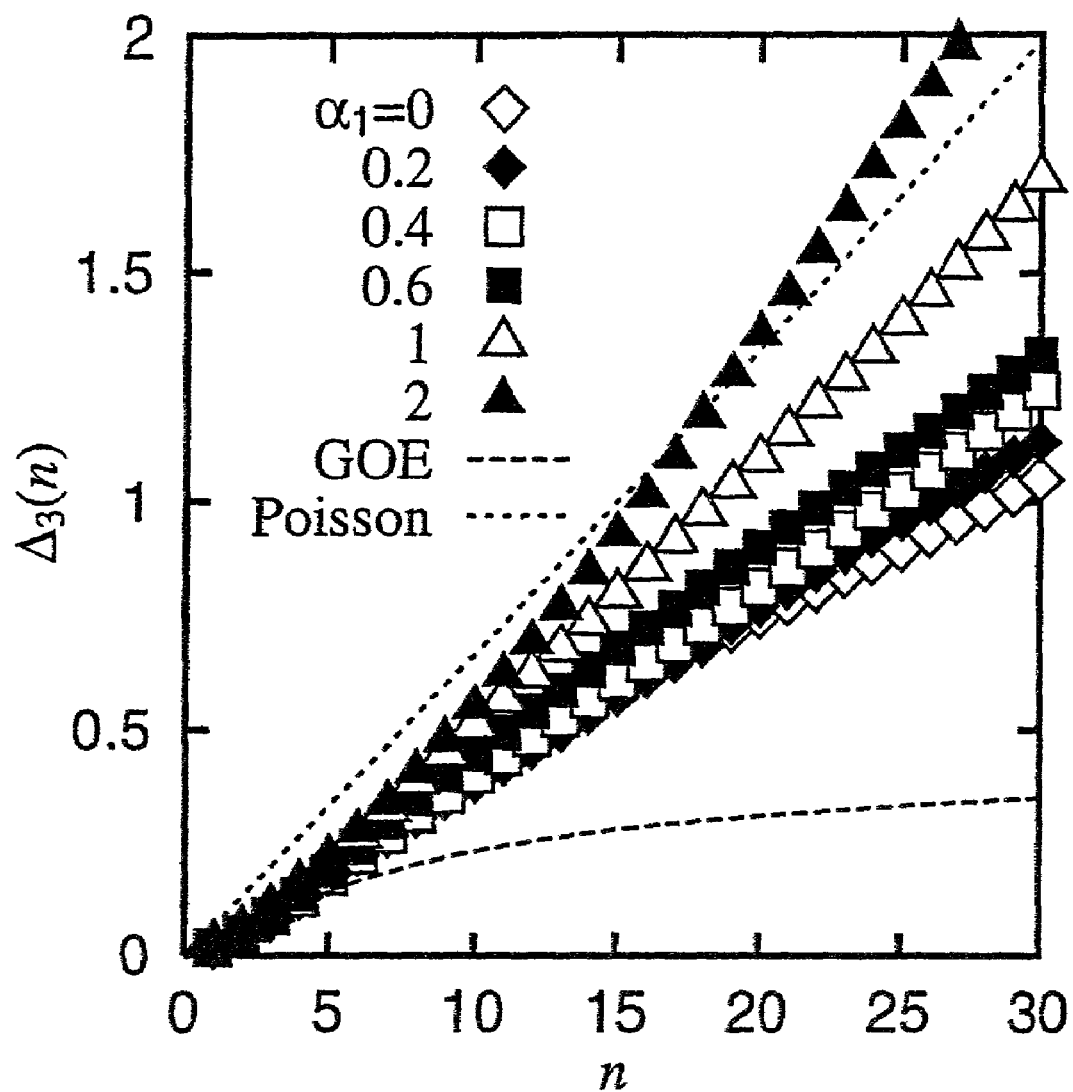
FIG. 46 is a schematic diagram that shows quantum level statistics in a stellar fractal structure according to the seventh embodiment of the invention.

FIGS. 45 and 46 show quantum level statistics in stellar fractal structures of $(\alpha_1, \alpha_2)=(x, 2)$ where x=0, 0.2, 0.4, 0.6, 1 and 2. FIG. 45 shows P(s) and FIG. 46 shows $\Delta_3$ statistics. In case of $\alpha_1=0$, it is the same as $\alpha_2=2$ of FIGS. 41 and 42. In case of $\alpha_1=2$, the structure is the same as the simple fractal structure of $\alpha=2$, and the fractal dimension is near 2 ($D_f\sim2.16$). Therefore, the system behaves as an integrable system. As $\alpha_1$ decreases, the quantum level statistics goes apart from that of Poisson distribution toward that of GOE distribution.

Figure 47:
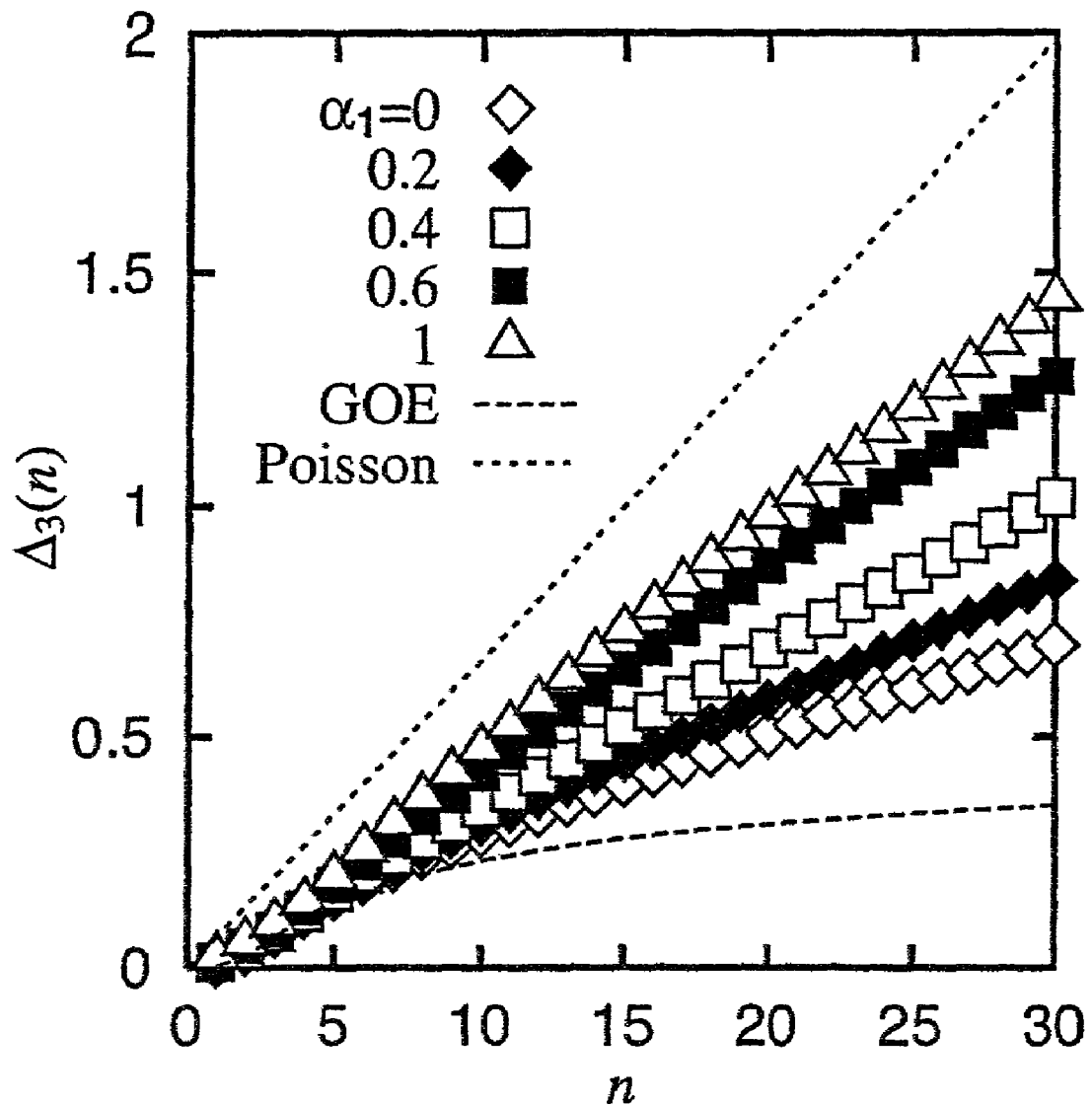
FIG. 47 is a schematic diagram that shows quantum level statistics in a stellar fractal structure according to the seventh embodiment of the invention.
Figure 48:
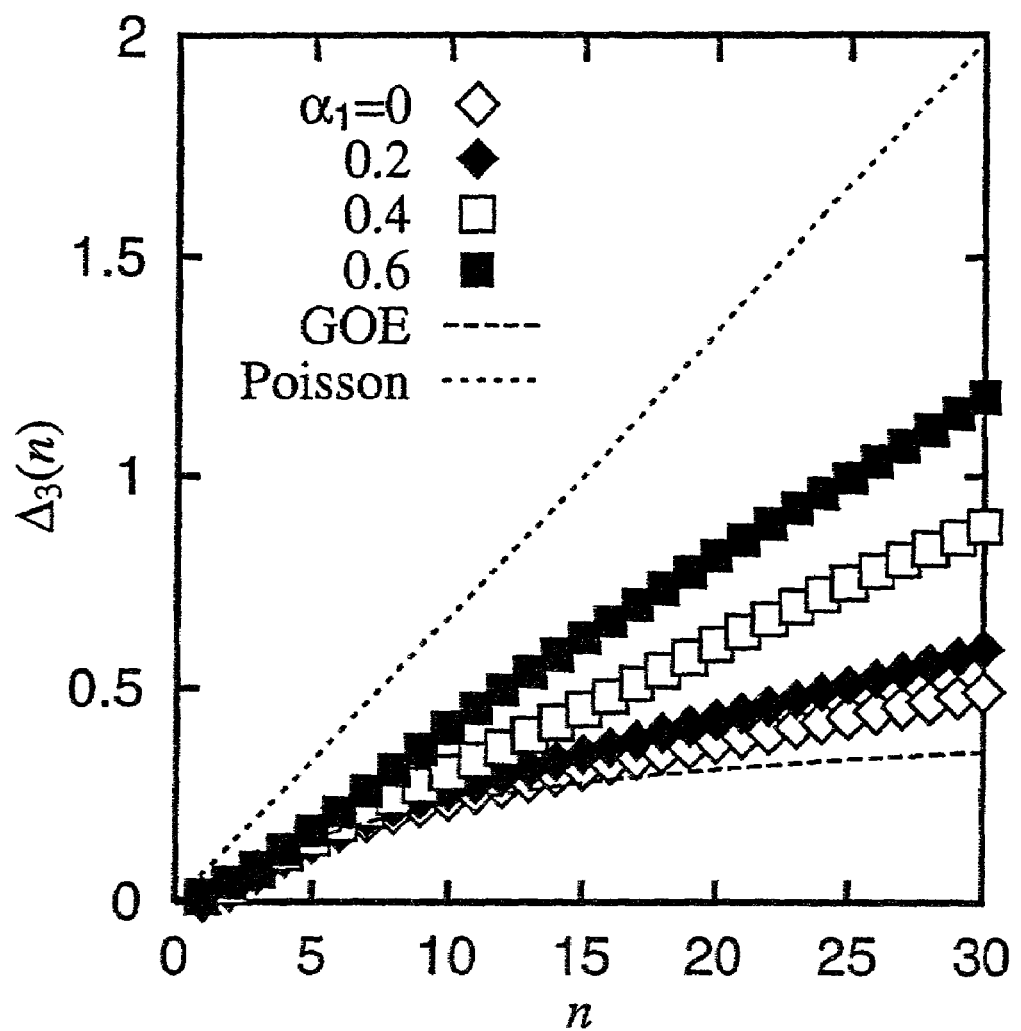
FIG. 48 is a schematic diagram that shows quantum level statistics in a stellar fractal structure according to the seventh embodiment of the invention.

FIG. 47 shows $\Delta_3$ statistics in stellar fractal structures of $(\alpha_1, \alpha_2)=(x, 1)$ where x=0, 0.2, 0.4, 0.6 and 1. FIG. 48 shows $\Delta_3$ statistics in stellar fractal structures of $(\alpha_1, \alpha_2)=(x, 0.6)$ where x=0, 0.2, 0.4 and 0.6. As $\alpha_1$ decreases, the quantum level statistics goes apart from that of Poisson distribution toward that of GOE distribution.

For quantitative evaluation of the above-reviewed controllability, the Berry-Robnik parameter $\rho$ is used ((38) M. V. Berry and M. Robnik, J. Phys. A (Math. Gen.) 17, 2413, (1984)). First, when $\bar{\rho}=1-\rho$, $$P_2(s, \rho) = \rho^2 e^{-\rho s}\mathrm{erf}\left(\frac{\sqrt{\pi}\,\bar{\rho}s}{2}\right) - \left(2\rho\bar{\rho} + \frac{\pi\bar{\rho}^3 s}{2}\right)e^{-\rho s-\pi\bar{\rho}^2 s^2/4} \quad (112)$$

is introduced, where $$\mathrm{erf}(x) = \frac{2}{\sqrt{\pi}}\int_x^\infty d\tau e^{-\tau^2} \quad (113)$$

was used. This function $P_2(S, \rho)$ coincides with P(s) of Poisson distribution under $\rho=1$, and coincides with P(s) of GOE distribution under $\rho=0$. That is, by changing $\rho$ from 0 to 1, quantum level statistics from those of quantum chaotic systems to those of integrable systems can be interpolated. The Berry-Robnik parameter is the value of $\rho$ obtained by optimum approximation of P(s) obtained by numerical calculation with $P_2(s, \rho)$ shown above. Within the range of semiclassical approximation, $\rho$ is the ratio in volume of regular regions (integrable systems and regions capable of perturbing development therefrom) in a phase space.

Figure 49:
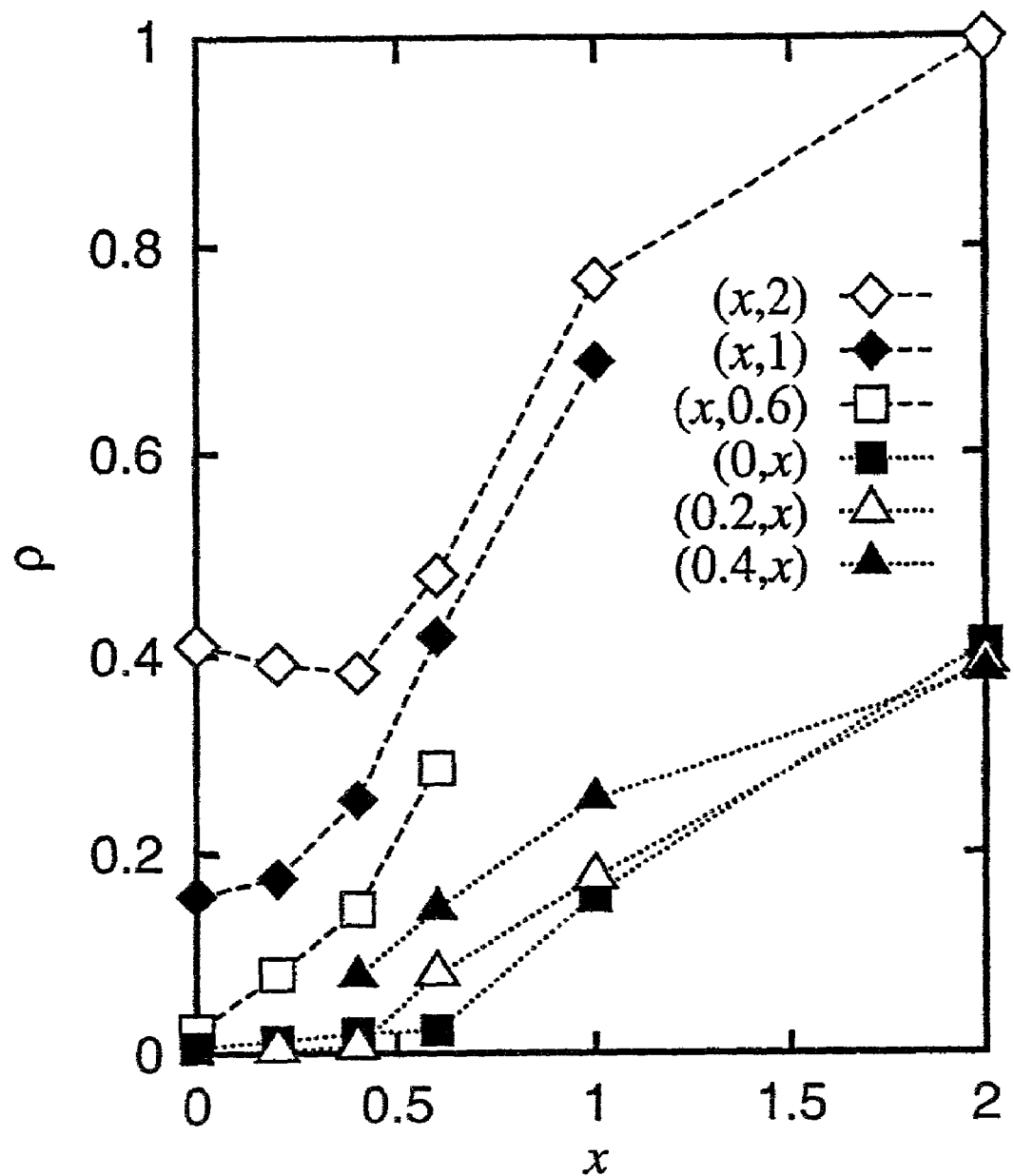
FIG. 49 is a schematic diagram that shows the Berry-Robnik parameter $\rho$ in a star-shaped fractal structure according to the seventh embodiment of the invention.

FIG. 49 shows the Berry-Robnik parameter $\rho$ in stellar fractal structures. $(\alpha_1, \alpha_2)=(x, 2)$ is the Berry-Robnik parameter in the case where $\alpha_1$ is placed on the abscissa while fixing $\alpha_2=2$. $(\alpha_1, \alpha_2)=(0, x)$ is the Berry-Robnik parameter in the case where $\alpha_1$ is placed on the abscissa while fixing $\alpha_2=0$. It is apparent from FIG. 49 that widely various quantum systems from quantum chaotic systems to integrable systems can be realized by setting $(\alpha_1, \alpha_2)$ to predetermined values.

Although the invention has been explained above by way of specific embodiments, the invention is not limited to those embodiments but envisages various changes or modifications based on the technical concept of the invention.

As described above, according to the invention, by growth conditions of a fractal structure with time, it is possible to obtain a fractal structure including a plurality of regions different in fractal dimension characterizing the self-similarity, thereby to modulate and control the dimensionality of a material by using a design method exceeding the conventional simple fractal property. Then, in these fractal structures, by adjusting the ratio in volume of a plurality of regions, natures of various phase transition occurring in fractal structures can be controlled. Additionally, by optimization of the fractal dimension, the controllability can be improved.

The invention claimed is:

1. A fractal structure comprising a plurality of regions, wherein a first of said plurality of regions has a first fractal structure grown from a start point of time of growth to a first point of time, the first fractal structure grown by:
   identifying the lattice sites adjacent to one of the plurality of lattice sites;
   for each lattice site adjacent to the one lattice site;
   determining the probability that the lattice site is selected as part of the first fractal structure;
   selecting another lattice site based on the probability that the lattice site is selected as part of the first fractal structure; and adding the other lattice site to the first fractal structure; and until the first point of time;
identifying the lattice sites adjacent to the other lattice site; and
for each lattice site adjacent to the other lattice site;
determining the probability that the lattice site is selected as part of the first fractal structure;
selecting the other lattice site based on the probability that the lattice site is selected as part of the first fractal structure; and
adding the other lattice site to the first fractal structure.

2. The fractal structure according to claim 1 wherein the nature of phase transition occurring in the fractal structure is controlled by adjusting the ratio in volume of said plurality of regions relative to the entire volume of the fractal structure.

3. The fractal structure according to claim 1 wherein electron-to-electron correlation of an interactive electron system is controlled by adjusting the ratio in volume of said plurality of regions relative to the entire volume of the fractal structure.

4. The fractal structure according to claim 1 wherein the magnetization curve of ferromagnetic phase transition is controlled by adjusting the ratio in volume of said plurality of regions relative to the entire volume of the fractal structure.

5. The fractal structure according to claim 1 wherein the nature of chaos appearing in the fractal structure is controlled by adjusting the ratio in volume of said plurality of regions relative to the entire volume of the fractal structure.

6. The fractal structure according to claim 1 wherein quantum chaos in the electron state is controlled by adjusting the ratio in volume of said plurality of regions relative to the entire volume of the fractal structure.

7. The fractal structure according to claim 1 wherein quantum chaos in the electron state is controlled by addition of a magnetic impurity.

8. The fractal structure according to claim 6 wherein quantum chaos in the electron state is controlled by addition of a magnetic impurity.

9. The fractal structure according to claim 1 wherein the first region forms a core; and wherein a second of the plurality of regions surrounds said first region and having a second fractal dimension lower than said first fractal dimension.

10. The fractal structure according to claim 9 wherein said first region and said second region exhibit a stellar shape as a whole.

11. The fractal structure according to claim 9 satisfying $D_{f1} > 2.7$ and $D_{f2} < 2.3$ where $D_{f1}$ is said fractal dimension and $D_{f2}$ is said second fractal dimension.

12. The fractal structure according to claim 9 satisfying $2.7 < Df \leq 3$ and $1 \leq D_{f2} < 2.3$ where $D_{f1}$ is said fractal dimension and $D_{f2}$ is said second fractal dimension.

13. The fractal structure according to claim 9 satisfying $2.9 \leq D \leq 3$ and $1 \leq D_{f2} < 2.3$ where $D_{f1}$ is said fractal dimension and $D_{f2}$ is said second fractal dimension.

14. A method of forming a fractal structure having a plurality of regions, wherein a first of the plurality of regions comprises a plurality of lattice sites in a fractal dimension, the method comprising the steps of:

identifying the lattice sites adjacent to one of the plurality of lattice sites;
for each lattice site adjacent to the one lattice site;
determining the probability that the lattice site is selected as part of the first fractal structure;
selecting another lattice site based on the probability that the lattice site is selected as part of the first fractal structure; and
adding the other lattice site to the first fractal structure; and until the first point of time;
identifying the lattice sites adjacent to the other lattice site; and
for each lattice site adjacent to the other lattice site;
determining the probability that the lattice site is selected as part of the first fractal structure;
selecting the other lattice site based on the probability that the lattice site is selected as part of the first fractal structure; and
adding the other lattice site to the first fractal structure.

15. The method of forming a fractal structure according to claim 14 wherein there are used growth conditions ensuring the first fractal dimension to be made from the growth start point of time until a first point of time, and growth conditions ensuring a second fractal dimension lower than the first fractal dimension to be made from the first point of time to a second point of time.

16. The method of forming a fractal structure according to claim 15 satisfying $D_{f1} > 2.7$ and $D_{f2} < 2.3$ where $D^{f1}$ is said fractal dimension and $D_{f2}$ is said second fractal dimension.

17. The method of forming a fractal structure according to claim 15 satisfying $2.7 < D_{f1} \leq 3$ and $1 \leq D_{f2} < 2.3$ where $D_{f1}$ is said fractal dimension and $D_{f2}$ is said second fractal dimension.

18. The method of forming a fractal structure according to claim 15 satisfying $2.9 \leq D_{f1} \leq 3$ and $1 \leq D_{f2} < 2.3$ where $D_{f1}$ is said fractal dimension and $D_{f2}$ is said second fractal dimension.

* * * * *